(12) United States Patent
Dedic et al.

(10) Patent No.: US 9,054,722 B2
(45) Date of Patent: Jun. 9, 2015

(54) CIRCUITRY AND METHODS FOR USE IN MIXED-SIGNAL CIRCUITRY

(71) Applicant: Fujitsu Semiconductor Limited, Yokohama-shi, Kanagawa (JP)

(72) Inventors: Ian Juso Dedic, Middlesex (GB); Saul Darzy, Middlesex (GB); Gavin Lambertus Allen, Western Australia (AU)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/025,330

(22) Filed: Sep. 12, 2013

(65) Prior Publication Data

US 2015/0070199 A1 Mar. 12, 2015

(51) Int. Cl.
*H03M 1/10* (2006.01)

(52) U.S. Cl.
CPC .............. *H03M 1/1023* (2013.01); *H03M 1/10* (2013.01); *H03M 1/1009* (2013.01)

(58) Field of Classification Search
CPC .... H03M 1/10; H03M 1/1023; H03M 1/1009
USPC .................................................. 341/120, 144
See application file for complete search history.

(56) References Cited

U.S. PATENT DOCUMENTS

| | | | |
|---|---|---|---|
| 7,068,193 B2 * | 6/2006 | Dempsey et al. | 341/120 |
| 7,978,109 B1 * | 7/2011 | Kuramochi | 341/144 |
| 8,134,486 B2 * | 3/2012 | Lai et al. | 341/120 |
| 8,471,739 B2 * | 6/2013 | Choi et al. | 341/120 |
| 8,493,251 B2 * | 7/2013 | Riches | 341/120 |

FOREIGN PATENT DOCUMENTS

| | | |
|---|---|---|
| EP | 1 202 459 B1 | 5/2006 |
| EP | 1 292 035 B1 | 10/2006 |
| EP | 2 019 486 A1 | 1/2009 |
| EP | 2 019 490 A1 | 1/2009 |
| EP | 2 009 795 B1 | 6/2010 |
| EP | 2 019 427 B1 | 9/2010 |
| EP | 2 023 487 B1 | 9/2010 |
| EP | 2 023 489 B1 | 2/2011 |
| EP | 2 211 468 B1 | 7/2011 |
| EP | 2 019 487 B1 | 5/2013 |
| GB | 2 373 654 B | 9/2002 |

\* cited by examiner

*Primary Examiner* — Brian Young
(74) *Attorney, Agent, or Firm* — Arent Fox LLP

(57) ABSTRACT

A method of calibrating switching circuitry, the switching circuitry comprising a measurement node and a plurality of output switches connected to the measurement node, and the circuitry being configured, in each clock cycle of a series of clock cycles, to control whether or not one or more of said output switches carry a given current based upon input data, the method comprising: inputting a plurality of different data sequences to the circuitry, each sequence causing a given pattern of voltages to occur at the measurement node as a result of currents passing through the output switches; measuring the voltages occurring at the measurement node for each said sequence; and calibrating the switching circuitry in dependence upon a result of said measuring.

19 Claims, 31 Drawing Sheets

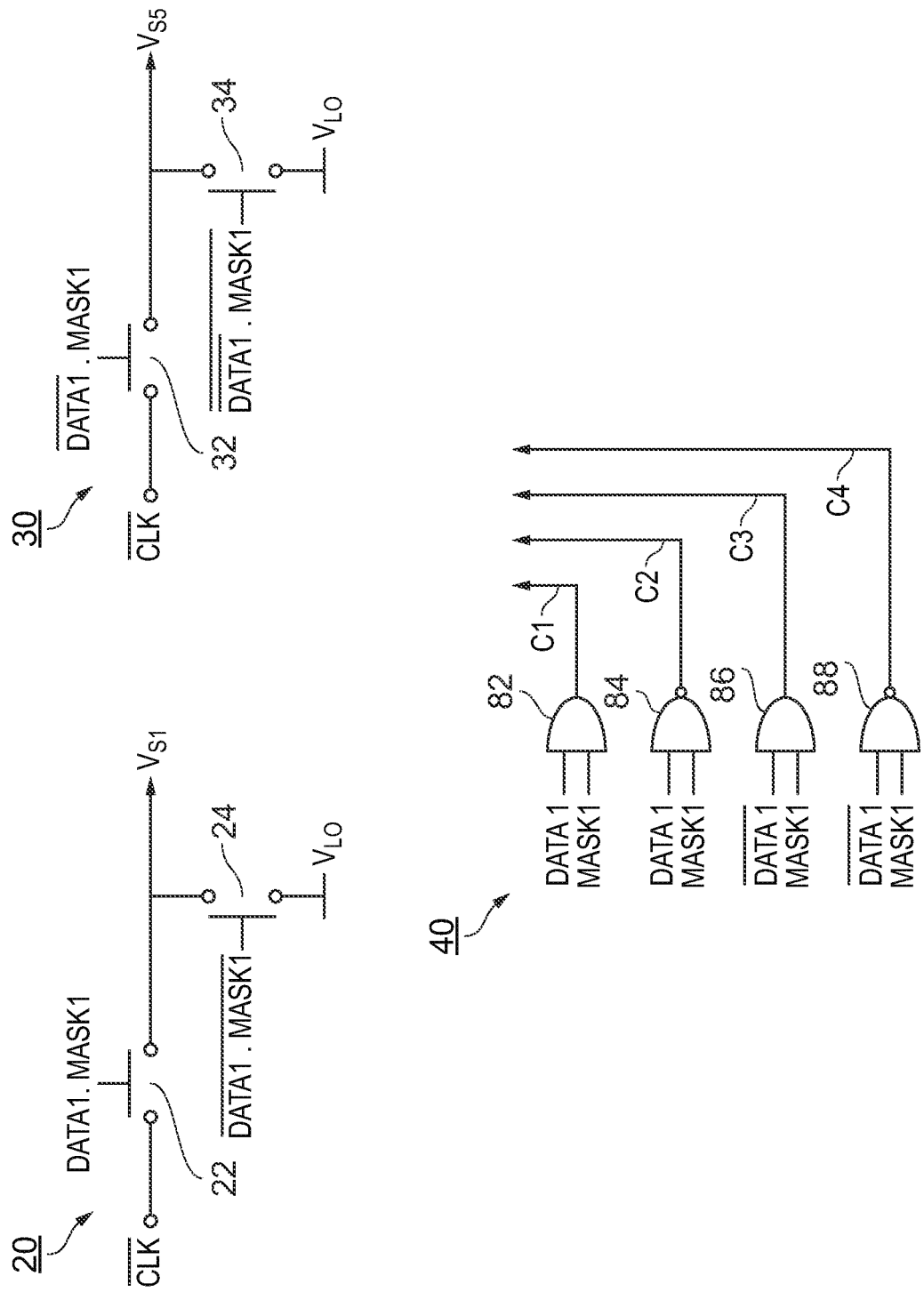

| CLOCK PHASE | DATA SIGNAL | DATA VALUE | OUTPUT SWITCH CARRYING $I_{BIG}$ | OUTPUT SWITCH CARRYING $I_{SMALL}$ |
|---|---|---|---|---|
| Ø1 | DATA1 | 1 | SW1 | SW5 |
| | | 0 | SW5 | SW1 |
| Ø2 | DATA2 | 1 | SW2 | SW6 |
| | | 0 | SW6 | SW2 |
| Ø3 | DATA3 | 1 | S3 | S7 |
| | | 0 | S7 | S3 |
| Ø4 | DATA4 | 1 | S4 | S8 |
| | | 0 | S8 | S4 |

FIG. 16

| WAVE FORM | REPEATING DATA PATTERN | PULSES AT SWITCHES SW1 SW2 SW3 SW4 | WAVEFORM AT O/P NODE A | DC ΔV OUTPUT |
|---|---|---|---|---|
| 1 | 0 0 0 0 | S  S  S  S | REFA | REFA |
| 2 | 1 0 0 0 | B  S  S  S | ΔV | GAIN SW1 |
| 3 | 0 1 0 0 | S  B  S  S | ΔV | GAIN SW2 |
| 4 | 0 0 1 0 | S  S  B  S | ΔV | GAIN SW3 |
| 5 | 0 0 0 1 | S  S  S  B | ΔV | GAIN SW4 |

FIG. 17

| WAVE FORM | REPEATING DATA PATTERN | PULSES AT SWITCHES SW5 SW6 SW7 SW8 | WAVEFORM AT O/P NODE B | DC ΔV OUTPUT |
|---|---|---|---|---|
| 6 | 1 1 1 1 | S  S  S  S | REFB / DC average | REFB |
| 7 | 0 1 1 1 | B  S  S  S | ΔV / DC average | GAIN SW5 |
| 8 | 1 0 1 1 | S  B  S  S | ΔV / DC average | GAIN SW6 |
| 9 | 1 1 0 1 | S  S  B  S | ΔV / DC average | GAIN SW7 |
| 10 | 1 1 1 0 | S  S  S  B | ΔV / DC average | GAIN SW8 |

FIG. 18

| COMBINATION | DRV1 | DRV2 |
|---|---|---|
| 1 | A | A |
| 2 | A | B |
| 3 | A | C |
| 4 | A | D |
| 5 | B | A |
| 6 | C | A |
| 7 | D | A |
| 8 | B | B |
| 9 | C | C |
| 10 | D | D |
| 11 | B | C |
| 12 | C | B |
| 13 | B | D |
| 14 | D | B |
| 15 | C | D |
| 16 | D | C |

FIG. 30

CIRCUITRY AND METHODS FOR USE IN MIXED-SIGNAL CIRCUITRY

The present invention relates to circuitry and methods for use in mixed-signal circuitry.

In particular, the present invention relates to switching circuitry and methods for use, for example, in or in conjunction with high-speed digital-to-analogue converters (DACs). Also considered herein is circuitry for use in or in conjunction with high-speed analogue-to-digital converters (ADCs). The present invention also considers the generation, distribution and use of clock signals in such circuitry.

FIG. 1 shows an overview of a previously considered DAC. The DAC in FIG. 1 is part of a DAC integrated circuit (IC) of the current-steering type, and is designed to convert an m-bit digital input word (D1-Dm) into a corresponding analog output signal.

Referring to FIG. 1, the DAC 1 contains analog circuitry including a number n of identical current sources $2_1$ to $2_n$, where $n=2^{m-1}$. Each current source 2 passes a substantially constant current I. The analog circuitry further includes a number n of differential switching circuits $4_1$ to $4_n$ corresponding respectively to the n current sources $2_1$ to $2_n$. Each differential switching circuit 4 is connected to its corresponding current source 2 and switches the current I produced by the current source either to a first terminal, connected to a first connection line A of the converter, or a second terminal connected to a second connection line B of the converter. Each differential switching circuit 4 may be considered to represent a segment or "slice" of the overall DAC 1.

Each differential switching circuit 4 receives one of a plurality of digital control signals T1 to Tn (called "thermometer-coded signals" for reasons explained hereinafter) and selects either its first terminal or its second terminal in accordance with the value of the signal concerned. A first output current $I_A$ of the DAC 1 is the sum of the respective currents delivered to the first terminals of the differential switching circuit, and a second output current $I_B$ of the DAC 1 is the sum of the respective currents delivered to the second terminals of the differential switching circuit. The analog output signal is the voltage difference $V_A-V_B$ between a voltage $V_A$ produced by sinking the first output current $I_A$ of the DAC 1 into a resistance R and a voltage $V_B$ produced by sinking the second output current $I_B$ of the converter into another resistance R.

The thermometer-coded signals T1 to Tn are derived from the binary input word D1-Dm by digital circuitry including a binary-thermometer decoder 6. The decoder 6 operates as follows. When the binary input word D1-Dm has the lowest value the thermometer-coded signals T1-Tn are such that each of the differential switching circuits $4_1$ to $4_n$ selects its second terminal so that all of the current sources $2_1$ to $2_n$ are connected to the second connection line B. In this state, $V_A=0$ and $V_B=nIR$. The analog output signal $V_A-V_B=nIR$. As the binary input word D1-Dm increases progressively in value, the thermometer-coded signals T1 to Tn produced by the decoder 6 are such that more of the differential switching circuits select their respective first terminals (starting from the differential switching circuit $4_1$) without any differential switching circuit that has already selected its first terminal switching back to its second terminal. When the binary input word D1-Dm has the value i, the first i differential switching circuits $4_1$ to $4_i$ select their respective first terminals, whereas the remaining n–i differential switching circuits $4_{i+1}$ to $4_n$ select their respective second terminals. The analog output signal $V_A-V_B$ is equal to $(2i-n)IR$.

Thermometer coding is popular in DACs of the current-steering type because, as the binary input word increases, more current sources are switched to the first connection line A without any current source that is already switched to that line A being switched to the other line B. Accordingly, the input/output characteristic of the DAC is monotonic and the glitch impulse resulting from a change of 1 in the input word is small.

An exemplary differential switching circuit suitable for use with the DAC of FIG. 1 is shown in FIG. 2. This differential switching circuit comprises first and second PMOS field-effect transistors (FETs) S1 and S2. The respective sources of the transistors S1 and S2 are connected to a common node TAIL to which a corresponding current source ($2_1$ to $2_n$ in FIG. 1) is connected. The respective drains of the transistors S1 and S2 are connected to respective first and second output nodes OUTA and OUTB of the circuit which correspond respectively to the first and second terminals of each of the differential switching circuits shown in FIG. 1.

Each transistor S1 and S2 has a corresponding driver circuit $8_1$ or $8_2$ connected to its gate. Complementary input signals IN and INB (which correspond to the thermometer-coded signal for the differential switching circuit) are applied respectively to the inputs of the driver circuits $8_1$ and $8_2$. Each driver circuit buffers and inverts its received input signal IN or INB to produce a switching signal SW1 or SW2 for its associated transistor S1 or S2 such that, in the steady-state condition, one of the transistors S1 and S2 is on and the other is off. For example, as indicated in FIG. 2, when the input signal IN has the high level (H) and the input signal INB has the low level (L), the switching signal SW1 (gate drive voltage) for the transistor S1 is at the low level L, causing that transistor to be ON, whereas the switching signal SW2 (gate drive voltage) for the transistor S2 is at the high level H, causing that transistor to be OFF. Thus, in this condition, all of the input current flowing into the common node TAIL is passed to the output node OUTA and no current passes to the output node OUTB.

When it is desired to change the state of the circuit of FIG. 2 so that the transistor S1 is OFF and the transistor S2 is ON, complementary changes are made simultaneously in the input signals IN and INB such that the input signal IN changes from H to L at the same time as the input signal INB changes from L to H. As a result of these complementary changes the transistor S1 turns OFF and the transistor S2 turns ON, so that all of the input current flowing into the common node TAIL is passed to the output node OUTB and no current passes to the output node OUTA.

One problem with the DAC of FIG. 1 is third-order distortion. Third order distortion is particularly undesirable in DACs which produce multi-tone output signals, since third-order intermodulation distortion may occur in-band, in which case it cannot be removed by filtering. Such third-order distortion is believed to be due in part to currents flowing into and out of parasitic capacitances which are present in the differential switching circuits (FIG. 2).

To address this problem, and other problems associated with the DAC of FIGS. 1 and 2, the present inventors have proposed in EP-A1-2019487 a modified differential switching circuit 10 as shown in FIG. 3 (which is for a single segment of the overall DAC). This differential switching circuit 10 differs from the differential switching circuit of FIG. 2 in several ways. For example, the circuit 10 has four FETs (output switches) associated with each output node OUTA and OUTB. In particular, the first to fourth FETs S1 to S4 are connected between a first output node OUTA and a common node TAIL. The fifth to eighth FETs S5 to S8 are connected between a second output node OUTB and the common node TAIL. Each of these eight FETs S1 to S8 is turned on or off by a drive signal $V_{S1}$ to $V_{S8}$ applied thereto.

The differential switching circuit 10 of FIG. 3 is designed to operate in a repeating series of four phases, based on a single complementary pair of clock signals CLK and $\overline{CLK}$ as will become apparent. The first and fifth FETs S1 and S5 constitute a first pair of FETs which are available in the first phase. The second and sixth FETs S2 and S6 constitute a second pair of FETs which are available in the second phase. The third and seventh FETs S3 and S7 constitute a third pair of FETs which are available in the third phase. Finally, the fourth and eighth FETs S4 and S8 constitute a fourth pair of FETs which are available in the fourth phase. In each phase, one of the FETs of the pair concerned is turned on and the other of those FETs is turned off, and all of the other FETs of the eight FETs S1 to S8 are turned off. For example, in the first phase one of S1 and S5 is turned on and the other of those FETs is turned off, and each of S2 to S4 and S6 to S8 is turned off. The FET which is turned on in a pair is determined by the data applied to the DAC, as will be explained later.

The advantage of the FIG. 3 differential switching circuit 10 is that at the start of each phase the same number of FETs change state. One FET will always be turning on and another FET will always be turning off. For example, consider the case in which S1 is on in the first phase and then in the next phase the data remains unchanged. In that case, at the start of the next phase concerned, S1 turns off and S2 turns on, with S3 to S8 remaining off. Consider also the case in which S2 is on in the second phase and then in the next phase the data changes. In that case, at the start of the next phase concerned, S2 turns off and S7 turns on, with S1, S3 S4, S5, S6 and S8 remaining off. In the FIG. 2 differential switch circuit, this is not possible, the switch S1 simply remaining on in successive cycles when the data is unchanged. This means that in the FIG. 2 circuit, the number of FETs that change state from one cycle to the next is dependent on the data. In the FIG. 3 circuit, on the other hand, the number of FETs that change state from one phase to the next is independent of the data. By arranging for the same number of FETs to change state in each phase, the charge which flows into and out of the parasitic capacitances in the circuitry is less dependent on the input data signal. This helps to reduce third-order distortion which may occur in the analog output signal.

There are other advantages associated with the FIG. 3 circuitry, too. In particular, by arranging for the same number of FETs to change state in each phase, the current drawn by each analog segment is approximately the same in each phase. This should help to reduce variations in the timings of the switching operations of the different analog segments, which again may lead to reduced distortion.

Another problem which exists in the DAC of FIGS. 1 and 2 is timing mismatches between different analog segments and between different switching parts of the same segment. For example, in the FIG. 2 circuit problems will arise if the signals IN and INB applied to one analog segment change at times different from the corresponding signals in other analog segments. Furthermore, even if it could be ensured that there is no timing variation between the IN and INB signals of different analog segments, a problem still arises if the two different switch drivers $8_1$ and $8_2$ have timing mismatches between them. Such timing mismatches can arise, for example, due to random threshold voltage variations between FETs used to implement the drivers $8_1$ and $8_2$. The phenomenon of random threshold variation becomes more significant as the transistor sizes are reduced in order to improve the switching speeds of the transistors.

To address the timing mismatch problem, the present inventors have proposed in EP-A1-2019487 modified switch driver circuitry, an example part of which is shown in FIG. 4 and may be understood in conjunction with FIGS. 5A and 5B. This modified switch driver circuitry is connected to the differential switch circuit 10 of FIG. 3, and supplies the drive signals $V_{S1}$ to $V_{S8}$ to FETs S1 to S4.

It is assumed that the circuitry receives data signals of the complementary type, one complementary pair per phase. Thus, the signals DATA 1 and $\overline{DATA1}$ are for the first phase, the signals DATA 2 and $\overline{DATA2}$ are for the second phase, the signals DATA 3 and $\overline{DATA3}$ are for the third phase, and the signals DATA 4 and $\overline{DATA4}$ are for the fourth phase. These four pairs of data signals may be time-interleaved, such that if the overall sample rate of the DAC is for example 12 Gs/s (i.e. changes in the analog output signal occur at 12 GHz) changes in each of these pairs of complementary data signals occur at a frequency of 3 GHz.

The switch driver circuitry 22 also receives a pair of complementary clock signals CLK and $\overline{CLK}$ as mentioned above, which may have the frequency 6 GHz in the example 12 Gs/s case.

It is also assumed that the circuitry comprises a mask generator operable (e.g. using divide-by-two circuits) to generate four mask signals MASK 1 to MASK 4 as indicated in FIGS. 5A and 5B, based on the complementary clock signals CLK and $\overline{CLK}$ as also shown in those Figures. As with the data signals, the mask signals MASK 1 to MASK 4 correspond respectively to the four phases.

FIG. 4 shows an example implementation of the driver circuitry for the first phase, i.e. using the data signals DATA 1 and $\overline{DATA1}$ and the mask signal MASK 1. This driver circuitry has a first driver portion 20 and a second driver portion 30, and a switch controller 40.

The first driver portion 20 is used to provide the drive signal $V_{S1}$. The first driver portion 20 comprises a data-controlled switch 22 connected between a clock input node of the first driver portion 20 and an output node of that driver portion at which the drive signal $V_{S1}$ is output. It is assumed that clock signal $\overline{CLK}$ is received at the clock input node. The clock switch 22 is controlled by a first control signal C1 generated by the switch controller 40. The switch controller 40 comprises an AND gate 42 which receives at its inputs the data signal DATA 1 and the mask signal MASK 1. Thus, C1=DATA 1·MASK 1.

The first switch driver portion 20 further comprises a switch 24 connected between the output node and a node of the driver portion which is maintained at a predetermined low potential $V_{LO}$. This low potential $V_{LO}$ is maintained at substantially the same potential as the potential of each of the clock signals CLK and $\overline{CLK}$ when in the low (inactive) state. The switch controller 40 comprises a NAND gate 44 which, similarly to the AND gate 42, receives the signals DATA 1 and MASK 1 at its inputs. The output signal C2 of the NAND gate 84 is therefore $\overline{DATA1 \cdot MASK1}$.

The second switch driver portion 30 provides the drive signal $V_{S5}$. This second driver portion 30 has a clock input node at which the clock signal $\overline{CLK}$ is received. In a similar manner to portion 20, a switch 32 is arranged between the clock input node and the output node, controlled by a control signal C3 produced by the switch controller 40, and a switch 34 is connected between the output node and the node having the potential $V_{LO}$, controlled by control signal C4 produced by the switch controller 40. The switch controller 80 comprises an AND gate 46 and a NAND gate 48 which receive at their inputs the inverted data signal $\overline{DATA1}$ and the mask signal MASK 1, and generate C3=$\overline{DATA1}$·MASK 1 and C4=DATA 1+$\overline{MASK1}$.

These signals MASK 1, DATA 1, $\overline{DATA1}$, CLK and $\overline{CLK}$, C1, C2, C3 and C4 can be appreciated from the upper portion of FIG. 5A, in the generation of $V_{S1}$ and $V_{S5}$. Other driver circuits are provided for the second to fourth phase, and are implemented in basically the same manner as in FIG. 4, to generate $V_{S2}$ and $V_{S6}$ for the second phase (see the lower part of FIG. 5A), $V_{S3}$ and $V_{S7}$ for the third phase (see the upper part of FIG. 5B) and $V_{S4}$ and $V_{S8}$ for the fourth phase (see the lower part of FIG. 5B). Table 1 below shows any differences in the connection arrangements, and may be understood with reference to EP-A1-2019487.

TABLE 1

| Clock input node | Clock switch | Other switch |
| --- | --- | --- |
| $V_{S1}$ | $\overline{CLK}$ | DATA 1.MASK 1 | $\overline{DATA\ 1.MASK\ 1}$ |
| $V_{S5}$ | $\overline{CLK}$ | $\overline{DATA\ 1.MASK\ 1}$ | DATA 1 + $\overline{MASK\ 1}$ |
| $V_{S2}$ | CLK | DATA 2.MASK 2 | $\overline{DATA\ 2.MASK\ 2}$ |
| $V_{S6}$ | CLK | $\overline{DATA\ 1.MASK\ 1}$ | DATA 2 + $\overline{MASK\ 1}$ |
| $V_{S3}$ | $\overline{CLK}$ | DATA 3.MASK 3 | $\overline{DATA\ 3.MASK\ 3}$ |
| $V_{S7}$ | $\overline{CLK}$ | $\overline{DATA\ 3.MASK\ 3}$ | DATA 3 + $\overline{MASK\ 3}$ |
| $V_{S4}$ | CLK | DATA 4.MASK 4 | $\overline{DATA\ 4.MASK\ 4}$ |
| $V_{S8}$ | CLK | $\overline{DATA\ 4.MASK\ 4}$ | DATA 4 + $\overline{MASK\ 4}$ |

As shown in the timing diagrams of FIGS. 5A and 5B, the DAC operates in a repeating sequence of four phases, identified in the diagrams showing the complementary clock signals CLK and $\overline{CLK}$. In the example, the switches which are on in successive phases are S8, S1, S6, S7, S4, S5, S2, S3, respectively, in each phase the other seven switches being off.

As will be appreciated from FIGS. 5A and 5B, the mask signals have the effect of turning on or off the relevant data-controlled switches in advance of the next rising edge of the relevant clock signal. The precise timing at which the mask signals change is not critical, as long as the change occurs in advance of the relevant next rising clock edge (since the dock signals pass to the output switches via such data-controlled switches). This is so that the precise timing of the rising edges in the drive signal $V_{S1}$ to $V_{S8}$ are controlled exclusively by the dock signals, and not by the timing of the mask signals (i.e. the data signals which contribute to the mask signals). Accordingly, even if there is jitter in the mask and data signals, this will not affect the operation of the circuitry.

The generation of the four mask signals from the complementary clock signals is simple to achieve. Also, the timing of the changes in the mask signals, and mismatches between the data-controlled switches, is not especially critical. As mentioned above, all that matters is that each active period of the mask signal begins before the relevant rising edge of the clock signal CLK/$\overline{CLK}$ and ends after the falling edge of that clock signal. Jitter, if any, on the mask signals and switch mismatches do not significantly affect the timing of the changes in the drive signals. Additionally, a simple pair of complementary clock signals CLK/$\overline{CLK}$ can be used, which is advantageous considering that any timing errors in the clock signals would affect the performance of the differential switching circuitry directly.

However, the present inventors have identified problems in the above previously considered circuitry, and represented by FIGS. 3 to 5. In particular, the present inventors are contemplating a DAC capable of operating at a much higher conversion frequency, for example up to 64 Gs/s and beyond. This imposes some severe requirements on the circuitry.

FIG. 6 reproduces the first driver portion 20 of FIG. 4 (used to provide the drive signal $V_{S1}$) in simplified form, to enable a better understanding of problems identified by the present inventors. Although in FIG. 4, the data-controlled switches are controlled by signals which are a combination of mask and data signals, for simplicity only the data aspect is shown in FIG. 4 (but it will be understood that mask signals are also employed).

As indicated in FIG. 6, the data-controlled switches at the gate of each output switch are implemented in CMOS. The data signals DATA1 and $\overline{DATA1}$ (in combination with the actual mask signals) act effectively as mask signals, and are aligned with the clock signals so that they are already in a particular state (1 or 0) when the clock phase concerned rises to is peak and falls again. Further, it is arranged that these mask signals (data signals) change state when the clock signal is not needed at the input of the output switch S1. Similar considerations of course apply to the other switches S2 to S8.

An important feature of the data-controlled switches is that, when they are intended to be on, they must stay on with low on-resistance in order to reliably transfer the clock signals to the gates concerned. However, with advancing miniaturisation in semiconductor manufacturing processes, with the consequential miniaturisation of transistor sizes and reductions in supply voltage, problems arise.

For example, for CMOS such data-controlled switches the on resistance $R_{ON}$ has a more pronounced peak somewhere within the range 0 volts to $V_{DD}$, as size is miniaturised, and the threshold voltage $V_{TH}$ variations between transistors affect the positions of the peaks. Thus, at small transistor sizes (where threshold voltage $V_{TH}$ variation is more prominent) the performance of the CMOS data-controlled switches at the gates of the output switches SW1 to SW8 can differ one from the next due to $V_{TH}$ variation, leading to differences in how the clock signals are passed on to the gates, and thus to distortion in the output of the switching circuitry.

Moreover, if the data-controlled switches are implemented in CMOS, then the PMOS transistors have to be bigger than the NMOS transistors to try to keep constant on resistance, and this adds more capacitance and slows the circuitry down.

These problems are all the more prevalent because with the low $V_{DD}$ used for the tiny transistors, the clock voltage swing is substantial (e.g. 600 mV pp/$V_{DD}$=0.9 volts, or even 900 mV pp/$V_{DD}$=0.9 volts). Thus, the additional problem is even keeping the CMOS data-controlled switches on over the full clock swing. If the data-controlled switches turn off during the clock swing (or go high resistance) then: (a) the clock waveform that they are passing becomes distorted; and (b) the data-controlled switches add delay which depends on the switch Ron ($V_{TH}$). $V_{TH}$ variation makes delay vary from switch-to-switch so that there is no longer constant switching delay. That is, the delay of the output current transitions changes from output switch to output switch because the gate waveforms after the data-controlled switches have different delays.

As indicated in FIG. 7, the inventors have considered driving the gates of the output switches with NMOS data-controlled switches rather than CMOS, in particular higher-voltage NMOS switches (e.g. 1.5V devices instead of 0.9V) so that they stay on over the whole clock range. For example, if the clock swing is from GND to 600 mV then Von for the switch gate can be 1.5V (Voff=GND), which is 0.9V above the highest clock voltage, and well above $V_{TH}$ so the switch stays on. However 1.5V NMOS transistors (as in FIG. 2) have thicker gate oxide than 0.9V transistors and are thus slower (higher Ron for a given $C_{gate}$). As such, the FIG. 7 circuitry might be considered acceptable in some circumstances (e.g.

at lower speeds of operation, or if lower accuracy can be tolerated) but these issues act as a barrier to adoption of higher clock rates and smaller switch sizes. Also, the added capacitance increases power consumption.

Other problems identified with the circuitry of FIGS. 3 to 5 include the need to generate and employ mask signals in addition to the data signals, for example in view of the additional circuitry needed as in FIG. 4.

Other problems considered herein are how to calibrate the circuitry disclosed herein, and how to handle and distribute clock signals in relation to the circuitry disclosed herein.

It is desirable to solve some or all of the above problems.

According to a first aspect of the present invention, there is provided switching circuitry for use in a digital-to-analogue converter, the circuitry comprising: a common node; first and second output nodes; and a plurality of switches connected between the common node and the first and second output nodes and operable in each clock cycle of a series of clock cycles, based on input data, to (conductively) connect the common node to either the first or second output node along a given one of a plurality of paths, wherein the circuitry is arranged such that a data-controlled switch and a clock-controlled switch are provided in series along each (or at least one) said path from the common node to the first or second output node.

Advantageously, by placing data-controlled switches in series with the clock-controlled switches, it may be possible to provide clock signals directly to the dock-controlled switches without those clock signals passing via a data-controlled switch. This may empty the clock paths of potential sources of distortion (i.e. switched transistors such as data-controlled switches).

The clock cycles may be defined by a dock signal or a plurality of time-interleaved clock signals. The or each dock signal may be a substantially sinusoidal clock signal, having a raised cosine shape.

The switching circuitry may comprise a clock generator operable to generate the or each clock signal, and clock-signal distribution circuitry configured to supply each clock-controlled switch with a said clock signal without that clock signal passing via a data-controlled switch.

The switching circuitry may comprise a plurality of such paths between the common node and the first output node, and a plurality of such paths between the common node and the second output node. There may be the same number of paths between the common node and each of the first and second output nodes.

In each clock cycle, the path conductively connecting the common node to the first or second output node may be dependent on the clock cycle and the input data. This is because data-controlled switches and clock-controlled switches are provided in series.

The clock cycles may be defined by a plurality of time-interleaved clock signals, as above. Each path between the common node and the first output node may have an associated path between the common node and the second output node. The clock-controlled switches in associated said paths may be controlled by the same clock signal.

The clock-controlled switches in respective such paths between the common node and the same output node may be controlled by respective different clock signals.

Each path between the common node and the first output node may have an associated path between the common node and the second output node, and the data-controlled switches in associated paths may be controlled by mutually-complementary (i.e. inverse) data signals.

The data-controlled switches in the paths between the common node and the same output node may be controlled by respective different data signals of a set of data signals.

The common node may be a first common node, and the circuitry may comprise a second common node. The plurality of switches may be connected between the first and second common nodes and the first and second output nodes and operable in each clock cycle of the series of clock cycles, based on the input data, to conductively connect along such paths either the first common node to the first output node and the second common node to the second output node, or the first common node to the second output node and the second common node to the first output node.

Similar to the above, a data-controlled switch and a clock-controlled switch may be provided in series along each path from the second common node to the first or second output node.

The circuitry may be configured such that pairs of paths pass through the same clock-controlled switch, in each such pair one of the paths connecting to the first common node and the other connecting to the second common node. Moreover, for each such pair of paths, the data-controlled switches of the two paths may be controlled by respective mutually-complementary (i.e. inverse) data signals.

For each such pair of paths, the data-controlled switch of each path may be connected between an intermediate node common to both of those paths and the respective one of the first and second common nodes. For each such pair of paths, a controllable resistance may be connected in series between the intermediate node and the data-controlled switch in the one of those paths connected to the second common node. This may enable the voltage at the two common nodes to be substantially equalised, i.e. by controlling the resistance value of controllable resistances. Such controllable resistances may be implemented as transistors.

For each such pair of paths, the clock-controlled switch common to both of those paths may be connected between the intermediate node and the one of the first and second output nodes concerned.

The switching circuitry may be configured such that when one of the output nodes is conductively connected to the first common node a first current flows through those nodes, and when one of the output nodes is conductively connected to the second common node a second current flows through those nodes, the first and second currents being different from one another. The first and second currents may be provided by corresponding differently-sized first and second current sources or sinks connected to the first and second common nodes, respectively.

The data-controlled switches and the clock-controlled switches may be field-effect transistors, which are preferably all of the same size and/or of the same channel type (e.g. NMOS).

The data-controlled switches may be connected directly to the common node, or to the one of the first and second common nodes concerned.

The second output node may be or comprise a plurality of dummy nodes. That is, currents flowing through the second output node might be ignored or "dumped" if the circuitry is to be used in a "single-ended" manner. For example, the plurality of switches may be operable when connecting a common node to the second output node to connect that common node to the or one of the dummy nodes.

According to a second aspect of the present invention, there is provided switching circuitry for use in a digital-to-analogue converter, the circuitry comprising: a common node; an output node; and a plurality of switches connected between the common node and the output node and operable in each clock cycle of a series of clock cycles, based on input data, to conductively connect or not connect the common node to the output node along a given one of a plurality of paths, wherein the circuitry is arranged such that a data-controlled switch and a clock-controlled switch are provided in series along each (or at least one) said path from the common node to the output node.

The common node may be a first common node and the circuitry may comprise a second common node. The plurality of switches may be connected between the first and second common nodes and the output node and operable in each clock cycle of the series of clock cycles, based on the input data, to conductively connect along such paths either the first common node or the second common node to the output node.

The circuitry may comprise one or more dummy nodes, and the plurality of switches may be connected between the common, output and dummy nodes. In such a case, the plurality of switches may be operable to (conductively) connect the or each common node to a said dummy node when it does not conductively connect that common node to the output node.

According to a third aspect of the present invention, there is provided switching circuitry for use in a digital-to-analogue converter, the circuitry comprising: an output node; and a plurality of switches operable in each clock cycle of a series of clock cycles, based on input data, to direct either a first current or a second current through the output node, wherein the first and second currents are different from one another. Both of the first and second currents preferably have a non-zero value, and preferably both have either a positive magnitude or a negative magnitude.

Such circuitry may be advantageous as it may allow a current to flow through the output node for each input data value, and reduce the risk of nodes such as intermediate nodes within the circuitry floating.

The circuitry may comprise first and second common nodes, at which the first and second currents are respectively received/applied. The plurality of switches may be connected between the first and second common nodes and the output node and be operable in each clock cycle of the series of clock cycles, based on the input data, to conductively connect along respective paths either the first common node or the second common node to the output node.

The circuitry may comprise first and second said output nodes, and the plurality of switches may be operable in each clock cycle of the series of clock cycles, based on the input data, to direct either the first current through the first output node and the second current through the second output node, or the second current through the first output node and the first current through the second output node. Such first and second output nodes may thus effectively be differential output nodes (an overall output being measured between them).

Such circuitry with first and second output nodes may also comprise first and second common nodes, at which the first and second currents are respectively received. The plurality of switches may be connected between the first and second common nodes and the first and second output nodes and operable in each clock cycle of the series of clock cycles, based on the input data, to conductively connect along respective paths either the first common node to the first output node and the second common node to the second output node, or the first common node to the second output node and the second common node to the first output node.

The series of clock cycles may comprise a repeating set of clock cycles. The paths along which such conductive connection is made may be different from cycle to cycle of the set, i.e. with each cycle having its assigned (dedicated) paths.

The clock cycles may be defined by a clock signal or a plurality of time-interleaved clock signals. The or each clock signal may be a substantially sinusoidal clock signal.

According to a fourth aspect of the present invention, there is provided switching circuitry for use in a digital-to-analogue converter, the circuitry comprising: a common node; an output node; and a plurality of switches connected between the common node and the output node and operable in each clock cycle of a series of clock cycles defined by one or more clock signals, based on input data, to conductively connect or not connect the common node to the output node along a given one of a plurality of paths, wherein: the circuitry is arranged such that at least a clock-controlled switch is provided along each said path from the common node to the output node; and the clock-controlled switches are controlled directly by a said clock signal without that clock signal passing via a data-controlled switch.

This may advantageously ensure that clock signals are passed to the clock-controlled switches without suffering from distortion in data-controlled switches.

The circuitry may comprise first and second output nodes. The plurality of switches may be connected between the common node and the first and second output nodes and operable in each clock cycle of the series of clock cycles, based on the input data, to conductively connect the common node to either the first or second output node along a given one of a plurality of paths. The circuitry may be arranged such that at least a clock-controlled switch is provided along each said path from the common node to the first or second output node, and the clock-controlled switches are controlled directly by a said clock signal without that clock signal passing via a data-controlled switch.

The clock cycles may be defined by a plurality of time-interleaved clock signals. The series of clock cycles may comprise a repeating set of clock cycles, and the paths along which such conductive connection is made may be different from cycle to cycle of the set.

The clock signals applied to the clock-controlled switches may be considered data-independent, and may be applied to those switches continuously while the circuitry is in operation.

A data-controlled switch may be provided in series with one of the clock-controlled switches along each path, so as to apply data control to the circuitry.

According to a fifth aspect of the present invention, there is provided a digital-to-analogue converter, comprising switching circuitry according to any of the aforementioned first to fourth aspects of the present invention.

According to a sixth aspect of the present invention, there is provided an integrated circuit or an IC chip, comprising switching circuitry according to any of the aforementioned first to fourth aspects of the present invention or a digital-to-analogue converter according to the aforementioned fifth aspect of the present invention.

According to a seventh aspect of the present invention, there is provided a method of calibrating switching circuitry, the switching circuitry comprising a measurement node and a plurality of output switches connected to the measurement node, and the circuitry being configured, in each clock cycle of a series of clock cycles, to control whether or not one or more of said output switches carry a given current based upon input data, the method comprising: inputting a plurality of different data sequences to the circuitry, each sequence causing a given pattern of voltages to occur at the measurement node as a result of currents passing through the output switches; measuring the voltages occurring at the measurement node for each said sequence; and calibrating the switching circuitry in dependence upon a result of said measuring.

The circuitry may be configured such that, in any given clock cycle, at most one of the output switches of the plurality of output switches carries a given current.

Each said output switch may be associated with a corresponding clock cycle in a repeating set of clock cycles, and the circuitry may be configured in each clock cycle to control whether or not the associated switch carries a given current based upon input data.

The measurement node may be a first measurement node and the output switches may be first output switches. The circuitry may comprise a second measurement node and a plurality of second such output switches connected to the second measurement node, the circuitry being configured to control which of the output switches carries a given current in each clock cycle of a series of clock cycles based upon input data, the method comprising: inputting the plurality of different data sequences to the circuitry, each sequence causing a given pattern of voltages to occur at the first and second measurement nodes as a result of currents passing through the output switches; measuring the voltages occurring at one or both of the first and second measurement nodes for each sequence; and calibrating the switching circuitry in dependence on a result of said measuring.

Each first output switch and an associated second output switch may together be associated with a corresponding clock cycle in a repeating set of clock cycles, and the circuitry may be configured in each clock cycle to control whether or not the associated output switches carry a given current based upon input data. The circuitry may be configured in each clock cycle to control which of the associated output switches carries a given current based upon input data. The circuitry may be configured in each clock cycle to control which of the associated output switches carries a first current and which carries a second current based upon input data, the first and second currents being different from one another.

Each data sequence may comprise a repeating pattern of data values. The measuring may comprise obtaining an average of the voltages occurring at the or each measurement node for each said sequence.

The output switches may be field-effect transistors, and the calibrating may comprise adjusting respective bulk voltages applied to the output switches.

The data sequences may be configured such that the measuring indicates or isolates the gains of the individual output switches. The calibrating may comprise adjusting operation of the output switches to tend to cause the measuring to indicate that the output switches have the same gains.

The calibrating may comprise combining or comparing results from the measuring for the different sequences.

The or each measurement node may be an output node or a tail node of the switching circuitry.

The method may be for calibrating a plurality of sets of such switching circuitry (each being a DAC slice), the plurality of sets forming part of a switching-circuitry system (e.g. an overall DAC). For each set of switching circuitry, the or each measurement node may be an output node of that set of switching circuitry, and the or each output node of one of the sets of switching circuitry may be connected to the corresponding output node of each other set of switching circuitry to form an output node of the switching-circuitry system. In such a case, the method may comprise: inputting a set-targeting data signal to the system, the data signal being configured such that it causes one of the sets of switching circuitry to receive its plurality of different data sequences, and the or each other set of switching circuitry to receive in parallel a dummy plurality of data sequences, where the data sequences in any said dummy plurality of data sequences are the same as one another; measuring the voltages occurring at the or at least one of the system output nodes for each said sequence of that plurality of different data sequences; and calibrating the set of switching circuitry receiving that plurality of different data sequences in dependence upon a result of said measuring.

Such a method may further comprise: inputting a plurality of different set-targeting data signals to the system one-by-one, each set-targeting data signal causing a corresponding target one of the sets of switching circuitry to receive its plurality of different data sequences, and the or each other set of switching circuitry to receive in parallel a said dummy plurality of data sequences; and, for each said set-targeting data signal, measuring the voltages occurring at the or at least one of the system output nodes for each said sequence of the plurality of different data sequences concerned, and calibrating the set of switching circuitry receiving that plurality of different data sequences in dependence upon a result of said measuring.

According to an eighth aspect of the present invention, there is provided calibration circuitry for calibrating switching circuitry, the switching circuitry comprising a measurement node and a plurality of output switches connected to the measurement node, and the switching circuitry being configured to control whether or not each of those switches carries a given current in each clock cycle of a series of clock cycles based upon input data, the calibration circuitry comprising: data-sequence circuitry operable to input a plurality of different data sequences to the switching circuitry, each sequence causing a given pattern of voltages to occur at the measurement node as a result of currents passing through the output switches; measurement circuitry operable to measure the voltages occurring at the measurement node for each said sequence; and calibration circuitry operable to calibrate the switching circuitry in dependence on a result of said measuring.

According to a ninth aspect of the present invention, there is provided an integrated circuit or an IC chip comprising calibration circuitry according to the aforementioned eighth aspect of the present invention. Such an integrated circuit or an IC chip may further comprise the switching circuitry. Such an integrated circuit or an IC chip may further comprise a digital-to-analogue converter, wherein the switching circuitry is part of the digital-to-analogue converter.

According to a tenth aspect of the present invention, there is provided a digital-to-analogue converter comprising calibration circuitry according to the aforementioned eighth aspect of the present invention.

According to an eleventh aspect of the present invention, there is provided a switching circuit, comprising: a main switch having a control terminal; and a clock-path portion connected to the control terminal of the main switch to apply a driving clock signal thereto so as to drive the main switch, wherein the circuit is configured to controllably apply a biasing voltage to the clock-path portion so as to bias (or control) a voltage level of the driving dock signal as applied to the control terminal of the main switch.

Such a main switch may be "main" in the sense that it is a focus for the control/biasing provided by the circuitry. It may be considered a switch which is the subject of attention, e.g. a candidate, target or primary switch. In this sense, other switches provided to help control the main switch may be considered auxiliary switches.

The circuit may be configured to dynamically, intermittently, periodically and/or repeatedly apply the biasing voltage to the clock-path portion so as to bias a voltage level of the driving dock signal as applied to the control terminal of the main switch.

The circuit may be configured to apply the biasing voltage to the clock-path portion over a particular portion of each period of the driving clock signal.

The circuit may comprise a clock path, the clock path comprising AC-coupling (or DC-decoupling) means such as a capacitor provided in series along the path, wherein: the path has an upstream portion upstream of the AC-coupling means, and a downstream portion downstream of the AC-coupling means which is connected to the control terminal of the main switch; the clock-path portion is said downstream portion of the clock path; and the AC-coupling means is operable to DC decouple said driving clock signal applied to the control terminal via the downstream portion of the clock path from a source clock signal received from a clock-signal source via the upstream portion of the path.

The circuit may be configured to apply the biasing voltage to the clock-path portion by controllably connecting the clock-path portion to a reference-voltage source. For example, the circuit may comprise an auxiliary switch connected between said clock-path portion and said reference-voltage source, wherein: the auxiliary switch has a control terminal connected to receive an auxiliary signal so as to control when the clock-path portion is connected to the reference-voltage source. The reference-voltage source may for example be a controllable reference-voltage source.

The main switch and the auxiliary switch may be field-effect transistors of opposite channel type; the auxiliary signal may be an auxiliary clock signal. The driving and auxiliary clock signals may be complementary clock signals (substantially in antiphase), so as to turn on the auxiliary switch and connect the dock-path portion to the reference-voltage source when the main switch turns on.

The auxiliary switch may be connected to receive its auxiliary clock signal via AC-coupling means, based on a source clock signal applied to that AC-coupling means; and the switching circuit may further comprise threshold-voltage compensation circuitry connected to the control terminal of the auxiliary switch and operable to apply a compensating voltage to the control terminal of the auxiliary switch to compensate for any difference between the threshold voltage of the auxiliary switch and a given threshold voltage. In such a manner, the effect of the auxiliary switch may be substantially independent of the value of its threshold voltage.

The threshold-voltage compensation circuitry may have a field-effect transistor of the same channel type and size as the auxiliary switch. That field-effect transistor may be "diode-connected" so that it shifts the control voltage in the same direction as $V_{TH}$ e.g. for NMOS, higher voltage if $V_{TH}$ increases.

The auxiliary switch may be a first auxiliary switch, and the switching circuit may comprise a second auxiliary switch connected between the clock-path portion and voltage-measurement means. The first and second auxiliary switches may be field-effect transistors of opposite channel type. The second auxiliary switch may have a control terminal connected to receive an auxiliary clock signal so as to turn on the second auxiliary switch and connect the clock-path portion to the voltage-measurement means when the main switch turns off.

The second auxiliary switch may be connected to receive its auxiliary clock signal via AC-coupling means, based on a source clock signal applied to that AC-coupling means. The switching circuit may further comprise threshold-voltage compensation circuitry connected to the control terminal of the second auxiliary switch and operable to apply a compensating voltage to the control terminal of the second auxiliary switch to compensate for any difference between the threshold voltage of the second auxiliary switch and a given threshold voltage.

The threshold-voltage compensation circuitry for the second auxiliary switch may comprise a field-effect transistor of the same channel type and size as the second auxiliary switch.

The source clock signals and/or the auxiliary clock signals may be the same for the first and second auxiliary switches. The source clock signals for the first and second auxiliary switches may be substantially in antiphase with the source clock signal for the main switch.

The or each dock signal may be a sinusoidal dock signal.

According to a twelfth aspect of the present invention, there is provided switching circuitry comprising a plurality of switching circuits according to the aforementioned eleventh aspect of the present invention, wherein: the clock signals are clock signals of a set of time-interleaved clock signals; and the switching circuits are configured to bias the voltage level of the respective driving clock signals as applied to the control terminals of the respective main switches so that those main switches are driven in substantially the same way as one another.

In such a case, the reference-voltage source of one of the switching circuits may be the reference-voltage source of the or each other switching circuit.

The switching circuits of the switching circuitry may be organised into pairs, and for each pair the source clock signals of the driving and auxiliary clock signals for one of the switching circuits may be the source clock signals of the control and driving clock signals, respectively, for the other one of the switching circuits.

The switching circuitry may comprise two pairs of switching circuits, wherein the source clock signals of the driving and auxiliary clock signals for one of the pairs of switching circuits are first and third clock signals of a set of four time-interleaved clock signals and the source clock signals of the driving and auxiliary clock signals for the other one of the pairs of switching circuits are second and fourth clock signals of the set of four time-interleaved clock signals.

According to a thirteenth aspect of the present invention, there is provided a digital-to-analogue converter or an analogue-to-digital converter, comprising a switching circuit according to the aforementioned eleventh aspect of the present invention or switching circuitry according to the aforementioned twelfth aspect of the present invention.

According to a fourteenth aspect of the present invention, there is provided an integrated circuit or an IC chip, comprising a switching circuit according to the aforementioned eleventh aspect of the present invention, or switching circuitry according to the aforementioned twelfth aspect of the present invention, or a digital-to-analogue converter or an analogue-to-digital converter according to the aforementioned thirteenth aspect of the present invention.

According to a fifteenth aspect of the present invention, there is provided mixed-signal circuitry, comprising: a first switching-circuitry unit for use in an analogue-to-digital converter; and a second switching-circuitry unit for use in a digital-to-analogue converter; wherein: the first switching-circuitry unit is configured to sample an input analogue signal and output a plurality of samples based on a first plurality of clock signals; the second switching-circuitry unit is configured to generate an output analogue signal based on a plurality of data signals and a second plurality of clock signals; and the first and second pluralities of clock signals have the same specifications as one another.

Such circuitry may be mixed-signal circuitry in the sense that it carries or handles both digital and analogue signals, for example in that it comprises circuitry for use in both an analogue-to-digital converter and a digital-to-analogue converter.

Such digital signals may be time-interleaved signals. Such samples may be time-interleaved samples, and may be current or voltage samples. Such current samples may be current pulses or packets, whose size (in terms of the amount of charge) is indicative of the analogue signal (e.g. current signal) which is being sampled.

The first switching-circuitry unit may comprise current-mode circuitry for sampling a current signal, the circuitry for sampling a current signal comprising: a first node configured to have the current signal (being the input analogue signal) applied thereto; XS second nodes conductively connectable to said first node along respective paths; and steering means for controlling such connections between the first node and the second nodes so that different packets of charge making up said current signal (being the plurality of samples) are steered along different such paths over time. The number XS may be an integer greater than or equal to 3. The mixed-signal circuitry or the steering means may have control-signal generating means configured to generate XS time-interleaved sinusoidal control signals, being the first plurality of clock signals. The circuitry for sampling a current signal or the steering means may have switching means distributed along the paths and configured to carry out such control in dependence upon the XS sinusoidal control signals.

The second switching-circuitry unit may comprise switching circuitry according to any of the aforementioned first to fourth aspects of the present invention.

The first and second pluralities of clock signals may have the same specifications in that they comprise one or more of: the same number of dock signals, the same relative phase relationships (i.e. within the pluralities, for example in terms of how such signals are time-interleaved), the same shapes and the same characteristic frequencies, as one another. The clock signals of the first plurality of clock signals may be shifted in phase (retimed, or phase rotated) relative to the clock signals of the second plurality of clock signals. Such retiming may be very slight, for example less than 10 or 6 or 3 degrees.

The first and second pluralities of clock signals may be substantially (i.e. in substance) the same as one another.

The first switching-circuitry unit may comprise a plurality of sampling switches configured, based on the first plurality of clock signals and the input analogue signal, to output the plurality of samples. The second switching-circuitry unit may comprise a plurality of output switches configured, based on the second plurality of clock signals and the plurality of data signals, to generate the output analogue signal. The sampling switches and the output switches may be field-effect transistors, optionally of the same channel type (e.g. NMOS), and optionally of the same size (e.g. in terms of gate area), and optionally of the same number (or the number of one may be an integer multiple of the number of the other).

The second switching-circuitry unit may comprise a plurality of data-controlled switches connected to receive the plurality of data signals. The data-controlled switches may be connected in series with the output switches. In another case, the data-controlled switches may be connected to control terminals of the output switches to control, in dependence upon the plurality of data signals, whether or not clock signals of the second plurality of clock signals are applied to the control terminals of the output switches.

The sampling switches and the output switches may be configured to receive their clock signals in the same way as one another, and/or to be controlled by their clock signals in the same way as one another. For example, they may all serve to steer current in current-mode operation. The output switches and/or the sampling switches may be configured to receive their clock signals directly without those signals passing via data-controlled switches.

The first switching-circuitry unit may comprise a first driver unit via which the first plurality of clock signals are passed. The second switching-circuitry unit may comprise a second driver unit via which the second plurality of clock signals are passed. The first and second driver units may be the same as one another or different from one another.

The mixed-signal circuitry may comprise a demultiplexing-circuitry unit for use in the analogue-to-digital converter and a multiplexing-circuitry unit for use in the digital-to-analogue converter. The demultiplexing-circuitry unit may be configured to operate based on a third plurality of clock signals. The multiplexing-circuitry unit may be configured to operate based on a fourth plurality of clock signals. The third and fourth pluralities of clock signals may have the same specifications as one another.

The third and fourth pluralities of clock signals may have the same specifications as one another in that they have one or more of: the same number of clock signals, the same relative phase relationships (i.e. within the pluralities), the same shapes and the same characteristic frequencies, as one another. The clock signals of the third plurality of clock signals may be shifted in phase relative to the clock signals of the fourth plurality of clock signals. The third and fourth pluralities of clock signals may be substantially the same as one another.

The plurality of samples may be a first plurality of samples and the plurality of data signals may be a first plurality of data signals. The demultiplexing-circuitry unit may be connected to receive the first plurality of samples and configured, based on the third plurality of clock signals, to demultiplex and output those samples as a second plurality of samples. The multiplexing-circuitry unit may be connected to receive a second plurality of data signals and configured, based on the fourth plurality of clock signals, to multiplex and output those data signals as the first plurality of data signals.

The demultiplexing-circuitry unit may be a first demultiplexing-circuitry unit and the multiplexing-circuitry unit may be a first multiplexing-circuitry unit. The mixed-signal circuitry may comprise a second demultiplexing-circuitry unit for use in the analogue-to-digital converter and a second multiplexing-circuitry unit for use in the digital-to-analogue converter. The second demultiplexing-circuitry unit may be configured to operate based on a fifth plurality of clock signals. The second multiplexing-circuitry unit may be configured to operate based on a sixth plurality of clock signals. The fifth and sixth pluralities of clock signals may have the same specifications as one another.

The fifth and sixth pluralities of clock signals may have the same specifications as one another in that they have one or more of: the same number of clock signals, the same relative phase relationships (i.e. within the pluralities), the same shapes and the same characteristic frequencies, as one another. The clock signals of the fifth plurality of clock signals may be shifted in phase relative to the clock signals of the sixth plurality of clock signals. The fifth and sixth pluralities of clock signals may be substantially the same as one another.

The second demultiplexing-circuitry unit may be connected to receive the second plurality of samples and configured, based on the fifth plurality of clock signals, to demultiplex and output those samples as a third plurality of samples. The second multiplexing-circuitry unit may be connected to receive a third plurality of data signals and configured, based on the sixth plurality of clock signals, to multiplex and output those data signals as the second plurality of data signals.

The mixed-signal circuitry may comprise clock generation and distribution circuitry operable to generate the clock signals and distribute those clock signals to their respective circuitry units. Advantageously, such clock generation and distribution circuitry may generate the clock signals for the units for use in the analogue-to-digital converter in the same way as those for the units for use in the digital-to-analogue converter. This may simplify/ease the design of such clock generation and distribution circuitry, and make that circuitry more flexible in its use.

The clock generation and distribution circuitry may comprise phase-adjusting means operable to adjust the phases of a said plurality of clock signals for use in the analogue-to-digital converter and/or the phases of a corresponding said plurality of clock signals for use in the digital-to-analogue converter such that there is a phase difference between those corresponding pluralities of clock signals.

The clock generation and distribution circuitry may be operable to generate the third and fourth pluralities of clock signals from the first and/or second pluralities of clock signals, and optionally the fifth and sixth pluralities of clock signals from the third and/or fourth pluralities of clock signals.

Each such plurality of clock signals may be a plurality of time-interleaved clock signals. At least one of the pluralities of clock signals may be a plurality of sinusoidal clock signals. The first and second pluralities of clock signals may be pluralities of sinusoidal clock signals.

According to a sixteenth aspect of the present invention, there is provided a converter system comprising an analogue-to-digital converter and a digital-to-analogue converter, the converter system comprising mixed-signal circuitry according to the aforementioned fifteenth aspect of the present invention. Such a system may comprise a plurality of analogue-to-digital converters and/or a plurality of digital-to-analogue converters.

According to a seventeenth aspect of the present invention, there is provided an integrated circuit or an IC chip comprising mixed-signal circuitry according to the aforementioned fifteenth aspect of the present invention, or a converter system according to the aforementioned sixteenth aspect of the present invention.

All combinations of the aforementioned aspects of the present invention are envisaged, as will be apparent from the following disclosure. Method aspects corresponding in scope to all aforementioned apparatus (e.g. circuitry) aspects, and vice versa, are envisaged.

Reference will now be made, by way of example, to the accompanying drawings, of which:

FIG. 1, as mentioned hereinabove, presents an overview of a previously considered DAC;

FIG. 2, as mentioned hereinabove, presents an exemplary differential switching circuit suitable for use with the DAC of FIG. 1;

FIG. 3, as mentioned hereinabove, presents a modified differential switching circuit;

FIG. 4, as mentioned hereinabove, presents modified switch driver circuitry for use with the differential switching circuit of FIG. 3;

FIGS. 5A and 5B, as mentioned hereinabove, present timing diagrams useful for understanding the operation of the circuitry of FIGS. 3 and 4;

FIG. 6, as mentioned hereinabove, reproduces the first driver portion of FIG. 4 in simplified form, to enable a better understanding of identified problems;

FIG. 7, as mentioned hereinabove, indicates that the inventors have considered driving the gates of the output switches with NMOS data-controlled switches rather than CMOS switches;

FIG. 8 is a schematic diagram presenting a differential switching circuit which embodies the present invention;

FIG. 9 presents an example 16 GHz, 4-phase clock signal;

Figure 8:
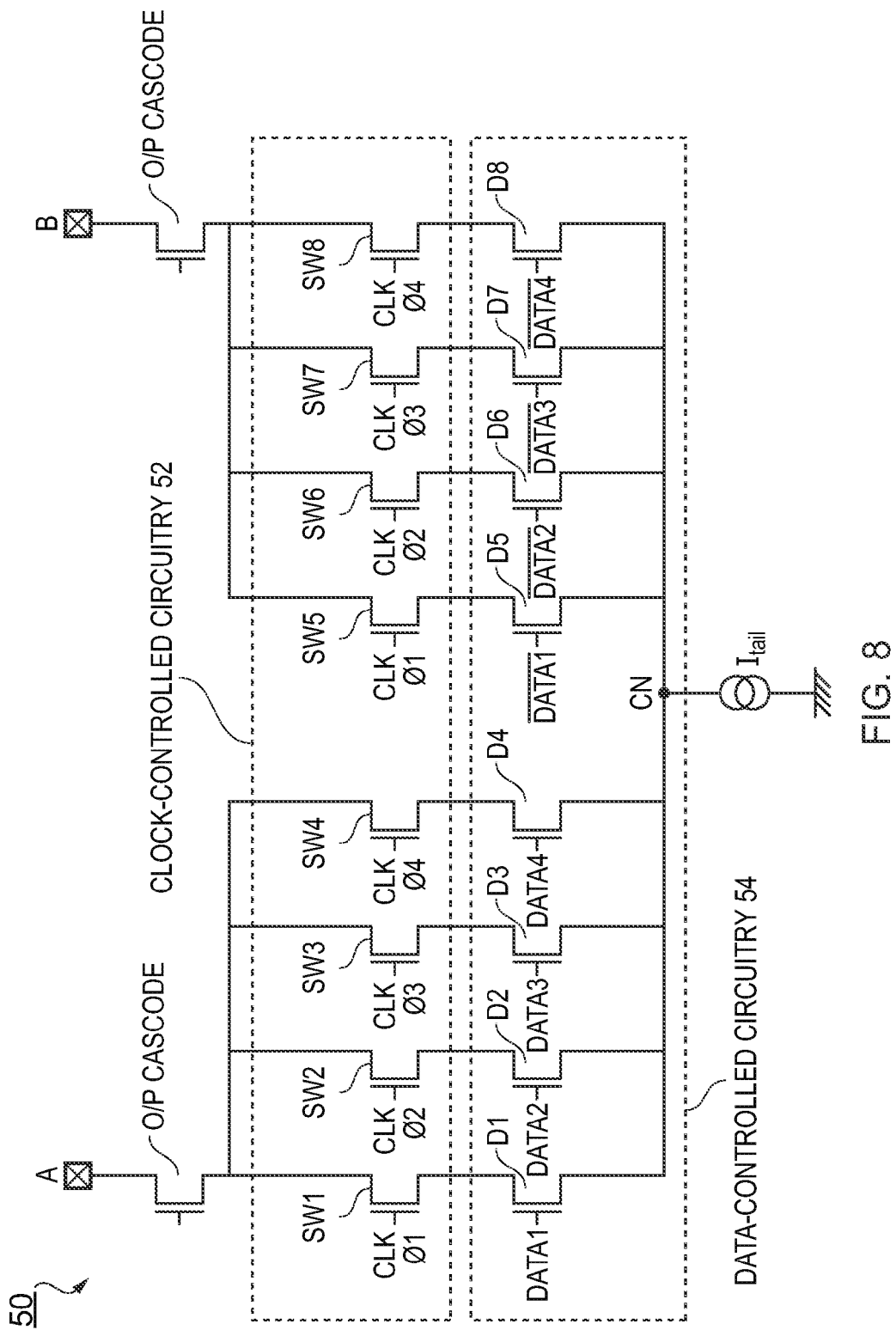
Figure 14:
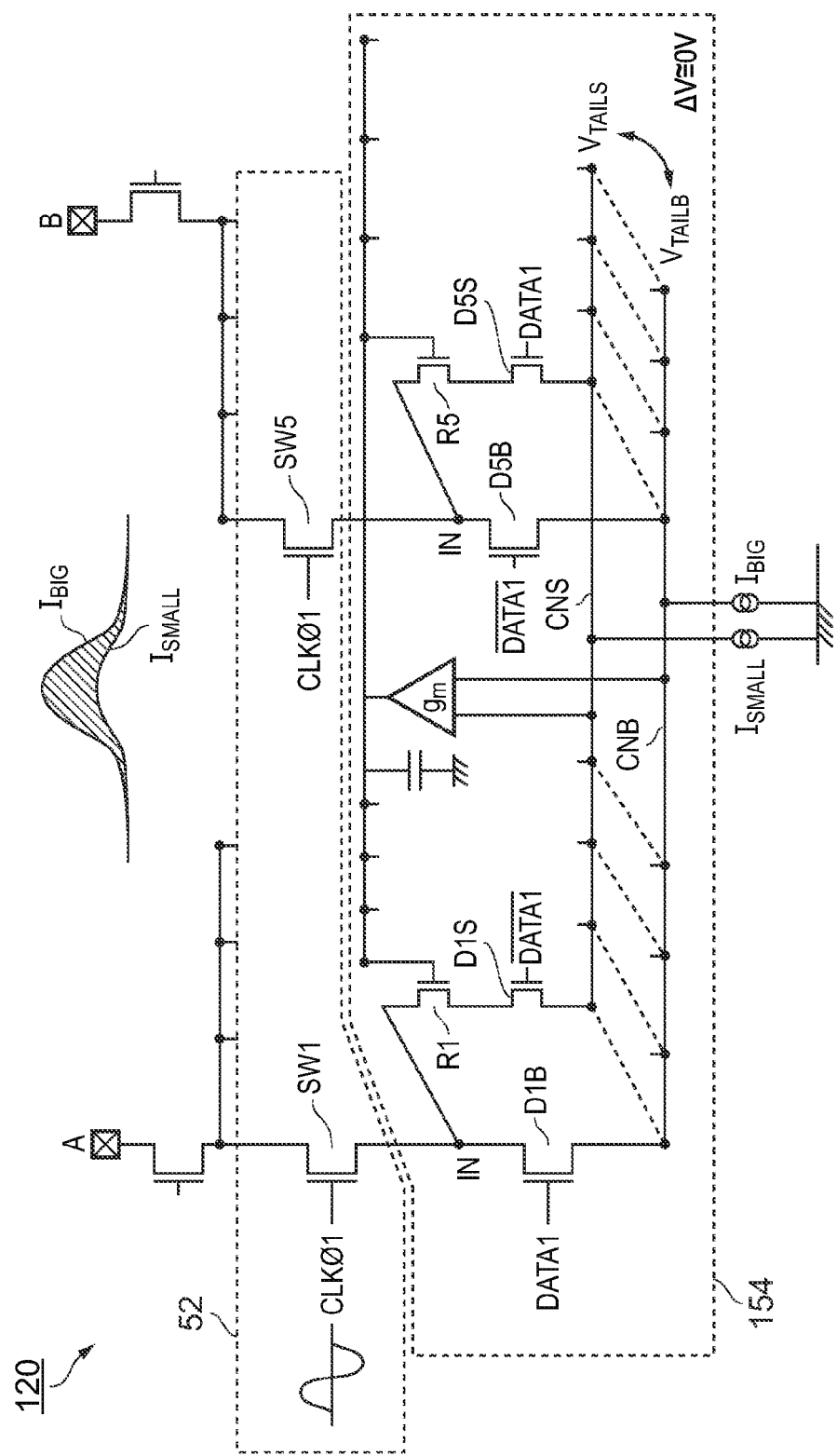
FIG. 14 is a schematic diagram presenting (in reduced form) a differential switching circuit which embodies the present invention.
Figure 15A:
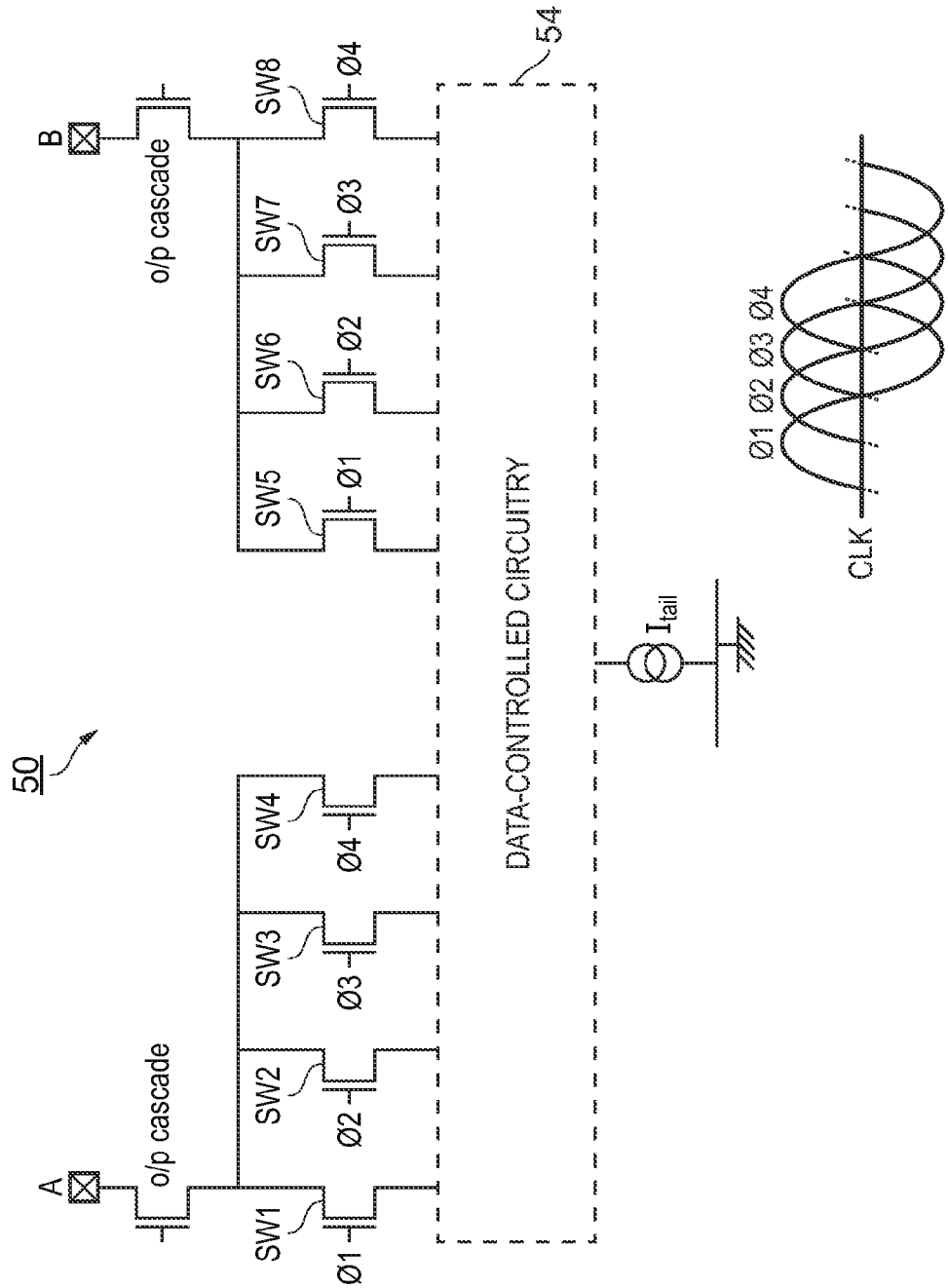
Figure 15B:
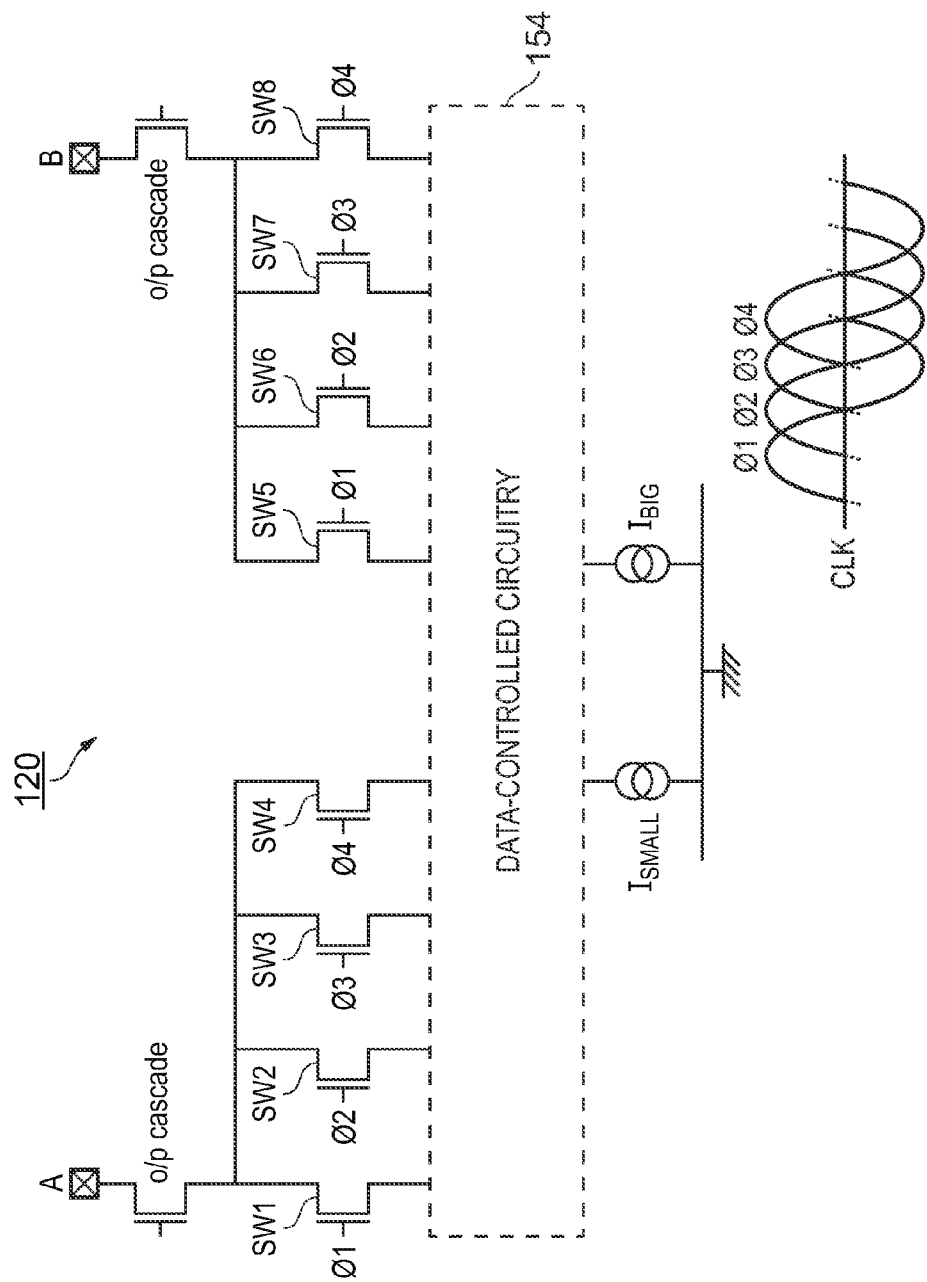
Figure 19:
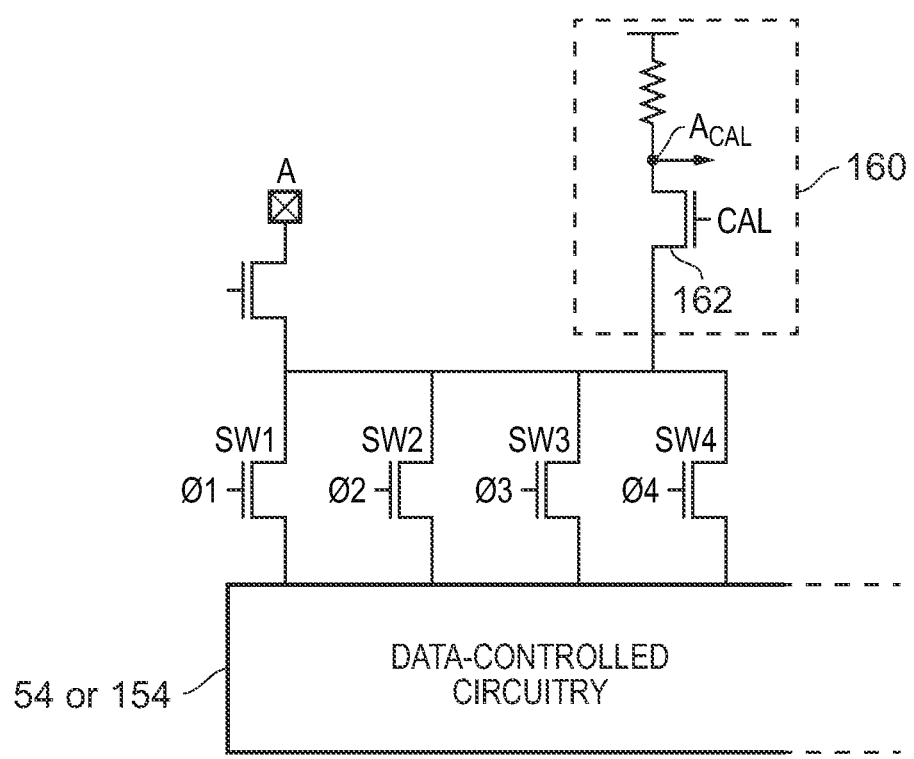
Figure 21A:
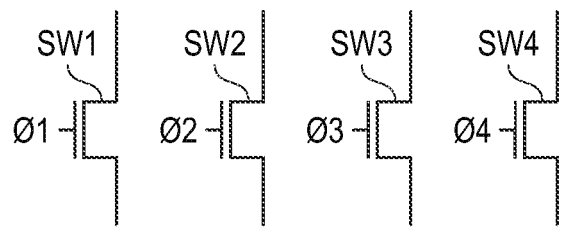
Figure 21B:
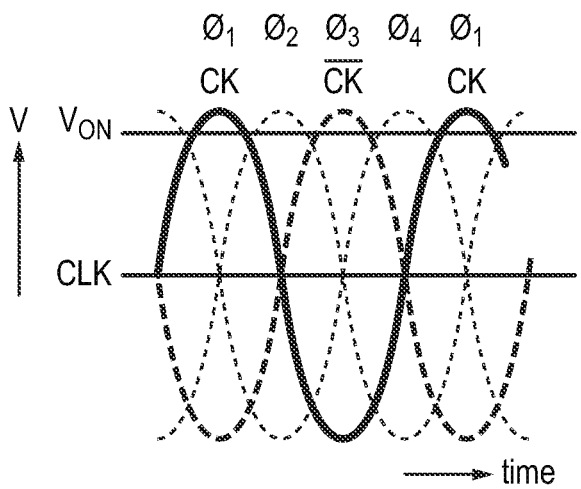
Figure 21C:
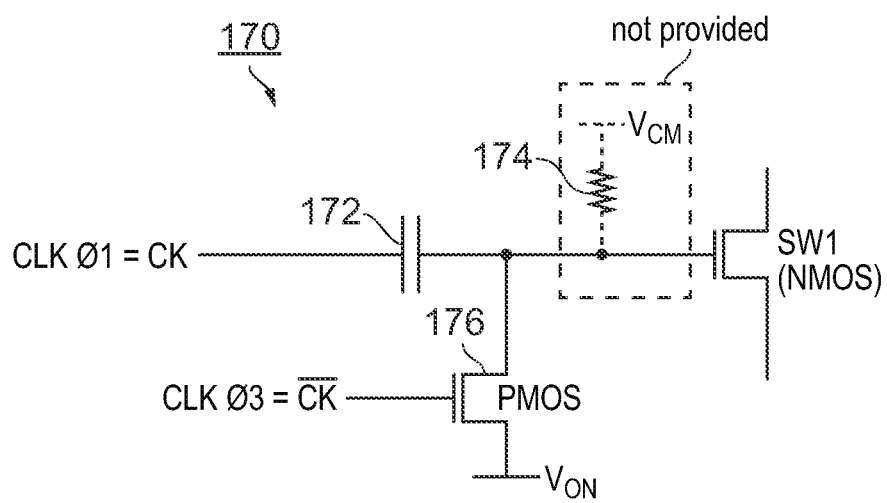
Figure 22:
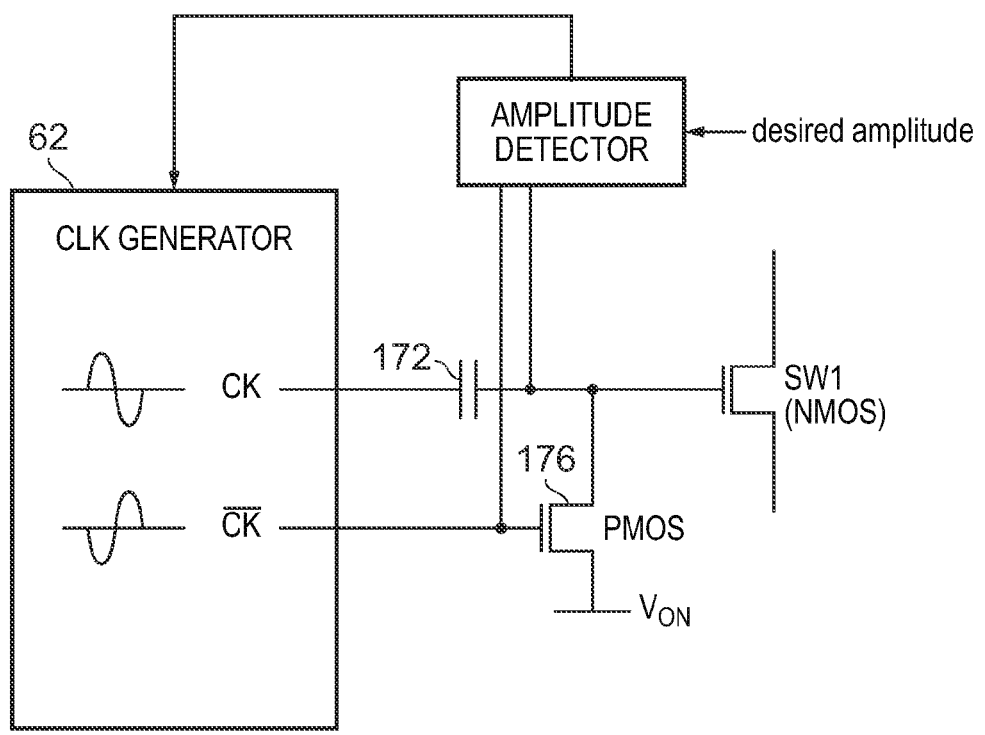
Figure 23:
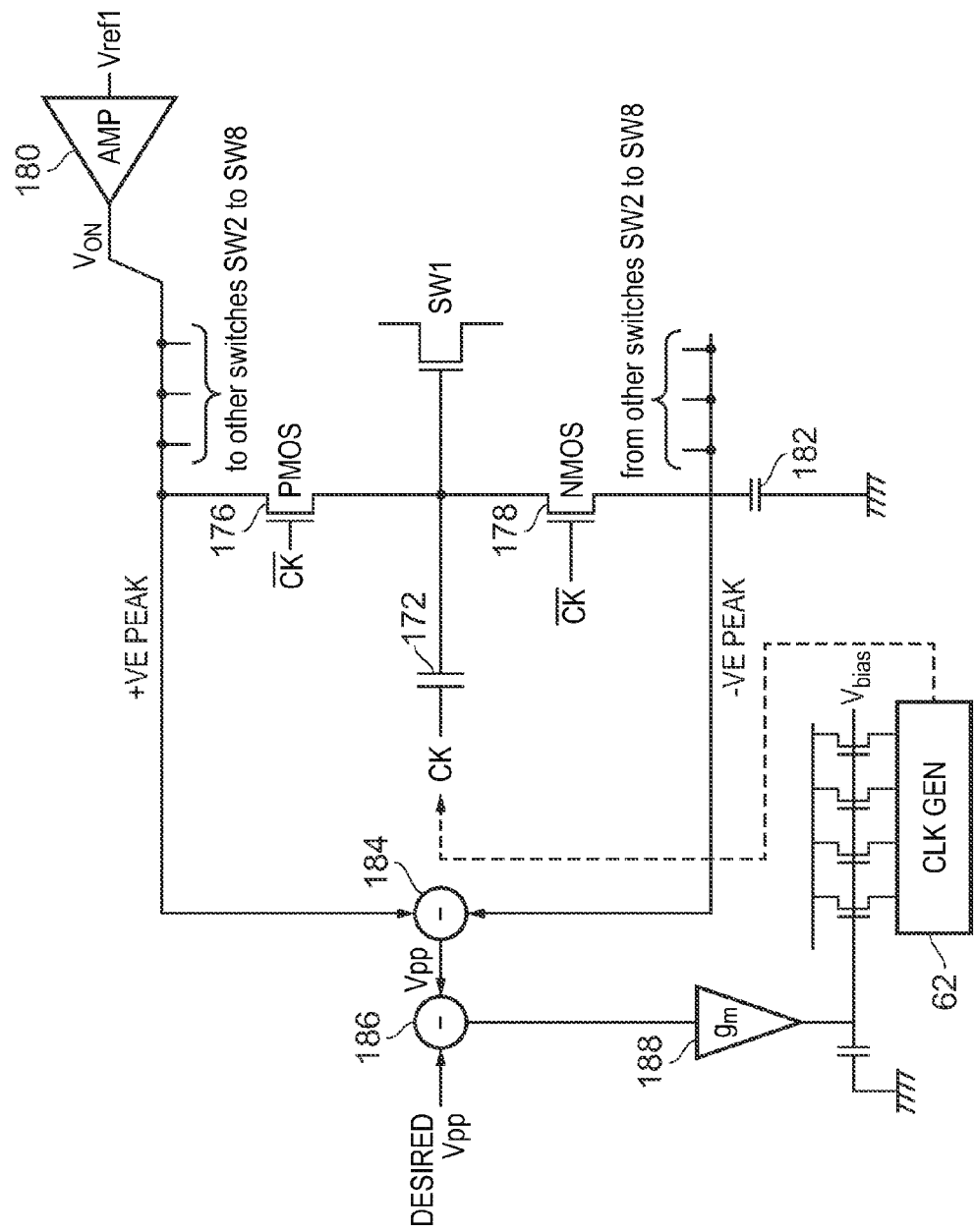
Figure 24:
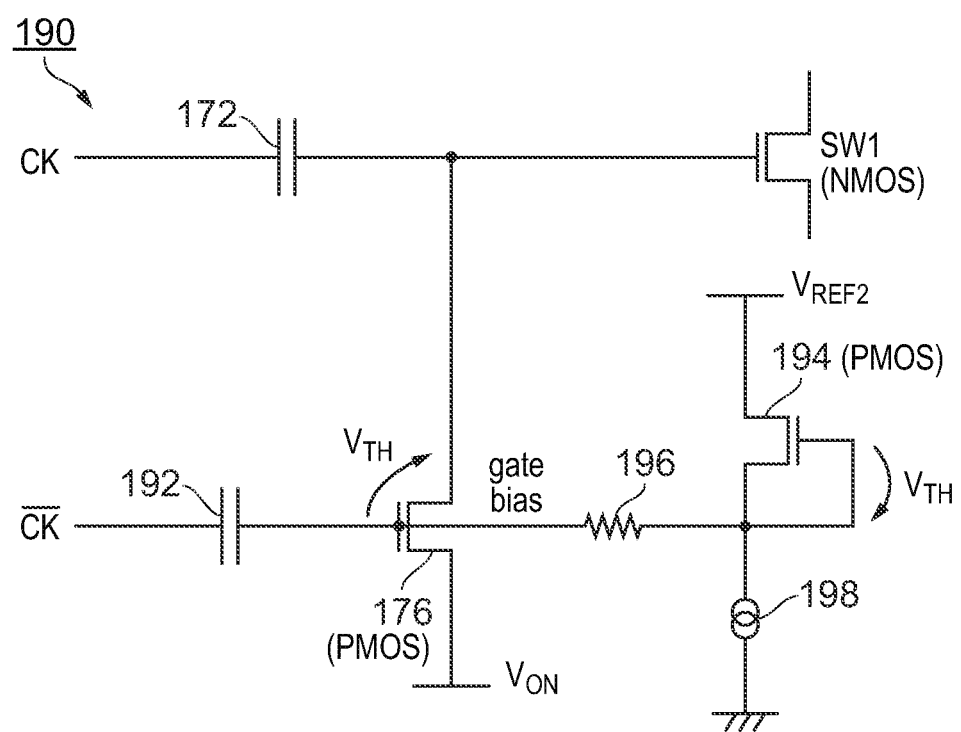
Figure 25:
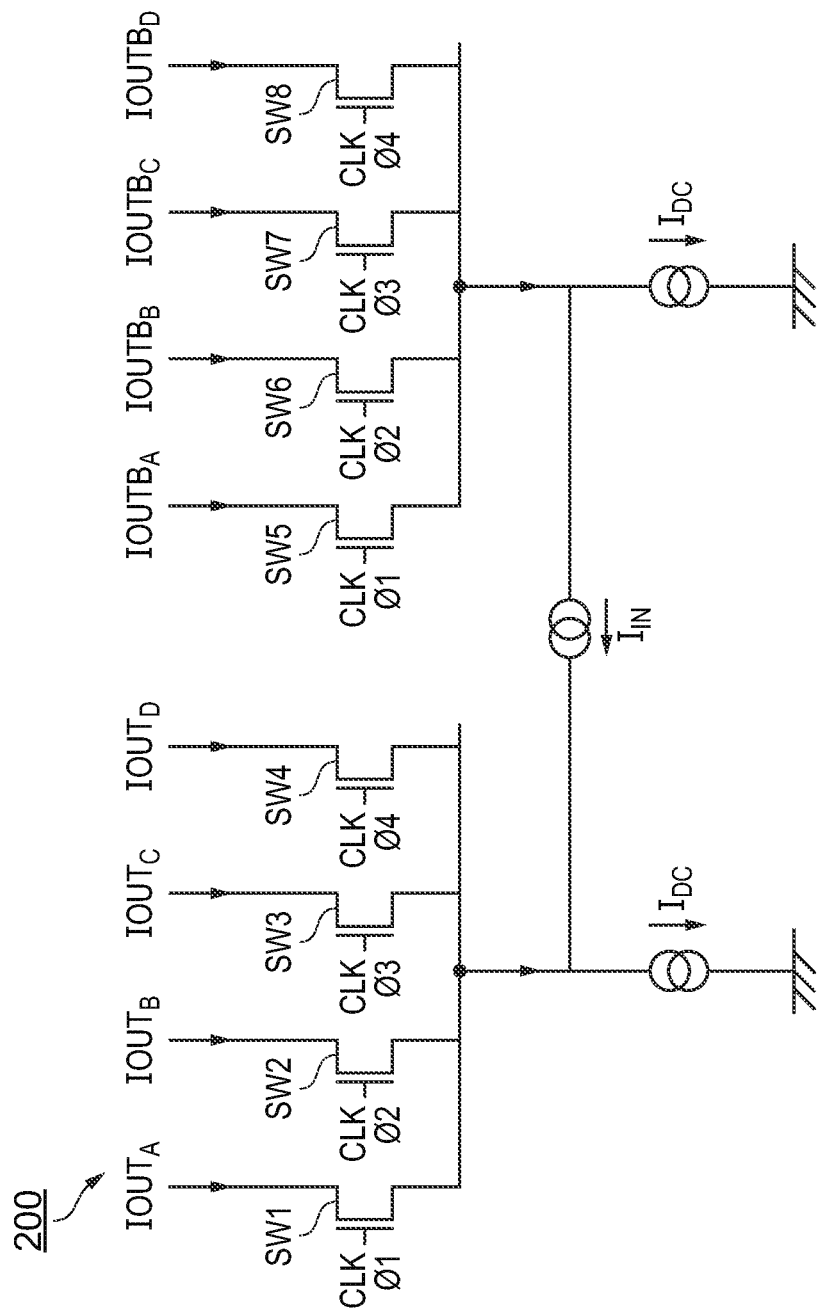
Figure 26:
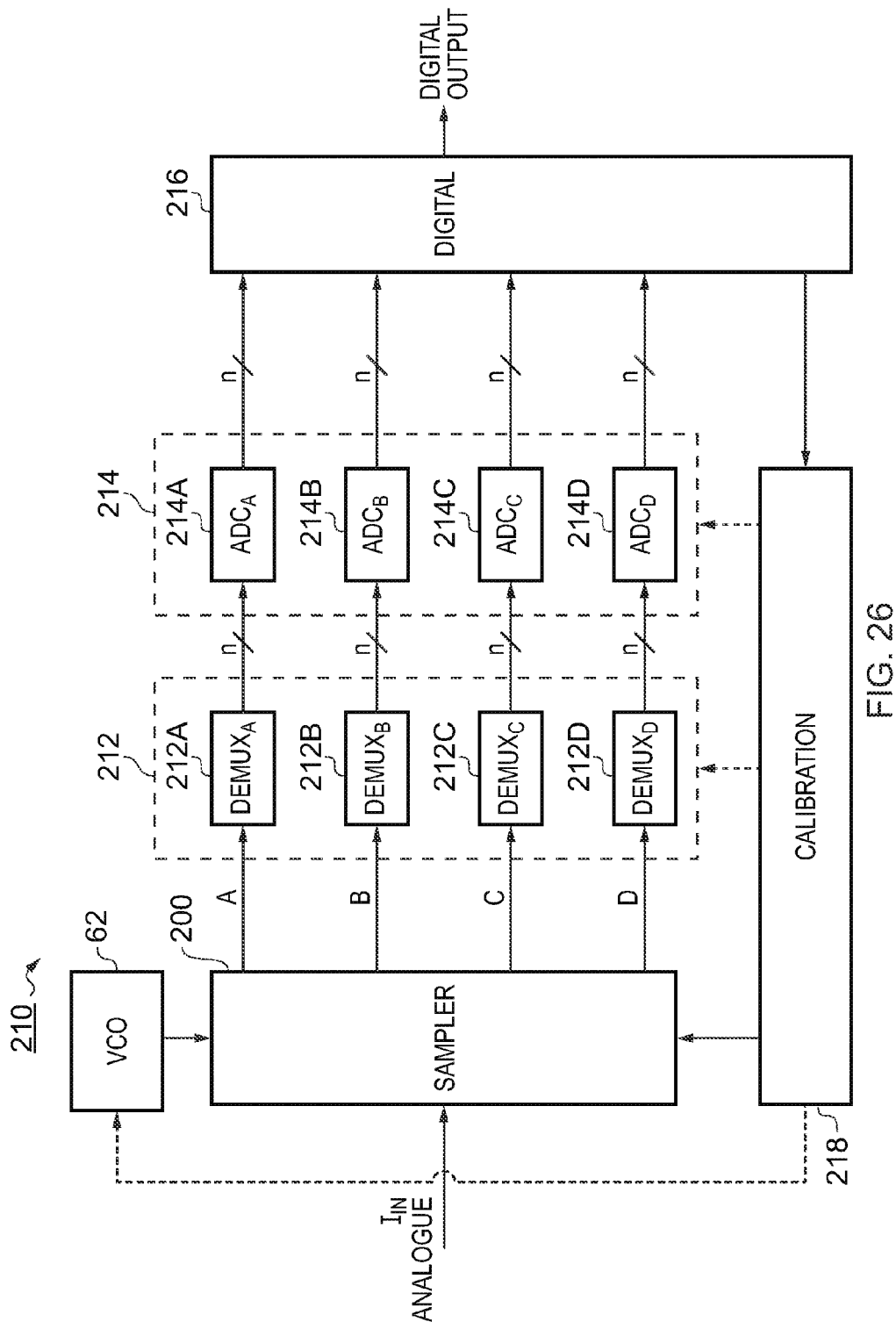
Figure 27:
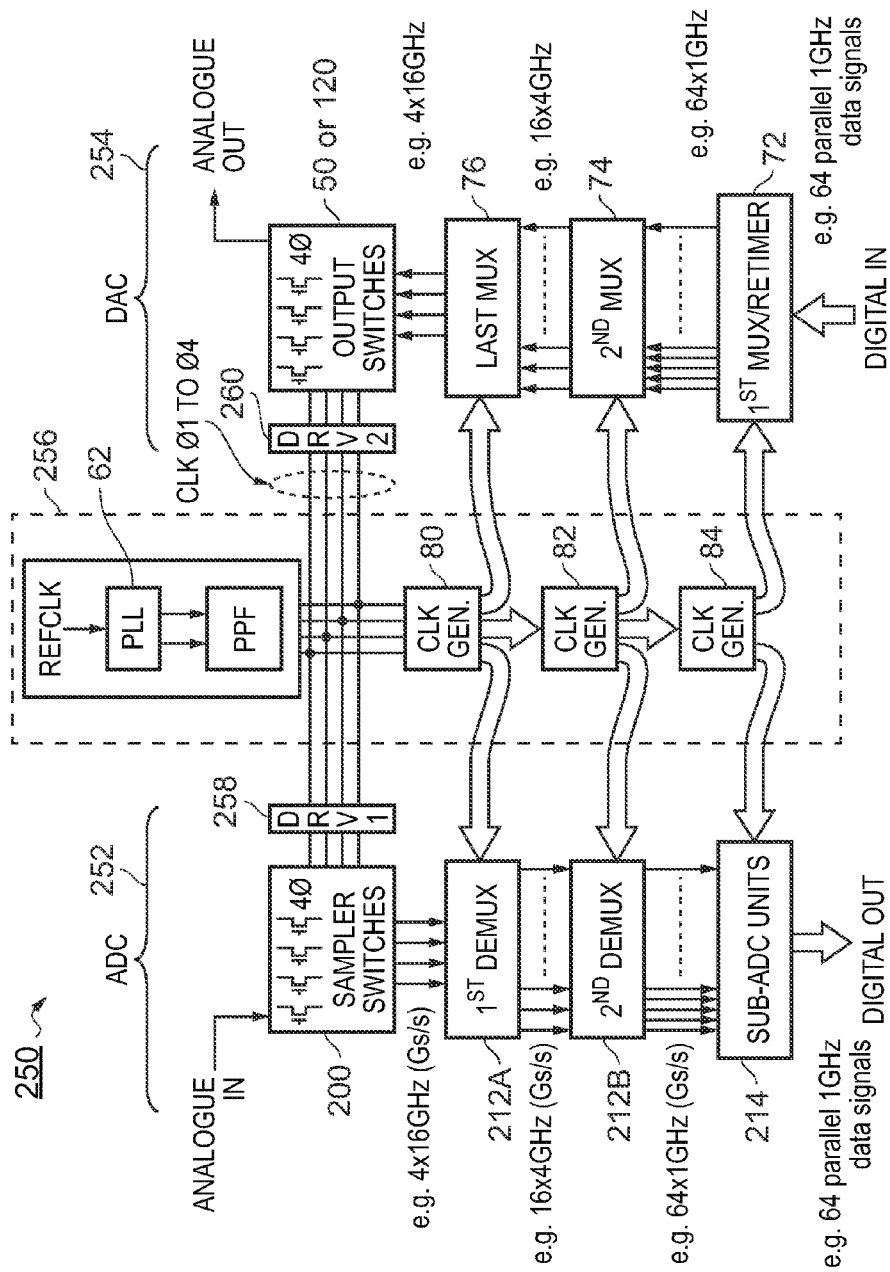
Figure 28A:
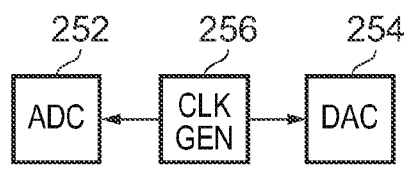
Figure 28B:
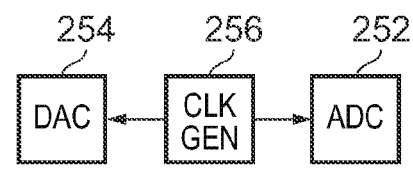
Figure 28C:
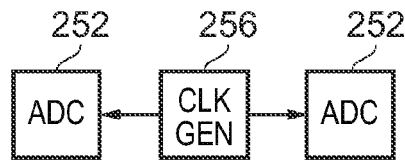
Figure 28D:
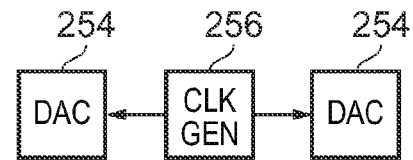
Figure 29:
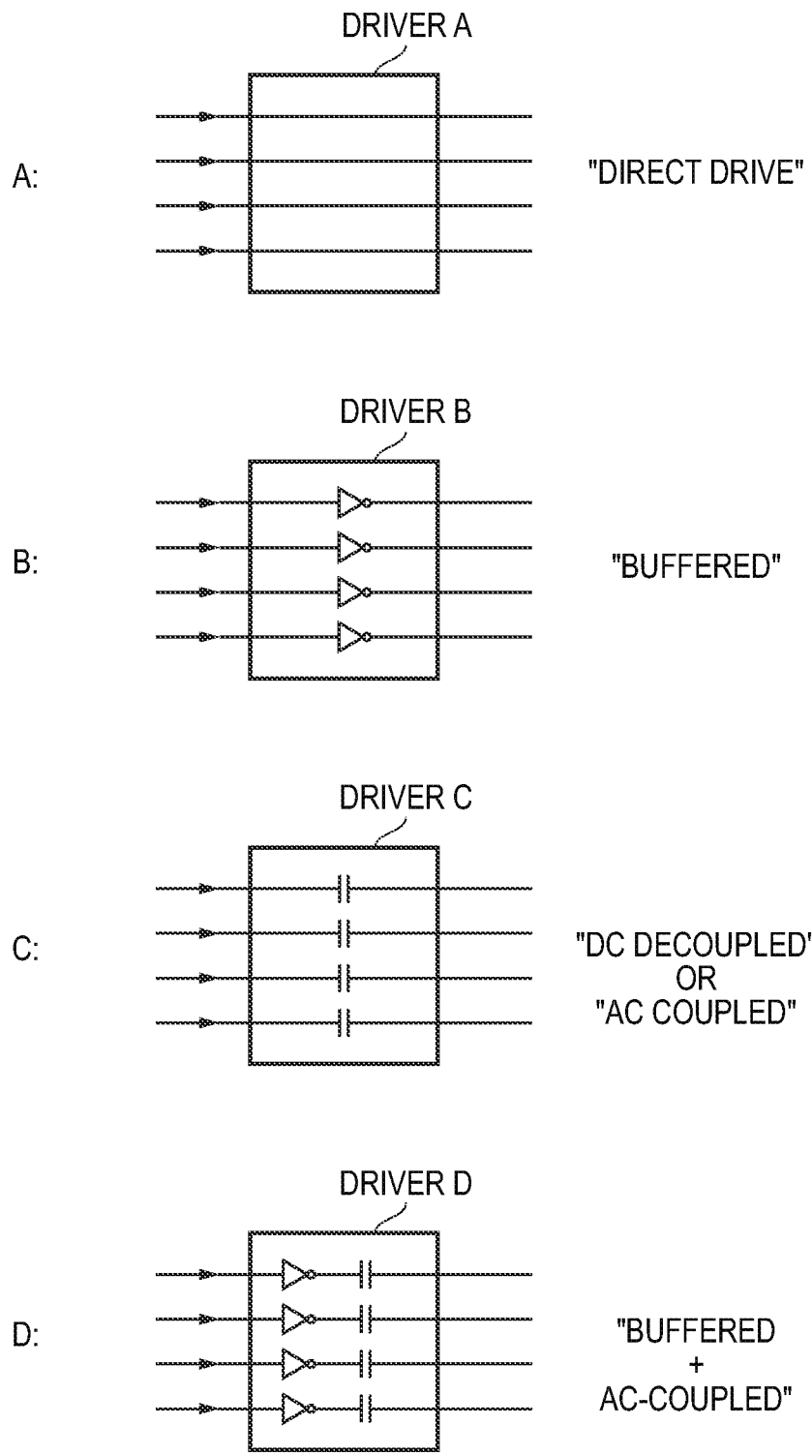

FIG. 15A presents a simplified schematic version of the FIG. 8 switching circuit;

FIG. 15B presents a simplified schematic version of the FIG. 14 switching circuit;

FIG. 16 presents a table useful for understanding operation of the FIG. 14 circuitry;

FIG. 17 presents a table detailing five example input data waveforms numbered 1 to 5;

FIG. 18 presents a table detailing five example input data waveforms numbered 6 to 10;

FIG. 19 is a schematic diagram indicating that it would be possible to provide dummy (duplicate) nodes $A_{CAL}$ and $B_{CAL}$ which are not true output nodes but instead internal nodes used for calibration;

FIGS. 20($a$) and 20($b$) show waveforms for the clock signals CLK $\phi_1$ to $\phi_4$, to indicate that such clock signals in practice have amplitude/common-mode errors and that the inventors have considered aligning the upper portions of those signals;

FIG. 21($a$) presents the four switches SW1 to SW4, FIG. 21($b$) presents clock signals CLK $\phi_1$ to $\phi_4$, and FIG. 21($c$) indicates schematically how such clock signals may be controlled to control such switches;

FIG. 22 is a schematic diagram based on FIG. 21($c$), but adapted to indicate schematically that Amplitude Level Control (ALC) may be performed;

FIG. 23 presents an expanded version of the FIG. 21($c$) circuitry, to indicate schematically how such ALC might be carried out in practice and to indicate that two techniques may be employed together;

FIG. 24 presents a refinement of the circuitry shown in FIG. 21($c$);

FIG. 25 is a schematic diagram presenting example sampling circuitry 200 for use in an analogue-to-digital converter (ADC);

FIG. 26 is a schematic diagram of analogue-to-digital circuitry which comprises a sampler corresponding to the sampling circuitry shown in FIG. 25;

FIG. 27 is a schematic diagram presenting parts of combined DAC and ADC circuitry;

FIG. 28 is a schematic diagram indicating that the same clock generation and distribution circuitry may be employed for different combinations of DAC and ADC circuitry;

FIG. 29 presents four example driver configurations, labelled A to D, for use in understanding FIGS. 27 and 28; and FIG. 30 presents a table, detailing possible combinations for Drivers A to D.

FIG. 8 shows a differential switching circuit 50, which embodies the present invention.

Figure 3:
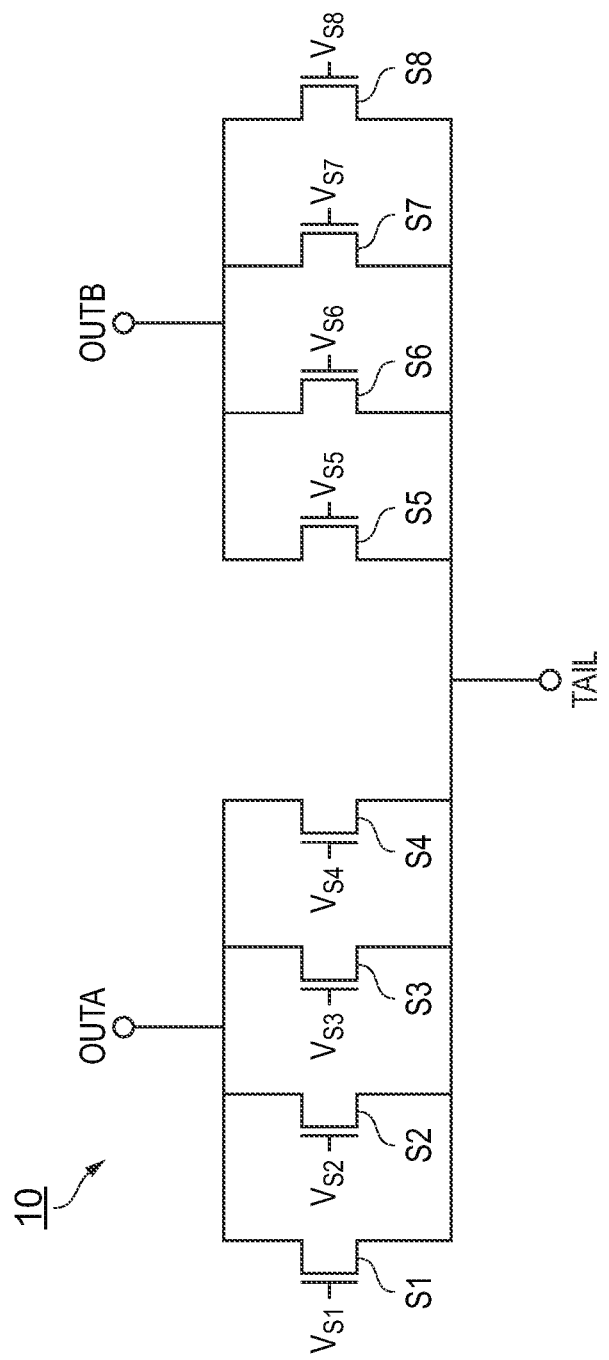

As for differential switching circuit 10 shown in FIG. 3, the circuitry comprises a common node CN (or tail node) to which a current source (or, once and for all, sink) is connected. Four transistors SW1 to SW4 are shown connected in parallel between the common node CN and a first output node A. Similarly, four transistors SW5 to SW8 are shown connected in parallel between the common node CN and a second output node B. These transistors SW1 to SW8 will be referred to as output switches hereafter, and correspond respectively to output switches S1 to S8 in FIG. 3. However, as will become apparent, there are significant differences between the differential switching circuit 50 and the differential switching circuit 10.

In FIG. 8, the gates of the output switches SW1 to SW8 are driven directly by way of clock signals (which do not pass via data-controlled switches), although a buffer or decoupling capacitor may be provided along the clock paths to the gates (not shown). Importantly, the gates of those output switches are not driven by data-dependent signals in the way that output switches S1 to S8 in FIGS. 3 and 4 are.

Instead, data-controlled switches D1 to D8 are provided away from the gate side of the output switches SW1 to SW8 and instead in the current path. That is, as can be seen in FIG. 8, data-controlled switches D1 to D8 are provided in series connection with the output switches SW1 to SW8, respectively, enabling the clock signals to drive the transistor gates directly.

This presents a significant advantage, as it moves the data-controlled switches away from the voltage-mode portion of the circuitry (i.e. controlling the gates of the output switches) to the current-mode portion, where they simply carry currents. It is advantageous to drive the gates of the output switches directly with clock signals as better control can be had of the signals which arrive at those gates, with fewer distortion sources (such as switched transistors) in the clock paths. It is to be recalled that the inventors identified the data-controlled switches in FIG. 4 as distortion contributors.

Looking at FIG. 8, each output switch SW1 to SW8 effectively becomes one of a pair of series-connected switches (in this case, field-effect transistors). These switches may be implemented as NMOS field-effect transistors. The pairs including SW1 to SW4 are provided in parallel branches, and similarly the pairs including SW5 to SW8 are provided in parallel branches.

Figure 9:
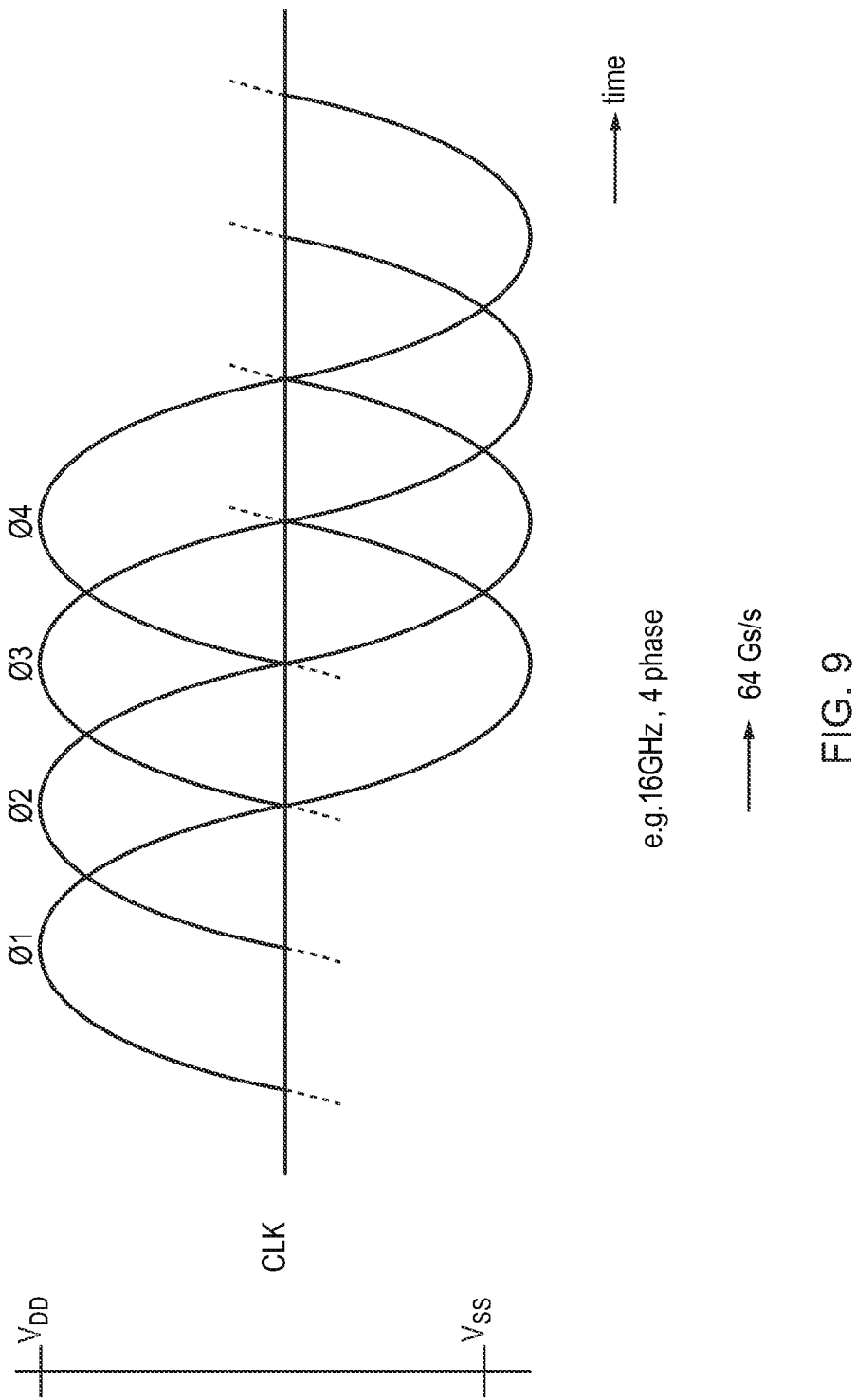

Another significant difference between FIG. 8 and FIGS. 3 and 4 is that the clock signals CLK φ1 to CLK φ4 supplied to the output switches SW1 to SW8 are respective phases of a four-phase clock signal, as shown in FIG. 9. Clock signals CLK φ1 to CLK φ4 therefore correspond respectively to the first to fourth phases of a repeating series of four phases. Moreover, the clock signals are substantially sinusoidal. Effectively, four time-interleaved sinusoidal clock signals are provided.

The overall operation of the FIG. 8 circuitry is somewhat similar to that in FIGS. 3 and 4, in that the output switches SW1 to SW8 and the data-controlled switches D1 to D8 are driven so as, in use, to steer current from the current source through the first output node A or the second output node B in dependence upon the value (digital 0 or 1) of the data signals DATA1 to DATA4.

In order to achieve this, output switches SW1 and SW5 are provided with clock signal CLK φ1, SW2 and SW6 are provided with clock signal CLK φ2, SW3 and SW7 are provided with clock signal CLK φ3, and SW4 and SW8 are provided with clock signal CLK φ4. Moreover, data-controlled switches D1 and D5 are respectively provided with data signals DATA 1 and $\overline{\text{DATA1}}$, D2 and D6 are respectively provided with DATA 2 and $\overline{\text{DATA2}}$, D3 and D7 are respectively provided with DATA 3 and $\overline{\text{DATA3}}$, and D4 and D8 are respectively provided with DATA 4 and $\overline{\text{DATA4}}$.

The effect of the 4-phase clock signal is that either output switch SW1 or SW5 is switched on in a first clock cycle or phase (φ1), dependent on the value of the data signal DATA 1. Similarly, dependent on data, SW2 or SW6 switches on in a second clock cycle or phase (φ2), SW3 or SW7 switches on in a third clock cycle or phase (φ3) and SW4 or SW8 switches on in a fourth clock cycle or phase (φ4). The output switches in FIG. 8 are NMOS transistors, and as such turn on in the +ve peak portions of the relevant clock signals.

Accordingly, for each clock cycle, if the value of the data signal concerned is 1 the current $I_{TAIL}$ is steered through node A and if it is zero through node B. Moreover, as before, in each cycle one series-connected transistor pair turns on and one turns off, irrespective of the data. In each cycle, two output-switch transistors turn on and two turn off, irrespective of the data.

Given the example 16 GHz, 4-phase clock signal depicted in FIG. 9, this operation leads to an overall sample rate of 64 Gs/s, which is significantly faster than the example sample rate of 12 Gs/s mentioned in connection with FIG. 3.

Output nodes A and B are connected to the output switches via respective output cascodes as indicated in FIG. 8. A differential output signal of the switching circuitry may thus be measured between the two output terminals, as a current signal or as a voltage signal by way of terminating resistors (not shown in FIG. 8, but understood by reference to FIG. 1).

Looking at each pair of series-connected switches in FIG. 8 as a single unit, in any particular cycle or state 1 is on and 7 are off. Looking at the upper switches (the output switches) of each pair, in any state 2 are on and 6 are off. Looking at the lower switches (the data-controlled switches) of each pair, in any state (ignoring transitional changes of the data values, which in an ideal case would be instantaneous) 4 are on and 4 are off.

Moreover, looking at each pair as a single unit, from one cycle to the next 1 turns on and 1 turns off. Looking at the upper switches (the output switches) of each pair, from one cycle to the next 2 turn on and 2 turn off. Looking at the lower switches (the data-controlled switches) of each pair, from one cycle to the next either the same number turn on as turn off (if the data changes) or the switches retain their states (if the data stays the same).

Looking further at FIG. 8, the circuitry portion comprising output switches SW1 to SW8 may be referred to as clock-controlled circuitry 52, and the circuitry portion comprising data-controlled switches D1 to D8 may be referred to as data-controlled circuitry 54. It will be appreciated that the switches in the clock-controlled circuitry 52 are controlled by clock signals and not by data signals, and as such they may be considered data-independent. Conversely, the switches in the data-controlled circuitry 54 are controlled by data signals and not by clock signals, and as such they may be considered clock-independent. For example, the clock signals CLK φ1 to CLK φ4 may be supplied continuously (i.e. during active operation) to the clock-controlled circuitry 52 and specifically to the gates of the output switches SW1 to SW8, which is not the case in FIGS. 3 and 4 (given the intervening data-controlled switches).

Incidentally, another difference between the FIG. 8 circuitry and that of FIGS. 3 and 4 is that the data signals are supplied directly to the gates of the data-controlled switches D1 to D8, albeit perhaps via a buffer or decoupling capacitor (not shown). That is, the mask signals MASK1 to MASK4 employed in FIG. 4 are not required in connection with the FIG. 8 circuitry, given that the four-phase clock signal (comprising CLK φ1 to CLK φ4) is employed. This leads to an advantageous reduction in the required circuitry.

Figure 10:
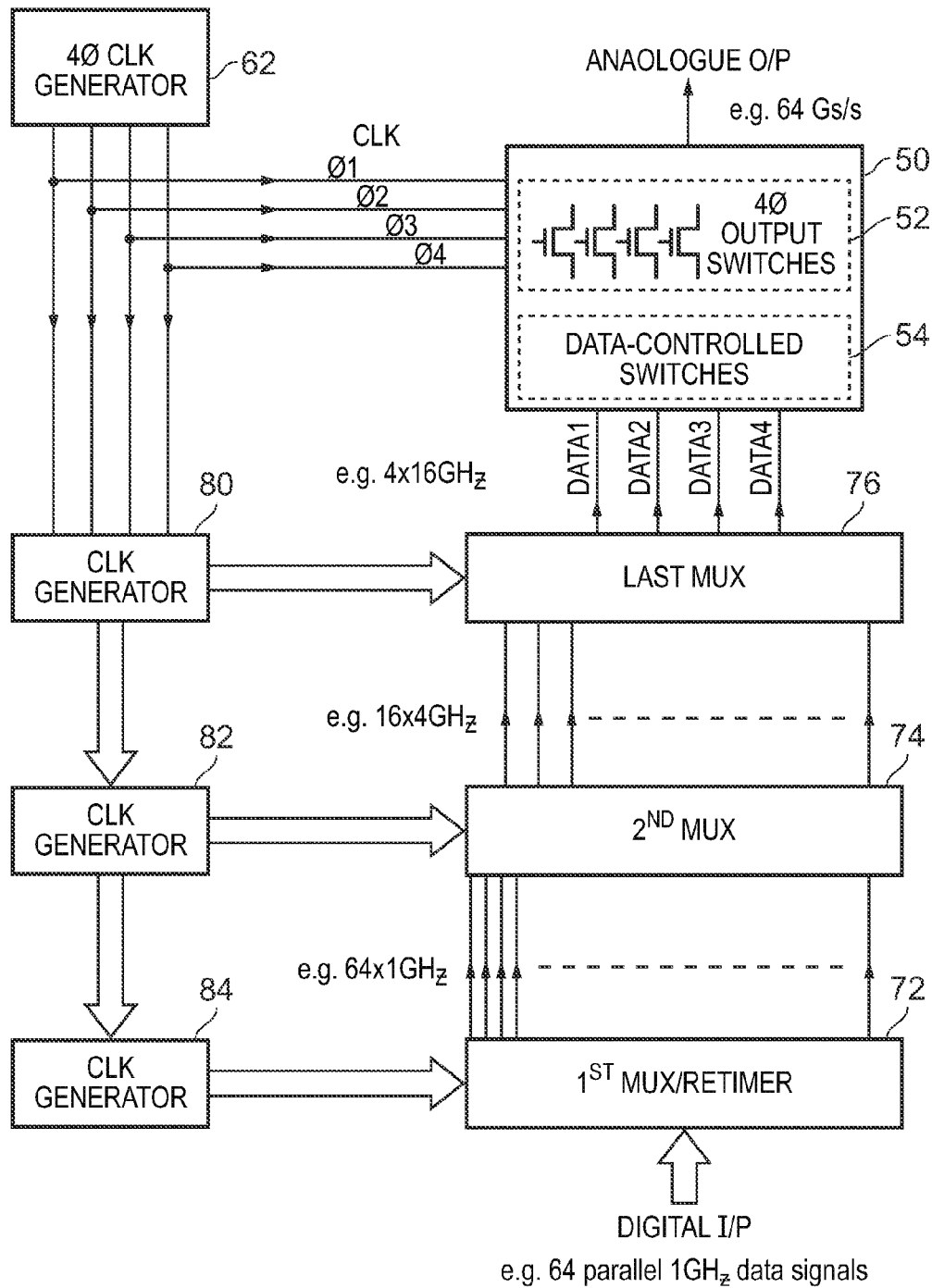
FIG. 10 is a schematic diagram presenting parts of a DAC comprising the differential switching circuit of FIG. 8.

To provide some context, FIG. 10 shows parts of a DAC 60 comprising the differential switching circuit 50. The differential switching circuitry 50 is shown schematically in the upper-right corner, comprising the clock-controlled circuitry 52 and the data-controlled circuitry 54. Also shown is a clock generator 62 configured to generate the clock signals CLK φ1 to CLK φ4 and supply them to the differential switching circuit 50.

It is incidentally noted that FIG. 8 represents differential switching circuitry 50, in which differential input data signals are employed (i.e. employing four sampling switches SW1 to SW4, and a complementary set SW5 to SW8). For simplicity, FIG. 10 is presented with single-ended input data signals (or with only one half of corresponding differential signals shown). FIG. 10 may be interpreted to apply to differential switching circuitry 50, with the input data signals being differential signals, and with SW1 to SW8 being employed as in FIG. 8.

As a running example, a desired DAC sample rate of 64 Gs/s is assumed, and the data signals DATA 1 to DATA 4 input to the differential switching circuit 50 are 16 GHz (i.e. time-interleaved) data signals.

Three stages of multiplexing/retiming 72, 74 and 76 are also shown by way of example, in order to input at the first multiplexer/retiming circuit 72 a parallel set of 64 1 GHz data signals if retiming is carried out (or e.g. 128 500 MHz data signals if multiplexing is carried out), and output 64 1 GHz data signals to the second multiplexer 74, which in turn outputs 16 4 GHz signals to the third and last multiplexer 76, which in turn outputs the data signals DATA 1 to DATA 4 as 4 16 GHz signals as above. For simplicity, although unit 72 may carry out retiming or multiplexing, it will be referred to as a multiplexer below.

Also shown are three stages of clock generation 80, 82, 84, in order to take the input clock signals CLK φ1 to CLK φ4 and generate in turn the clock signals required by the three stages of multiplexing 72, 74 and 76, as indicated in FIG. 10.

Figure 1:
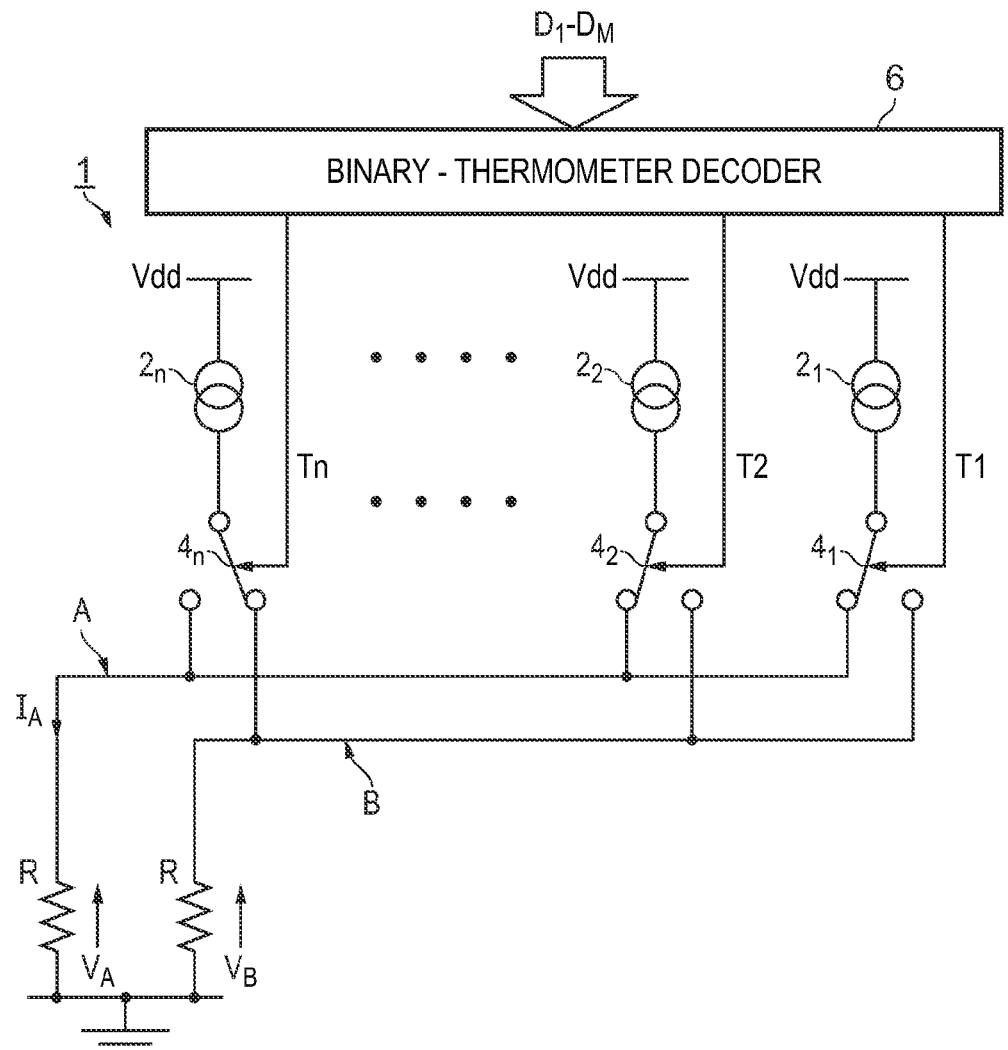

It is to be remembered that the differential switching circuit 50 is representative of a single segment or "slice" in the overall DAC, for example by looking back to FIG. 1. Thus, any coding (e.g. thermometer-coding) of an ultimate input digital signal is assumed to have occurred upstream of the digital signals input in FIG. 10, such that those input digital signals input are only those intended for the segment or slice shown.

The overall DAC would have further slices or segments, each with their own stages of multiplexing 72, 74 and 76. Of course, the clock generation circuitry 62, 80, 82 and 84 may be shared between the segments (or separately provided, at least in part).

The analogue outputs of the various slices or segments may be combined to create a single analogue output of the overall DAC, for example in a similar manner as to in FIG. 1. In another example, seven segments could be provided to produce the outputs for the 3 MSBs of an 8-bit DAC (with thermometer-encoding), and five segments (in which their outputs are binary weighted) could be provided to produce the outputs for the 5 LSBs. Other variations would of course be possible. For example, an impedance ladder could be employed, as disclosed in EP-A1-2019490.

Figure 11:
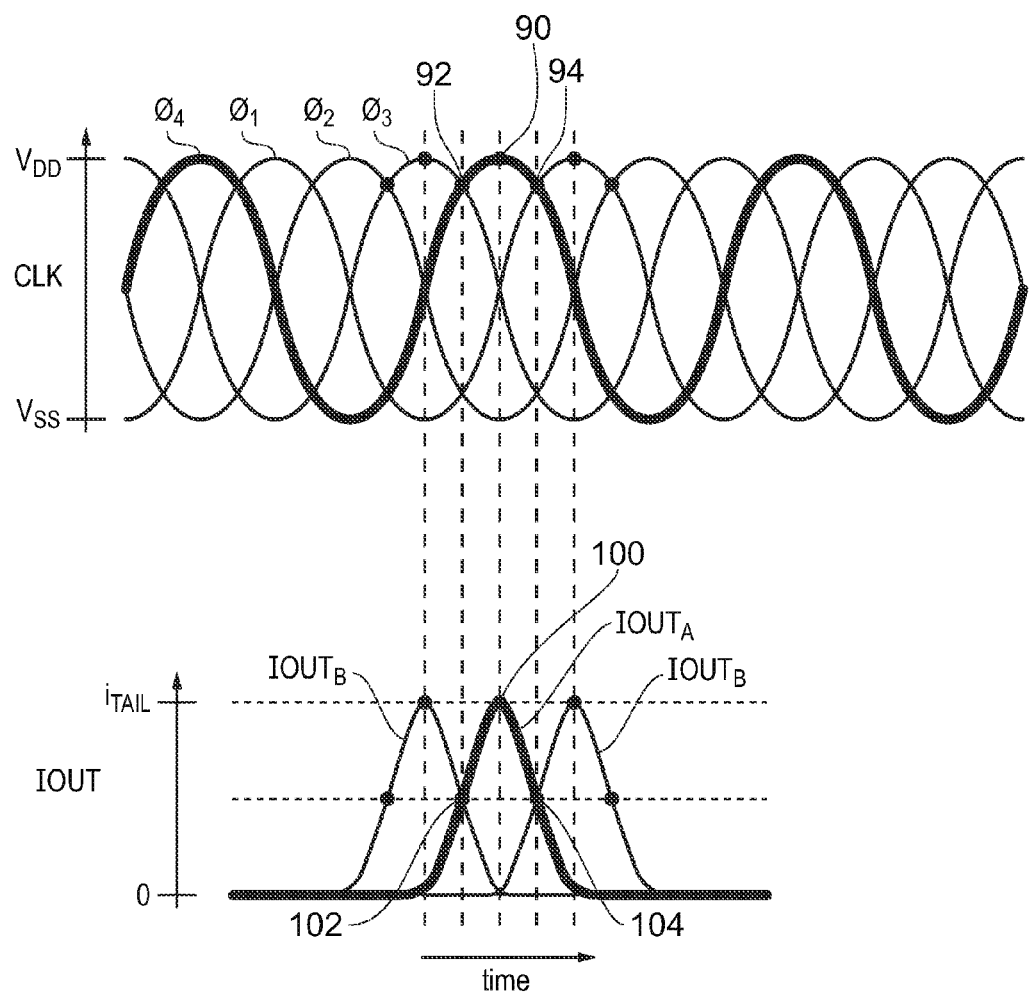
FIG. 11 shows waveforms for the clock signals CLK $\phi_1$ to $\phi_4$ in its upper graph, and partial waveforms for currents received at output nodes A and B of the FIG. 8 circuit in its lower graph.

FIG. 11 shows more waveforms for the clock signals CLK $\phi_1$ to $\phi_4$ in the upper graph, and partial waveforms for the currents received at output nodes A and B, labelled as $IOUT_A$ and $IOUT_B$, in the lower graph, for use in better understanding the operation of differential switching circuit 50 of FIG. 8.

As mentioned above, clock signals CLK $\phi_1$ to $\phi_4$ are time-interleaved raised (substantially) cosine waveforms and are 90° out of phase with one another. The clock signals shown are sinusoidal, but need not be strictly-perfect sinusoids. As will become apparent, in the present embodiment the shape of the waveforms is more important in the uppermost part than towards the bottom.

As an aside, the number of clock signals shown in FIGS. 9 and 11 is related to the number of parallel paths to each of nodes A and B in FIG. 8. Since there are four parallel paths to each of nodes A and B in FIG. 8, four time-interleaved clock signals are provided, 90° out of phase with one another. It is envisaged that where X parallel paths to each of nodes A and B are provided, X time-interleaved clock signals may be provided, (360/X)° out of phase with one another. In this case, X is an integer greater than or equal to 2, and preferably greater than or equal to 3, and more preferably equal to 4.

Returning to FIG. 11, for the benefit of further explanation clock signal $\phi_4$ is highlighted in bold.

Figure 2:
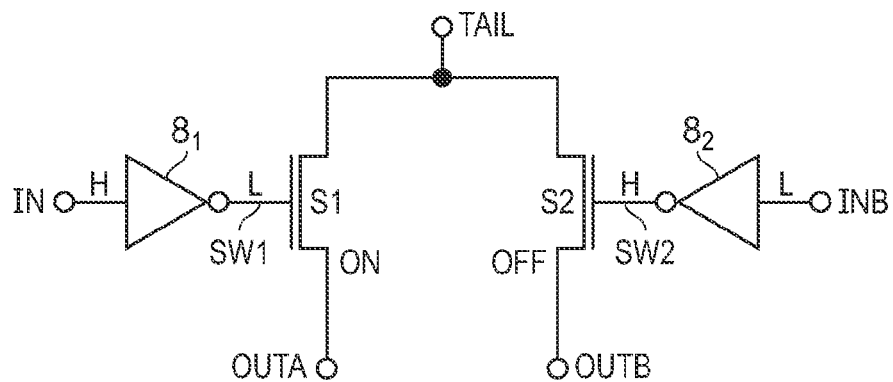

Clock signals CLK $\phi_1$ to $\phi_4$ control the gates of output switches SW1 to SW8, as already described in connection with FIG. 2. Accordingly, the output-switch pairs (where the pairs are SW1/SW5, SW2/SW6, SW3/SW7, SW4/SW8) are turned on and then off in sequence, such that as one of them is turning off the next in sequence is turning on, and such that when one of them is turned fully on the others are substantially turned off. As mentioned before, which switch of such an output-switch pair carries a current pulse when the pair is turned on is dependent on the data signal (of DATA 1 to DATA 4) concerned.

Because substantially all current passing through the common node via switches SW1 to SW8 must equal current $I_{TAIL}$, then the sum of currents flowing through nodes A and B at any time must be substantially equal to $I_{TAIL}$. The effect of the data-controlled switches D1 to D8 mentioned above is therefore that current $I_{TAIL}$ is steered to pass through one switch from each output-switch pair in the sequence in which those output-switch pairs are turned on and off, i.e. such that as one of the output-switch pairs is turning off and thus one of its output switches starts to carry less of $I_{TAIL}$, the next output-switch pair in sequence is turning on and thus one of its output switches starts to carry more of $I_{TAIL}$, and such that when one of the output-switch pairs is turned fully on, one of its output switches carries substantially all of $I_{TAIL}$ because the other output switch of that pair has its series-connected data-controlled switch substantially turned off and because the output switches of the other output-switch pairs are substantially turned off.

This effect is shown in the lower graph of FIG. 11. Only three output currents for clocks CLK $\phi_3$, $\phi_4$ and $\phi_1$ are shown for simplicity, however the pattern of waveforms shown continues with the successive peaks being for $IOUT_A$ or $IOUT_B$ dependent on the data. In the present example, it is assumed that the data sequence is DATA 3=0 (such that the current passes to node B), DATA 4=1 (such that the current passes to node A), and DATA 1=0 (such that the current passes to node B). For comparison with the upper graph of clock signals, the waveform for the output current corresponding to clock signal $\phi_4$ is highlighted in bold.

In order to gain a better understanding of the lower graph in FIG. 11, three points, 90, 92 and 94 are indicated on waveform $\phi_4$ and a corresponding three points 100, 102 and 104 are indicated on the corresponding current waveform.

At point 90, waveform CLK $\phi_4$ is at its peak value, i.e. at $V_{DD}$, and the other clock signals CLK $\phi_1$ to $\phi_3$ are significantly below their peak value. Accordingly, (given DATA 4=1) switches SW4 and SW8 are fully on with D4 on and D8 off, and at least the other output switches (SW1 to SW3 and SW5 to SW7) are substantially off. Therefore, at the corresponding point 100, current $IOUT_A$ is equal to $I_{TAIL}$ and current $IOUT_B$ is substantially equal to zero.

At point 92, which precedes point 90, waveform $\phi_4$ is rising towards its peak value but has not yet reached its peak value. Also, at point 79, waveform $\phi_3$ is falling from its peak value. Importantly, at point 92 clock signals $\phi_3$ and $\phi_4$ have equal values. Therefore switches SW3 and SW4, and also SW7 and SW8, are on to the same extent as one another, because their source terminals are connected together. At point 92, clock signals $\phi_1$ and $\phi_2$ are also equal to one another and are sufficiently low to ensure that switches SW1 and SW2, and also SW5 and SW6, are off. Thus, at this point in time, half of current $I_{TAIL}$ flows through switches SW4 and D4 (given DATA 4=1) and half of it flows through switches SW7 and D7 (given DATA 3=0), as indicated by point 102, such that $IOUT_B=IOUT_A=(I_{TAIL})/2$.

Point 94 is equivalent to point 92, except that at this point it is switches SW4 and SW1, and also SW8 and SW5, that are on. Therefore, at corresponding point 104, $IOUT_A=IOUT_B=(I_{TAIL})/2$.

It will therefore be appreciated that the three points for each current waveform (e.g. points 100, 102 and 104 for current waveform $IOUT_A$ in FIG. 11) are fixed or defined in time relative to the clock waveforms and in magnitude relative to the current $I_{TAIL}$. That is, taking current $IOUT_A$ as an example, at point 100 the current is equal to $I_{TAIL}$ and at points 102 and 104 the current is equal to half ITAL. The location of points 100, 102 and 104 is fixed relative to the clock signals $\phi_1$ to $\phi_4$. The same is true for the subsequent current signal pulses or charge packets, which may be for $IOUT_A$ or $IOUT_B$ dependent on the data. The focus on points 90, 92 and 94 demonstrates that for the present embodiment the upper part of the clock signals is important, and that the lower parts are less important (such that, for example, the precise shape of the lower parts is not strictly critical). The significance of this point will become apparent later.

Thus, the series of current pulses of waveforms (for $IOUT_A$ or $IOUT_B$ dependent on the data) are all of the same shape, and that shape is defined by the positive peak of the sinewave clock signals.

This operation has considerable benefits.

Because the pulses all have the same raised-cosine shape, defined by the sinewave clock waveforms, the frequency response/roll-off is thereby defined mathematically by the cosine curve and as a result the analogue bandwidth from the input $I_{TAIL}$ to the output node A or B is very high, typically greater than 300 GHz. Furthermore, the voltage level at the tail node or common node CN in the circuitry does not fluctuate much during operation. By way of explanation, in FIG. 8 the switches SW1 to SW8 and D1 to D8 are NMOS switches, operated in the saturated region, with the source terminals of D1 to D8 tied together to form the tail node concerned. Thus, those switches operate as cascodes with a low input impedance and a high output impedance.

Because the voltage level at the tail nodes does not move much, those nodes may be considered to be virtual grounds, and have a reduced sensitivity to parasitic capacitances at those tail nodes. The circuitry of FIG. 8 is a fast analogue circuit carrying current pulses of a defined shape. The circuitry thus has a high bandwidth that is known, repeatable, accurate and constant. This known bandwidth may thus be compensated for with a filter, for example digitally (e.g. with an FIR filter on the input data).

Moreover, it is the actual current $I_{TAIL}$ that is steered or routed through the circuitry (without copying, for example by a current mirror). All of the current $I_{TAIL}$ passes via the output nodes. The direction of flow of conventional current may be from output to input, but the principles are the same for current flowing from input to output, and indeed the graphs of currents $IOUT_{A/B}$ are shown as positive values (with the direction of those currents shown, e.g. in FIG. 11, as from output to input) to aid conceptual understanding of the operation of the circuitry. In summary, if both of the "output" currents are summed together, the result would be the same as $I_{TAIL}$.

Assuming that the clock signals $\phi_1$ to $\phi_4$ are perfect, i.e. free of amplitude noise and phase noise (jitter), then any errors are mainly (i.e. ignoring insignificant signal-dependent errors) due to mismatches between the switching transistors (and such mismatches are dealt with later).

Figure 5A:
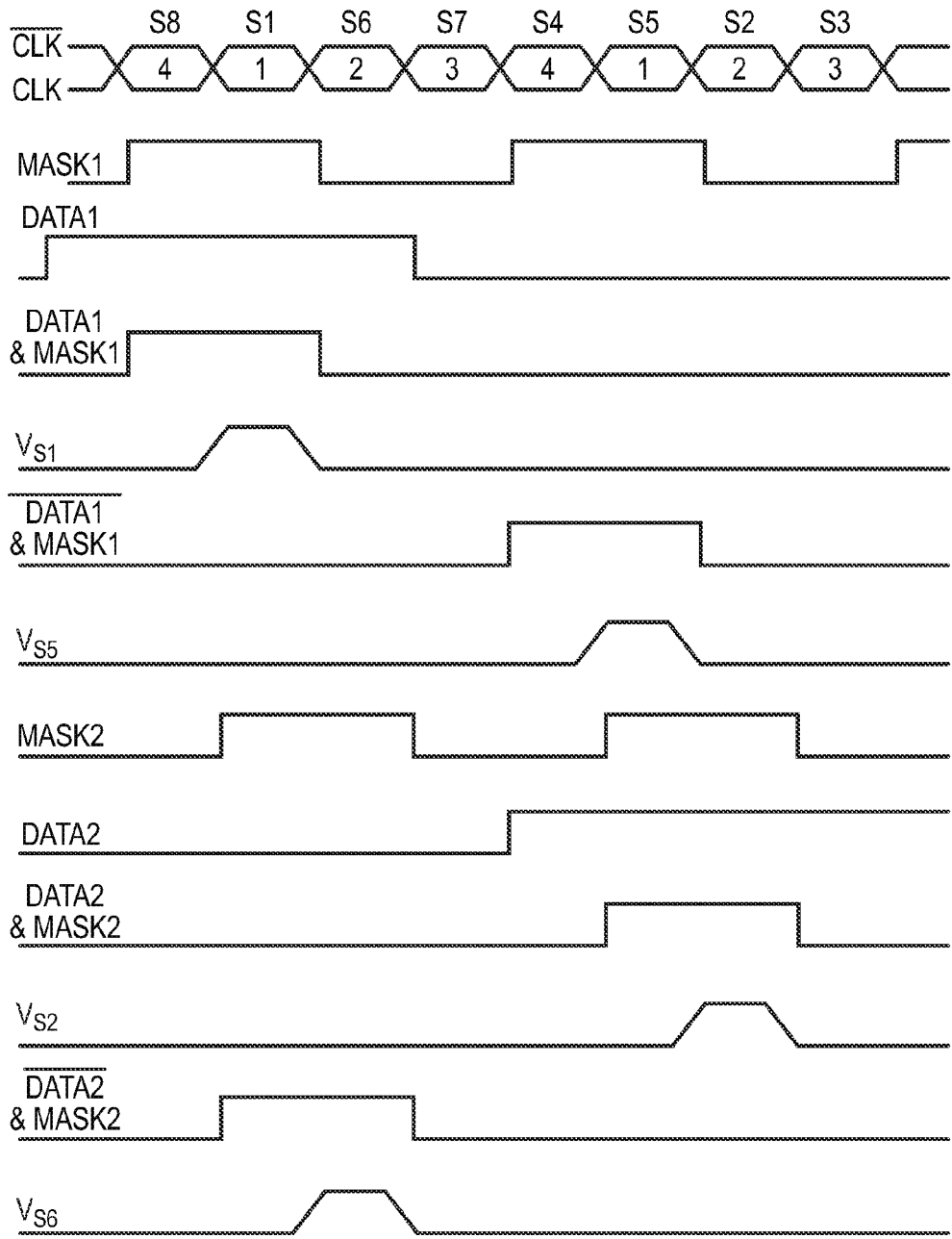
Figure 5B:
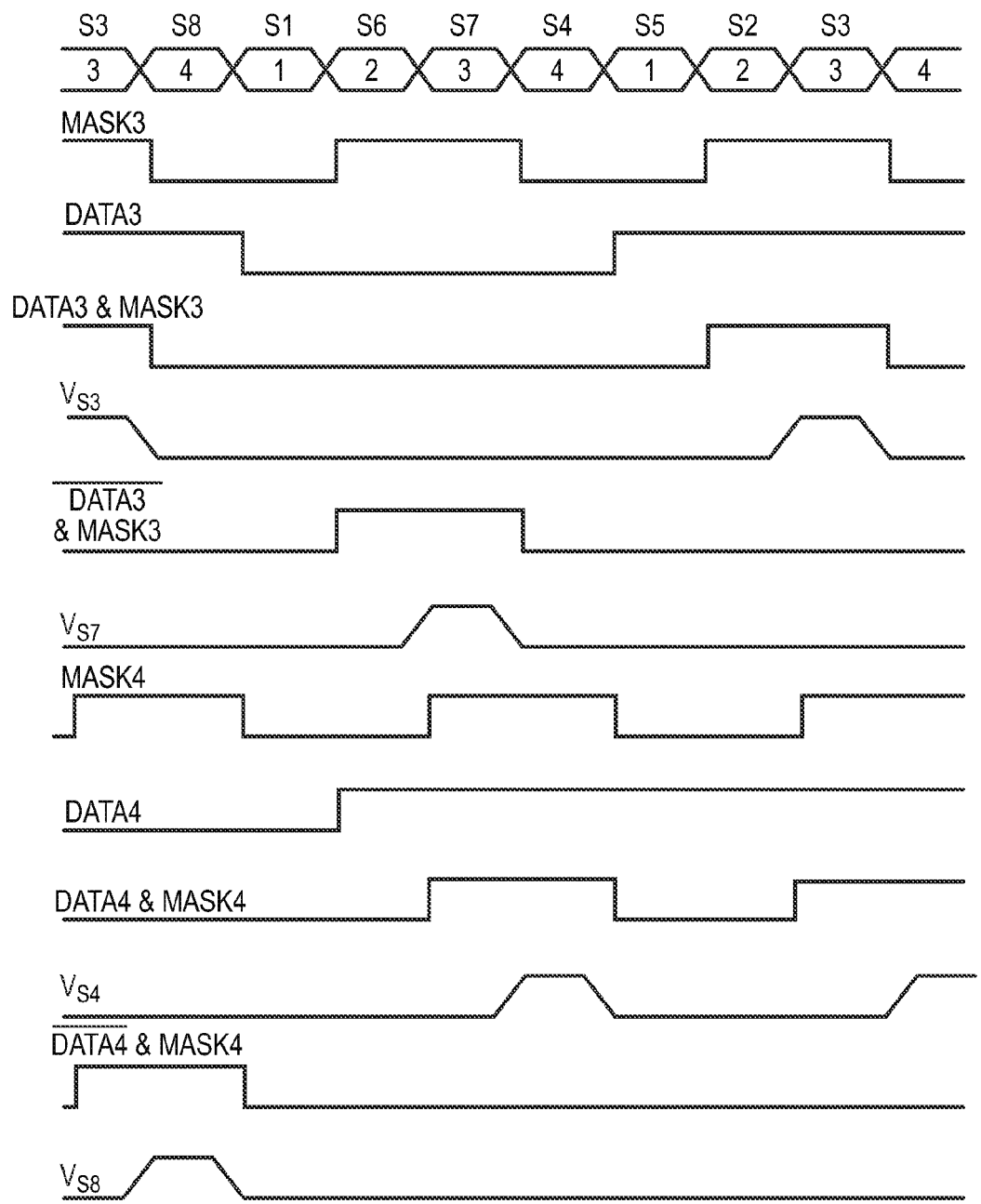
Figure 6:
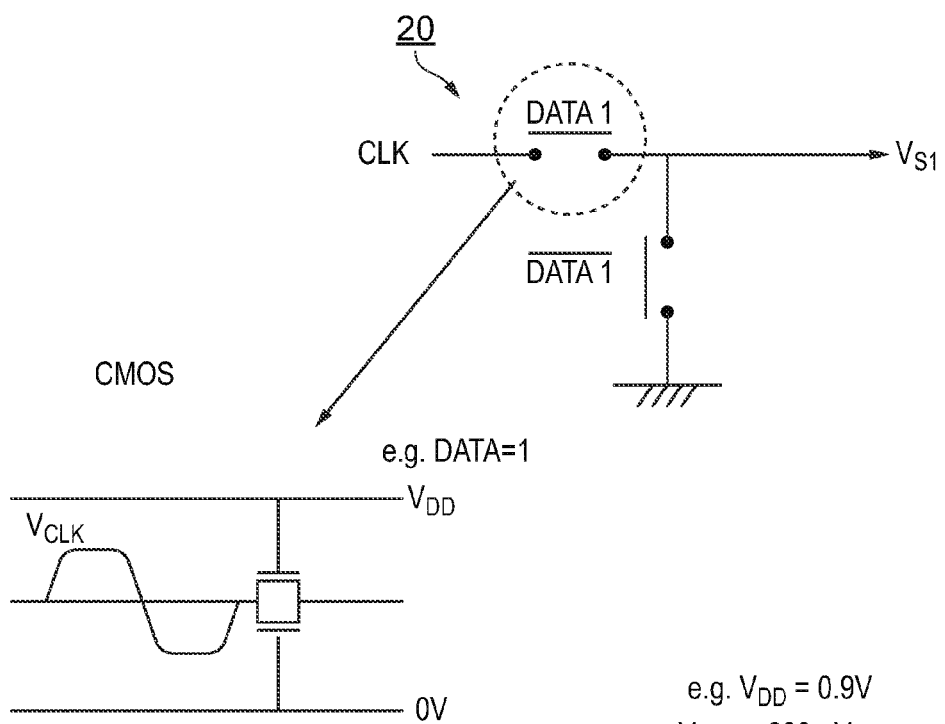

Because four time-interleaved sinusoidal clock signals (in this case, raised cosines) are employed in the present embodiment, the 25% duty-cycle pulses required to drive the corresponding four switches for each node (e.g. switches SW1 to SW4 for node A, and SW5 to SW8 for node B, in FIG. 8) are formed even though the clock signals themselves (being sinusoids) naturally have a 50% duty cycle. That is, for an X-way split of the input current signal (X=4, above), it is possible to use 50% duty-cycle sinusoidal clock signals to produce 100/X % duty-cycle pulses. In contrast, if switched logic-level (hard-switched) clock signals were employed, as in FIGS. 5A, 5B and 6, it would be necessary to use clock signals themselves having a 100/X % (25% for X=4) duty cycle to produce 100/X % (25%, for X=4) duty-cycle pulses. Therefore, the present embodiment is advantageous, particularly when considering high-frequency operation, as 50% duty-cycle clock signals may be employed (even when X=3 or more).

Yet a further advantage of the differential switching circuit 50 is that the gates of the switches SW1 to SW8 may be driven directly with clock signals, even without requiring an intermediate buffer. This is because the present circuitry is configured to accept sinusoidal clock signals. Such direct driving may include intermediate AC coupling, e.g. via a capacitor. With such direct driving, the gate capacitances of the switches SW1 to SW8 of the differential switching circuit 50 can be included in VCO design (where the VCO creates the clock signals CLK $\phi_1$ to $\phi_4$) as being part of necessary capacitance within the VCO. Thus, the gate capacitances are effectively absorbed within the VCO, such that the differential switching circuit 50 operates as if there were zero gate capacitance. Thus, switching delays due to gate capacitances are effectively removed. Furthermore, the ability to not employ buffers to generate square (i.e. pulsed or switched-logic) waves allows associated noise and delay mismatch to be avoided. It is envisaged, however, that buffers may be employed in some embodiments, because the added loading capacitance of all the switches in all the segments of an overall DAC may be too large for a VCO (clock generator) to drive.

Returning to FIG. 11, it will be appreciated that in order to determine whether any particular current pulse in the lower half of the Figure is of $IOUT_A$ or $IOUT_B$ the data value concerned should be stable in time to create the pulse concerned. For example, in the case of the bold current signal of FIG. 11, which corresponds to clock signal CLK $\phi_4$, the relevant data signal DATA 4 should be stable at least over the period of time spanning the five vertical dashed lines. For example, data signal DATA 4 could be arranged to change state at or approximately at the troughs (negative peaks) of clock signal CLK $\phi_4$. Similarly, each of data signals DATA 1 to DATA 3 could be arranged to change state at or approximately at the troughs of their respective clock signals CLK $\phi_1$ to $\phi_3$. Thus, in the running example of 16 GHz clock signals as in FIGS. 9 and 10, the data signals DATA 1 to DATA 4 may also be 16 GHz signals as in FIG. 10 configured to change state at or approximately at the troughs of their respective clock signals.

Figure 12:
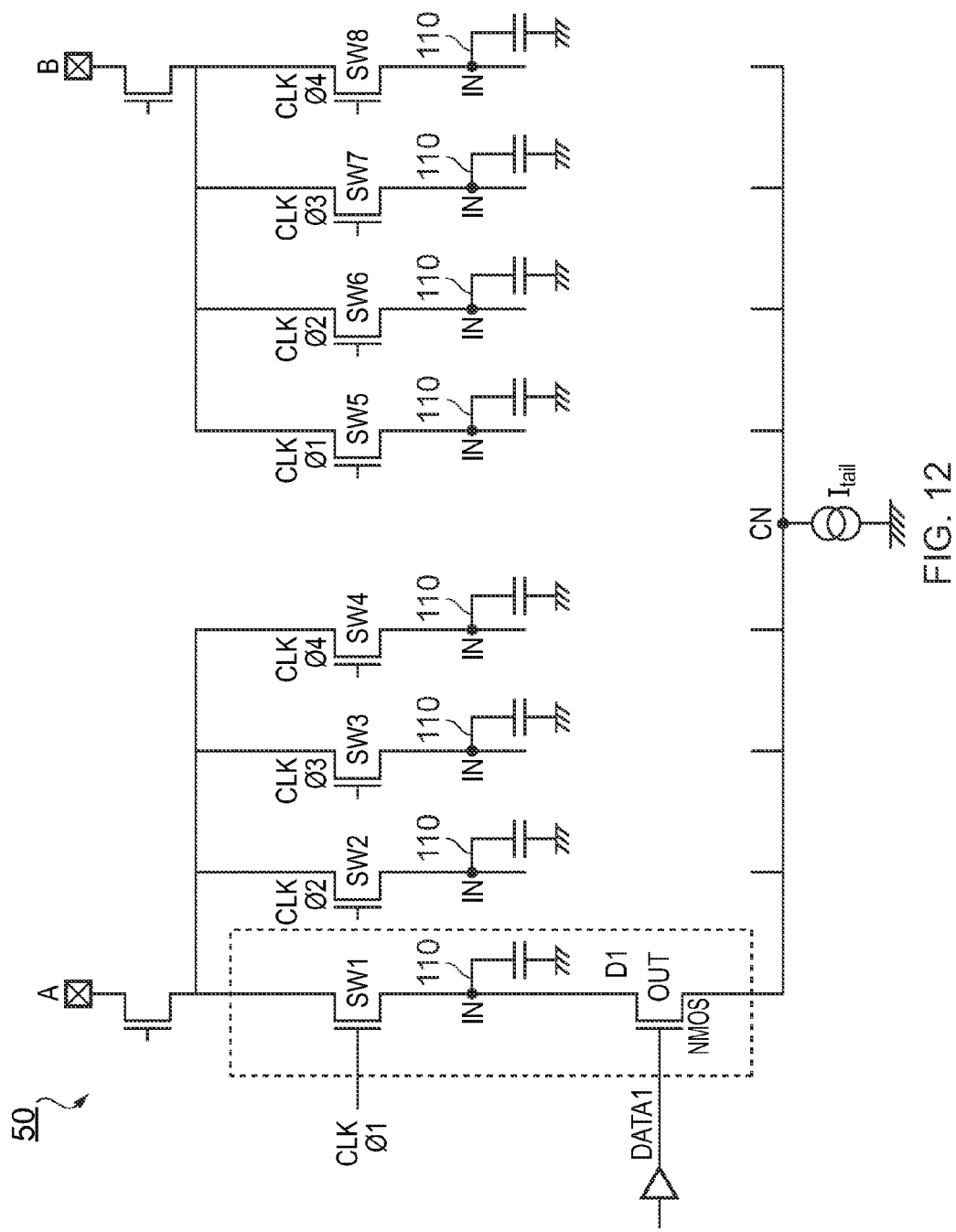
FIG. 12 is a schematic diagram corresponding to the FIG. 8 circuitry, but provided in reduced form for simplicity, and useful for understanding better operation of the FIG. 8 circuitry.

The inventors have further considered the operation of the series-connected switch pairs (e.g. SW1 and D1) in the FIG. 8 circuitry, and identified the potential for improvement. FIG. 12 is a schematic diagram corresponding to the FIG. 8 circuitry, but provided in reduced form for simplicity. Thus, only D1 of the data-controlled switches D1 to D8 is shown explicitly (although it is assumed that they are all present).

To help with the explanation, a parasitic capacitance 110 is indicated as present at the intermediate node IN between the switches of each series-connected pair. Effectively, each intermediate node IN floats (in terms of its voltage potential) when the data-controlled switch D concerned is off (the clock signals continuing to be supplied to the output switch SW concerned irrespective of data). As such, the voltages at the intermediate nodes IN have a memory, i.e. they depend on what the data was in the previous series of cycles. This leads to some data-dependent distortion in the DAC output signal.

The inventors have considered how to provide to an extent a memory-less voltage at the intermediate nodes IN, for example with the voltage level having only two possible states (e.g. x if the data-controlled switch was previously on and y if it was previously off).

Figure 13:
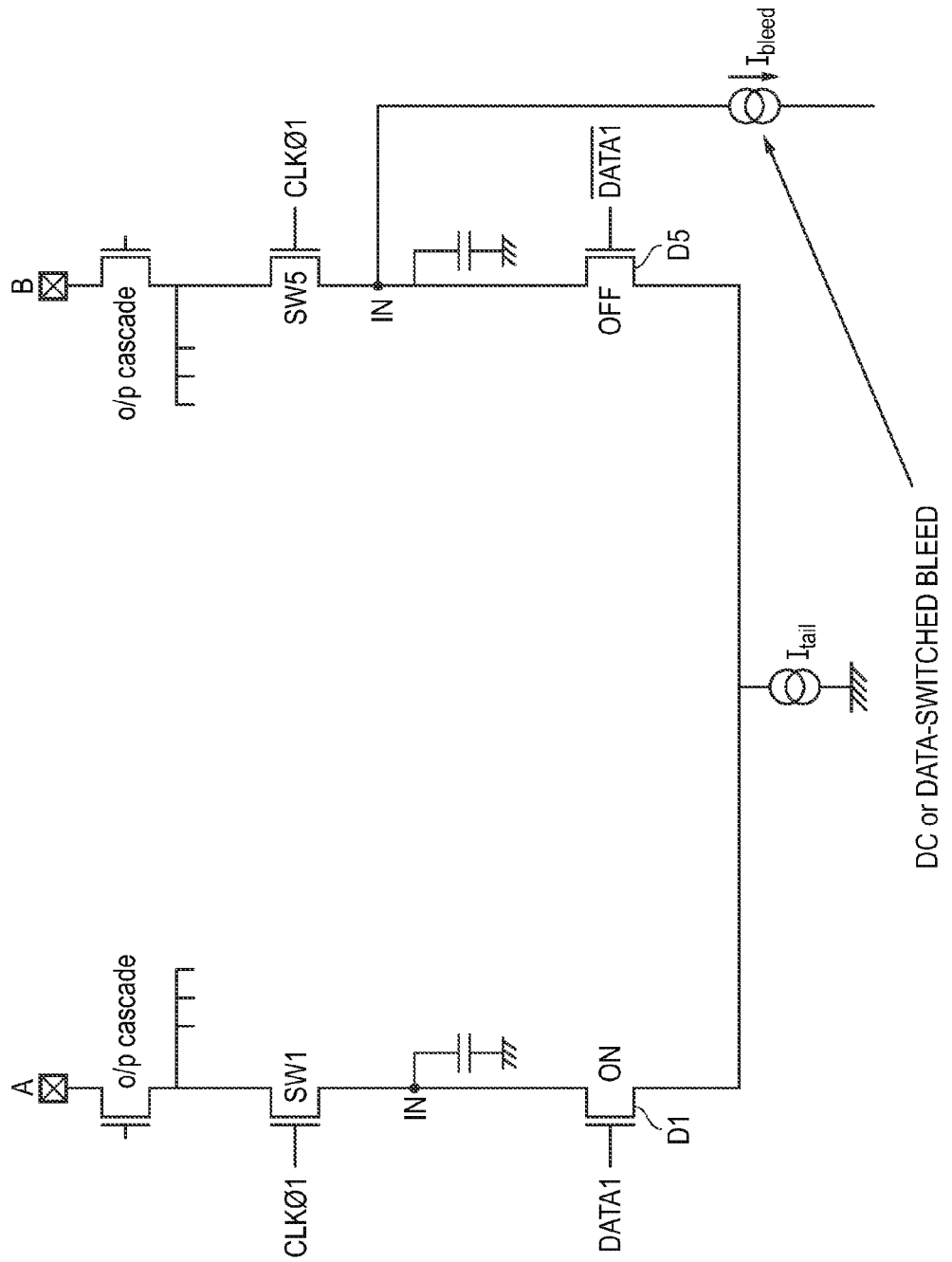
FIG. 13 is a schematic diagram corresponding to the FIG. 8 circuitry, but provided in reduced form for simplicity, and useful for understanding possible use of a DC or data-switched bleed current.

As indicated in FIG. 13 (in a reduced version for simplicity), one possible solution the inventors have considered is to provide a DC or data-switched bleed current at the intermediate nodes IN. This is only indicated in respect of switch SW5 in FIG. 13, as the output switch assigned to the same phase as switch SW1. For example, when DATA1=1, it may be that data-controlled switch D1 is ON and D5 is OFF. When D5 is OFF, its intermediate node IN would float in the absence of the bleed current, however with the bleed current this floating problem may be avoided. A problem with DC bleed is however power wastage, i.e. wasted current. There is also the need to provide bigger switches to carry the larger currents needed. A problem with a data-switched bleed current is a sensitivity to the data signal (i.e. data-dependent distortion in the DAC output).

Posed with the above issues, the inventors have devised an improved differential switching circuit 120 as indicated in FIG. 14 in reduced form. The circuitry of FIG. 14 is essentially the same as that in FIG. 8 except that for each output switch (SW1 to SW8) two data-controlled switches are provided in parallel, leading from the intermediate node to different tail nodes. One of the tail nodes is connected to a "big" current source $I_{BIG}$ and the other to a "small" current source $I_{SMALL}$. "Big" and "small" in this context are relative to one another. For example, $I_{BIG}$ may be equal to 1.5 I and $I_{SMALL}$ equal to 0.5 I. Other ratios of big:small are of course possible.

The pair of data-controlled switches per output switch is only shown in FIG. 14 in respect of output switches SW1 and SW5 for simplicity, those switches both being associated to phase 1 (CLK $\phi_1$) however it will be understood that for each of the output switches SW1 to SW8, one of its data-controlled switches is connected to the tail or common node for $I_{BIG}$ and the other to the tail or common node for $I_{SMALL}$. Thus, although output switches SW2 to SW4 and SW6 to SW8 are not shown explicitly in FIG. 14, it is understood that they are present, each connected to two data-controlled switches in a similar fashion to SW1 and SW8.

Therefore, for output switch SW1 there is a series-connected data-controlled switch D1B connected to the common node CNB for $I_{BIG}$ and a series-connected data-controlled switch D1S connected to the common node CNS for $I_{SMALL}$. The pair of data-controlled switches connected to the same output switches are effectively in parallel with one another. Here, the suffix B relates to "BIG" and the suffix S relates to "SMALL". This is shown in FIG. 14 explicitly.

Similarly, and for completeness, for output switch SW2 (not shown) there is a series-connected data-controlled switch D2B connected to the common node CNB for $I_{BIG}$ and a series-connected data-controlled switch D2S connected to the common node CNS for $I_{SMALL}$, for output switch SW3 (not shown) there is a series-connected data-controlled switch D3B connected to the common node CNB for $I_{BIG}$ and a series-connected data-controlled switch D3S connected to the common node CNS for $I_{SMALL}$, for output switch SW4 (not shown) there is a series-connected data-controlled switch D4B connected to the common node CNB for $I_{BIG}$ and a series-connected data-controlled switch D4S connected to the common node CNS for $I_{SMALL}$, for output switch SW5 (as shown in FIG. 14) there is a series-connected data-controlled switch D5B connected to the common node CNB for $I_{BIG}$ and a series-connected data-controlled switch D5S connected to the common node CNS for $I_{SMALL}$, for output switch SW6 (not shown) there is a series-connected data-controlled switch D6B connected to the common node CNB for $I_{BIG}$ and a series-connected data-controlled switch D6S connected to the common node CNS for $I_{SMALL}$, for output switch SW7 (not shown) there is a series-connected data-controlled switch D7B connected to the common node CNB for $I_{BIG}$ and a series-connected data-controlled switch D7S connected to the common node CNS for $I_{SMALL}$, and for output switch SW8 (not shown) there is a series-connected data-controlled switch D8B connected to the common node CNB for $I_{BIG}$ and a series-connected data-controlled switch D8S connected to the common node CNS for $I_{SMALL}$.

In each pair of data-controlled switches connected to the same output switch (e.g. D1B and D1S), one is controlled by the data signal concerned and the other by the complementary data signal. For example, D1B is controlled by DATA 1 and D1S is controlled by $\overline{DATA1}$. Thus, one of the two is always on (irrespective of the data) and as such the intermediate node IN never (except transiently, when the data changes) floats. In particular, the IN is always connected to one of the two tail nodes before and after the output switch concerned is turned from off to on to off again. If the two tail voltages are the same and the data switches change when the clock-controlled switch is off this has no effect on the output and does not introduce any "memory" effect.

For completeness, the other connections for FIG. 14 are indicated in table 2 below.

Each row in the table corresponds to a different one of the output switches, as indicated in the second column. In each of the second to fourth columns, each entry specifies the switch concerned (e.g. SW1) and then in square brackets the signal applied to that switch (e.g. CLK $\phi_1$).

In each row, the three switches comprise an output switch (e.g. SW1), and two data-controlled switches (e.g. D1B and D1S) each of which is series-connected with that output switch.

The first column indicates the relevant phase for reach row, of phases 1 to 4.

TABLE 2

| Phase | Output Switch | Data-Controlled Switch (BIG) | Data-Controlled Switch (SMALL) |
|---|---|---|---|
| 1 | SW1 [CLK $\Phi_1$] | D1B [DATA 1] | D1S [$\overline{\text{DATA 1}}$] |
| 2 | SW2 [CLK $\Phi_2$] | D2B [DATA 2] | D2S [$\overline{\text{DATA 2}}$] |
| 3 | SW3 [CLK $\Phi_3$] | D3B [DATA 3] | D3S [$\overline{\text{DATA 3}}$] |
| 4 | SW4 [CLK $\Phi_4$] | D4B [DATA 4] | D4S [$\overline{\text{DATA 4}}$] |
| 1 | SW5 [CLK $\Phi_1$] | D5B [$\overline{\text{DATA 1}}$] | D5S [DATA 1] |
| 2 | SW6 [CLK $\Phi_2$] | D6B [$\overline{\text{DATA 2}}$] | D6S [DATA 2] |
| 3 | SW7 [CLK $\Phi_3$] | D7B [$\overline{\text{DATA 3}}$] | D7S [DATA 3] |
| 4 | SW8 [CLK $\Phi_4$] | D8B [$\overline{\text{DATA 4}}$] | D8S [DATA 4] |

Returning to FIG. 14, additional switches R1 to R8 (transistors) in series with the data-controlled switches connected to the tail node for $I_{SMALL}$ are provided and controlled (effectively as voltage-controlled resistors-MOS operating in the linear region) so that the two tail node voltages $V_{TAILS}$ and $V_{TAILB}$ are kept substantially equal, at around 0V. Although only R1 and R5 are shown explicitly in FIG. 14 (connected in series with D1S and D5S, respectively), it will be understood that R2 to R4 and R6 to R8 are also provided, in series with D2S to D4S and D6S to D8S, respectively. An amplifier measuring the tail voltages $V_{TAILS}$ and $V_{TAILB}$ (as indicated at the right-hand side of FIG. 14) and controlling the additional transistors so as to tend to equalise the tail voltages is shown in FIG. 14.

It is desirable for both tail node voltages to be the same, so that the intermediate nodes IN always goes back down to the same (tail node) voltage at the end of each cycle. For example, the data changes when the output switches SW concerned are off, so an intermediate node IN at the point when the data changes goes from one tail node to the other. During a current pulse for a particular output switch SW, i.e. when the output switch SW turns from off to on to off, the tail/common node CN and intermediate node IN voltages rise and fall again. The rise is higher for Ismall since less current is flowing in the output switch, so its gate-source voltage is smaller. The resistive switches R are added to push the small tail node voltage $V_{TAILS}$ down so that it has the same voltage as the big tail node voltage $V_{TAILB}$. The IN voltage at the end of a current pulse is the same as at the beginning, so no net current can flow into the parasitic capacitance; with Ibig the node goes from $V_{TAILB}$ to a (lower) voltage and back to $V_{TAILB}$, with Ismall the node goes from $V_{TAILS}$ to a (higher) voltage and back to $V_{TAILS}$—in other words there is no sample-to-sample "memory" or net charge gain/loss into the capacitance.

It will therefore be appreciated that the circuitry of FIG. 14 functions somewhat similarly to that in FIG. 8, where, in any one cycle or phase, a current pulse flows through one of output nodes A and B and no pulse flows through the other. The important difference is that in FIG. 14, in any one cycle or phase, a "big" current pulse flows through one of output nodes A and B (dependent on the data) and a "small" pulse flows through the other. Thus, as indicated at the upper middle of FIG. 14, the output between differential terminals A and B would be the difference (shown as shaded) between the big and small pulses. It is this difference which would be considered the true output of the DAC (in this case, of the segment/slice shown).

With this in mind, it may be appreciated that the circuitry portion comprising output switches SW1 to SW8 may be referred to as clock-controlled circuitry 52, as in FIG. 8. The circuitry portion comprising data-controlled switches D1B to D8B and D1S to D8S, as well as additional switches R1 to R8, may be referred to as data-controlled circuitry 154 (which is different from data-controlled circuitry 54 in FIG. 8). Of course, it is to be remembered that FIG. 14 like FIG. 8 represents a single DAC slice, and as such the overall DAC would comprise many such slices.

The FIG. 14 circuitry has several advantages (some of which also apply to FIG. 8, as will be apparent), as follows.

Use of first and second differently-sized current sources, here labelled $I_{BIG}$ and $I_{SMALL}$, advantageously reduces or removes voltage memory at the intermediate nodes IN without requiring DC bleed current (per output switch). The FIG. 14 circuitry ensures that there is never any undefined, floating, node. Although $I_{SMALL}$ acts as a data-switched bleed current in one sense, it has the same switching accuracy as the main tail current $I_{BIG}$ and thus does not add significant noise into the overall circuitry.

The data-controlled switches D1B to D8B and D1S to D8S are on the "quiet" tail or common nodes. Those nodes are at approximately 0V, allowing the data-controlled switches to become "strong" on under control of the data. The tail nodes may be equalised as shown in FIG. 14, using an amplifier which measures the two tail nodes and in turn controls the additional switches R1 to R8. The additional switches R1 to R8 may be controlled in parallel by the same amplifier, as in FIG. 14, or may be individually controlled. In one embodiment, R1 to R8 within one segment/slice will be controlled together, because it may be difficult/impossible to separate out their individual effect on Vtails. Each segment (of an overall DAC) could have its own control voltage (controlling R1 to R8) or there could be a common voltage for all segments, depending on factors such as the accuracy of the measurement circuit (mismatch between segments), and relative ease of layout or routing (space for one loop per segment vs. ease of routing a common control voltage).

The output switches SW1 to SW8 can be controlled directly by sinewave or sinusoidal (e.g. not "shaped" switched logic) clock signals. This is advantageous for very-high-frequency operation—other shapes of clock signal would be harder to produce accurately.

The clock voltages applied to the output switches SW1 to SW8 can be big as there are no intermediate switches. That is, the clock paths to the output switches SW1 to SW8 are cleared of potential "discrete" distortion sources (e.g. other switches). As such, the impact of $V_{TH}$ variations in the data-controlled switches D1 to D8, D1B to D8B and D1S to D8S is removed or lessened.

Figure 7:
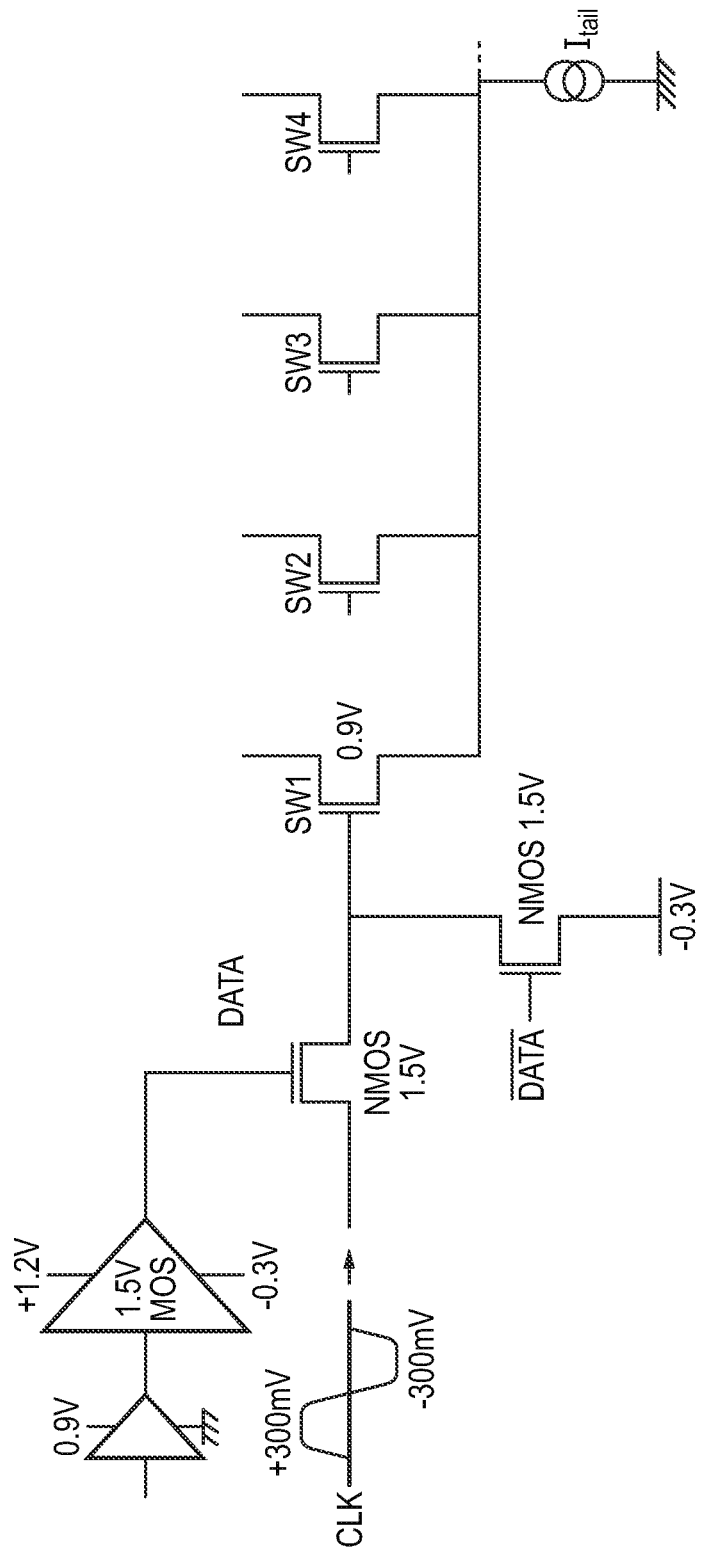

The data-controlled switches D1 to D8, D1B to D8B and D1S to D8S can be implemented in the same way as the output switches SW1 to SW8, e.g. as 0.9V transistors. This is advantageous as it renders the data-controlled switches as the same high-speed transistors (low resistance, low capacitance) as the output switches, so that there are no longer any speed limitations to the circuit operation (beyond those of the high-speed transistors themselves). The NMOS data-controlled switches in FIG. 7, for example, are slower (higher resistance, higher capacitance) high-voltage transistors (thicker oxide, longer gate length) which slow the circuit down, add distortion to clocks (non-constant Ron), and increase capacitive load on clocks (difficult to drive).

As mentioned above, even if clock signals $\phi_1$ to $\phi_4$ were perfect, i.e. free of amplitude noise and phase noise (jitter), errors may occur due to mismatches between the switching transistors, i.e. the output switches. Such mismatches will now be considered further. In particular, a calibration technique for use in a DAC corresponding to FIG. 8 or 14 will now be considered.

In order to appreciate the calibration technique better, a simplified version of switching circuit 50 is presented in FIG. 15A, in which the data-controlled circuitry 54 is shown in reduced form as connected to current source (or sink) $I_{TAIL}$. Similarly, a simplified version of switching circuit 120 is presented in FIG. 15B, in which the data-controlled circuitry 154 is shown in reduced form as connected to current sources (or sinks) $I_{BIG}$ and $I_{SMALL}$.

It is recalled that the effect of the four-phase clock signal is that output switches (transistors) SW1 and SW5 are on in a first clock cycle or phase (when $\phi 1$ is around its peak). SW2 and SW6 are on in a second clock cycle (when $\phi 2$ is around its peak), SW3 and SW7 are on in a third clock cycle (when $\phi 3$ is around its peak) and SW4 and SW8 are on in a fourth clock cycle (when $\phi 4$ is around its peak). In any such clock cycle or phase, and in the case of FIGS. 14 and 15B, which of the two transistors that are on (e.g. SW1 and SW5) carries the big current pulse due to $I_{BIG}$ and which carries the small current pulse due to $I_{SMALL}$, is dependent upon the data. This is indicated in FIG. 16. FIG. 16 may also be understood to apply to FIGS. 8 and 15A, where "$I_{BIG}$" is replaced with "$I_{TAIL}$", and where "$I_{SMALL}$" is replaced with "Zero Current".

The present calibration technique is particularly advantageous in the case of the circuitry of FIGS. 15A and 15B, where the clock signals are directly connected to the gates of transistors SW1 to SW8, as it is undesirable to disconnect or stop those clock signals to perform calibration (for example because the circuits to do this would consume power and add delay and mismatch). However, it should be understood that the present calibration technique is also advantageous in a case where it may be more acceptable to disconnect and/or stop the clock signals, for example in the case of FIGS. 3 and 4 where data-controlled switches are provided at the gates of switches S1 to S8 (corresponding to SW1 to SW8).

The general principle of the present technique may be appreciated with reference to FIGS. 17 and 18, which are provided in connection with the circuitry of FIGS. 14 and 15B by way of example. The technique involves applying specific data waveforms, in this example to the data-controlled circuitry 154, and examining output waveforms at one or both of nodes A and B.

FIG. 17 considers five example input data waveforms numbered 1 to 5. Waveform 1 is a repeating data pattern 0000. This corresponds to a repeating pattern of DATA 1=0, DATA 2=0, DATA 3=0 and DATA 4=0. As such, the pulses experienced successively at switches SW1 to SW4 would be S, S, S, S (where S means small), as will be apparent from FIG. 16. Not shown in FIG. 17 is that the corresponding pulses experienced successively at switches SW5 to SW8 would be B, B, B, B (where B means big), although this will also be apparent from FIG. 16.

A waveform experienced at output node A is indicated schematically for waveform 1, for two cycles of the repeating data pattern concerned. That is, a series of 8 small current pulses is shown. Also shown by way of a dashed horizontal line is a DC average voltage level which might be obtained at node A for example by low-pass filtering (LPF). A "slow" ADC could for example be used to perform such low-pass filtering. This DC average voltage level is given the label REFA, and is taken as a reference voltage for node A (i.e. switches SW1 to SW4).

Waveform 2 is a repeating data pattern 1000 and produces pulses at transistors (switches) SW1 to SW4 as indicated in FIG. 17, namely a repeating pattern B, S, S, S. A DC average voltage level may also be obtained at output node A as indicated in FIG. 17, and a voltage difference $\Delta V$ between this level and REFA may be taken as an indication of the gain of the switch SW1.

In a similar manner, waveforms 3 to 5 may be employed to obtain voltage differences indicative of the gains of switches SW2 to SW4, respectively, as indicated in FIG. 17.

FIG. 18 shows waveforms 6 to 10, which may be employed to obtain voltage level REFB and voltage differences indicative of the gains of switches SW5 to SW8, by examining waveforms experienced at output node B. Since the use of waveforms 6 to 10 is similar to the use of waveforms 1 to 5, duplicate description is omitted. Suffice to say that waveform 6 provides a voltage level given the label REFB, and is taken as a reference voltage for node B (i.e. switches SW5 to SW8). Waveforms 7 to 10 may be employed to obtain voltage differences indicative of the gains of switches SW5 to SW8, respectively, as indicated in FIG. 18.

As will be appreciated, the above-described technique enables voltage differences indicative of the gains of each of the transistors SW1 to SW8 to be obtained. Such voltages could therefore be used to, for example, adjust the bulk voltages (e.g. bulk-source voltages) of the individual transistors SW1 to SW8 to equalise their gains and thus calibrate the circuitry (e.g. to take account of $V_{TH}$ differences between the switches (field-effect transistors)). For example, a DAC may be provided per switch SW1 to SW8, to provide its bulk voltage depending on a controlled digital input.

Given that this technique uses particular input data waveforms as exemplified in FIGS. 17 and 18, it could be run at startup for the overall DAC but not readily during runtime when real data is supplied. Moreover, the FIG. 15B circuitry represents a single DAC slice and as such the technique should be performed per DAC slice on startup.

Importantly, the present technique can be used to provide an input data signal to an overall DAC which has several such DAC slices, which signal targets the slices one by one so that they can be calibrated one by one. For example, such a signal may cycle through the slices one by one, and when one slice is under calibration it receives its set of different input data waveforms while the other slices receive in parallel a set of "dummy" waveforms (for which each waveform is the same). In this way, the output nodes of the overall DAC can be used to take the voltage measurements, since when one slice is under calibration and gives different voltages for its different input data waveforms, the other slices will contribute to the output voltages in the same way for each waveform of the dummy set (such that their contributions will cancel out). Thus, advantageously, it may be possible to calibrate such an overall DAC at startup by supplying the input data waveform and taking measurements at the output nodes, without needing to switch in or out particular slices.

Incidentally, although it has been discussed above that the waveforms experienced at output nodes A and B may be examined during operation of the present technique, it would be possible to provide dummy (duplicate) nodes $A_{CAL}$ and $B_{CAL}$ which are not true output nodes but instead internal nodes used for calibration. See for example FIG. 19, where a dummy-node arrangement 160 comprising a dummy node $A_{CAL}$ is shown. Such dummy nodes could be "switched in" (e.g. using cascodes 162) for the purpose of performing the present technique, as also indicated in dummy-node arrangement 160. Moreover, this could enable the calibration to be carried out in parallel, i.e. with each slice having its own dummy output on each side to enable the slices to be calibrated in parallel. This however has the disadvantage of having to add circuits to switch the output current between the main outputs and the dummy outputs, which adds delay and reduces bandwidth. As such, for particular embodiments it may be better not to employ such dummy-node arrangements per slice and instead to employ the main DAC output nodes A and B to take measurements.

It would also be possible in theory to measure voltages at the tail nodes rather than at the output nodes, again enabling the calibration to be carried out in parallel, i.e. with each slice having its voltage-measurement circuitry to enable the slices to be calibrated in parallel. In each phase or cycle, the tail node voltages rise and then fall again (as the output switch goes off to on to off). When the output switches are correctly calibrated (e.g. by bulk-voltage control), the rise and fall of the tail node voltages should be the same in each phase.

As mentioned above, although the above technique has been described mainly using the $I_{BIG}/I_{SMALL}$ pulses of FIGS. 14 and 15B, the technique may also be employed where only one current source is provided (see e.g. FIGS. 8 and 15A) in which case there would be pulse "P" and no-pulse "NP" rather than big pulse "B" and small pulse "S" in FIGS. 17 and 18. Similarly, the technique could be applied with the circuitry of FIGS. 3 and 4, in which case again there would be pulse "P" and no-pulse "NP" rather than big pulse "B" and small pulse "S" in FIGS. 17 and 18.

Further, the above explanation of the present technique in connection with FIGS. 17 and 18 may be considered a low-complexity approach, and considers single-ended measurements (i.e. at output node A or B). However, it is to be noted that a measurement e.g. focussing on SW1 and waveform 2 in FIG. 17 actually takes into account "adjacent" switches in sequence, since for SW1 turning on with waveform 2 the sequence would be (considering the output switches carrying the big pulses B) SW8 on→off, SW1 off→on→off, SW6 off→on. Therefore, in fact the contribution of "adjacent" switches could be taken into account.

The following is an example.

Considering the effect on current pulse area of an error in switch $V_{TH}$, if the switch SW1 $V_{TH}$ contributes +100% error, the preceding opposite-side switch SW8 and following opposite-side switch SW6 contribute −50% error each (given waveform 2). This can be taken account of when calculating how much to adjust each switch $V_{TH}$ based on the current error measurements, for example:

Adjust(SW1)=k*[error(SW1)−0.5*error(SW8)−0.5*error(SW6)]

To help separate out the errors for a given switch, waveforms which use switching to "same-side" switches can be used as well as those which use switching to the "opposite-side" switches mentioned above. For example, if currents are measured for (SW4+SW1) both on and (SW1+SW2) both on and the errors added together, the result has twice as much contribution from SW1 as from SW4 and SW2. If this is added to the "opposite-side-switch" result from above, the result now has 4 contributions from SW1 and 1 each from SW6, SW8, SW2 and SW4, which gives a more accurate estimation of the switch error for SW1.

Depending on the exact effect of errors in a switch $V_{TH}$ (for example, this may be influenced by the parasitic capacitance on the common "tail node"), when making measurements to calculate the error for a given switch it may be preferable to use only voltage measurements on the output to which the switch is connected, or the differential output, or some combination of both. This choice may also be affected by whether only "opposite-side switching" waveforms are used, or also "same-side switching" as described above.

With this in mind, waveforms could be adopted to allow double-ended measurements to be made (between output nodes A and B) and to allow the influence of switches SW1 to SW8 to be isolated by comparing the various voltage readings obtained. One possible approach is, for a pair of switches such as SW1 and SW5, to turn them SW1 on→off, SW5 off→on, and then do the opposite.

For example, for each switch, the "error" measurement is the differential output voltage when the switch is on minus the "baseline" measurement as shown in FIG. 17. All 8 switches in a segment may be measured, then the errors may be calculated. The switch adjustments (bulk voltage change) may just be equal to these errors (multiplied by a constant which controls how fast the calibration converges). Or using the fact mentioned above that the preceding and following switches "steal" current, the adjustment for a given switch can also use the errors from these adjacent switches.

Returning to FIG. 11, it is explained above that in the context of the circuitry of FIGS. 8 and 14 the upper part of the clock signals is important, the lower parts being less important. This is because the three points for each current waveform (e.g. points 100, 102 and 100 for current waveform $IOUT_A$ in FIG. 11) are fixed relative to the clock signals CLK $\phi_1$ to $\phi_4$, with particular focus on example points 90, 92 and 94.

The inventors have considered this feature of the operation of the circuitry of FIGS. 8 and 14, in connection with the generation of the clock signals CLK $\phi_1$ to $\phi_4$. In particular, it is difficult at high frequency (e.g. at 16 GHz) to ensure that stable, reliable such clock signals are supplied to the output switches (as in the clock-controlled circuitry 52).

It is desirable to provide the DAC circuitry with a four-phase sinewave clock signal: (1) with a defined common-mode voltage; (2) with a defined amplitude (Vpp); and (3) with the circuitry capable of rejecting amplitude differences between the different phases.

Figures 20A, 20B:
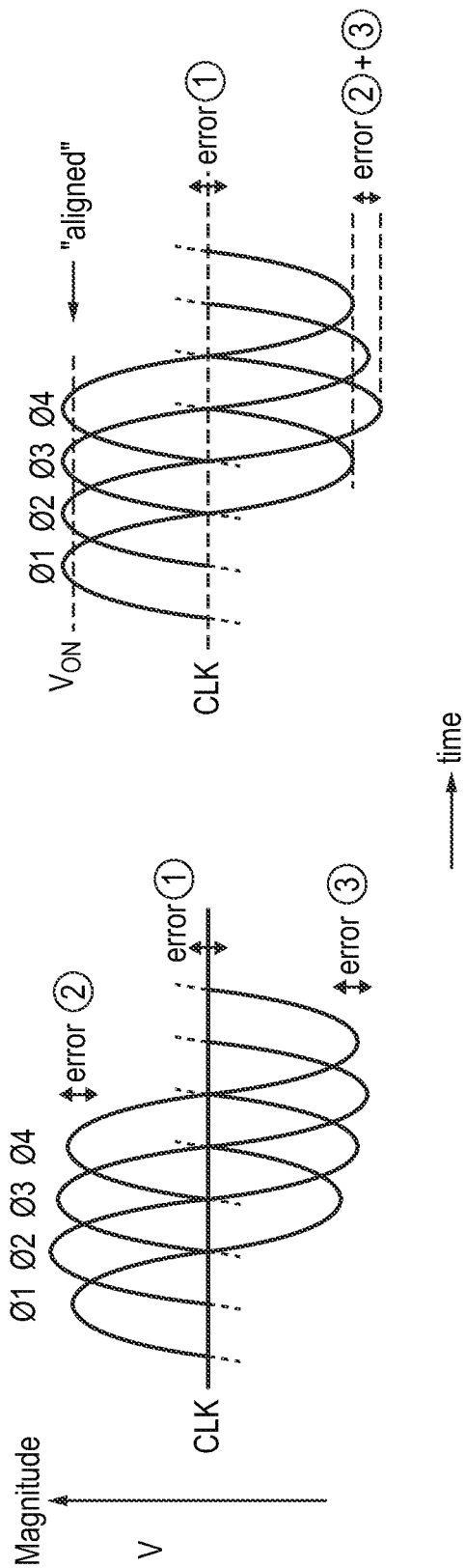

However, as indicated in FIG. 20(a), such clock signals in practice have amplitude common-mode errors ① and amplitude errors ② and ③, which may be dynamic (i.e. vary over time).

The inventors have recognised that it may be advantageous to focus on controlling the upper parts of those signals (which are important, as above) and to pay less attention to or sacrifice the lower parts (which are less important, as above). Moreover, the inventors have recognised that the shape and level of the clock signals $\phi1$ to $\phi4$ is most critical as supplied to the gates of the output switches SW1 to SW8, since this is where those signals control the operation of the circuitry.

Accordingly, the inventors have considered aligning the upper portions of the clock signals $\phi1$ to $\phi4$ by "shifting" them up or down, as indicated in FIG. 20(b). As shown, the positive peaks are "aligned" relative to a reference voltage $V_{ON}$. The inventors have considered carrying out this shifting locally, i.e. substantially at the point where the clock signals are supplied to the gates of the output switches.

This has the effect of controlling the parts of those signals which are important (the uppermost parts), and shifting the effects of amplitude errors (which may be present in the clock signals as originally generated) to the negative peaks or troughs where they have little if any effect on the operation of the output switches.

FIG. 21(a) presents the four switches SW1 to SW4 again for ease of understanding, as an example four of the switches SW1 to SW8 which receive clock signals CLK φ1 to φ4. Similarly, FIG. 21(b) presents clock signals CLK φ1 to φ4.

Focus is now placed on switch SW1 as an example, and this is reproduced in FIG. 21(c) which presents clock-level control circuitry 170 embodying the present invention. The following explanation of course equally applies to the other switches SW2 to SW4 mutatis mutandis (and indeed to SW5 to SW8).

In order to be able to shift the level of the clock signal, the clock signal φ1 is supplied to switch SW1 via a capacitor 172 to DC decouple the clock signal as supplied to the gate of switch SW1 from the clock signal as supplied from a clock generator upstream.

Although it might then seem appropriate to connect the gate to a common-mode reference voltage via a resistor 174 (as indicated in dashed form—to indicate that this is not actually done), this would have the effect of controlling the common mode of the clock signal φ1—dealing with only error ① as shown in FIG. 20(a) and not dealing with errors ② and ③. The inventors have in particular recognised that a more effective approach would be to try to control the positive peak of the clock signal as in FIG. 20(b), without necessarily controlling (i.e. focussing on) the overall common-mode voltage or the negative peak.

In order to achieve this, the inventors have proposed connecting the gate of the output switch to a reference voltage $V_{ON}$ (see FIG. 20(b)) when the clock signal concerned (e.g. CLK φ1 for output switch SW1) is around its peak, so as instead to control a particular or special "common-mode" voltage around which the uppermost part of that clock signal fluctuates.

In order to achieve this, the gate terminal of the (main) switch SW1 in FIG. 21(c) is connected to reference voltage $V_{ON}$ via a PMOS (auxiliary) transistor 176, which itself is controlled by the clock signal φ3 which is 180° out of phase with clock signal φ1. Clock signals φ1 and φ3 may be referred to as CK and $\overline{CK}$ in the generic sense, given their opposite phases, and such nomenclature will be used going forwards.

The advantage of using $\overline{CK}$ to control the PMOS transistor and CK to control (NMOS) switch SW1, is that the PMOS transistor turns on to connect the gate of the switch SW1 to $V_{ON}$ at effectively the same time as SW1 turns on. This is apparent from FIG. 21(b), where clock signals CLK φ1 and φ3 have been highlighted in bold and marked as CK and $\overline{CK}$. It can be seen that that CK is at or around its positive peak (turning on NMOS switch SW1) at substantially the same time as $\overline{CK}$ is at or around its negative peak (turning on PMOS switch 176).

The circuitry 170 depicted in FIG. 21(c) accordingly operates effectively as a track-and-hold circuit, based upon the RC time constant of the PMOS transistor 176 (with on-resistance $R_{ON}$) and the AC coupling capacitor 172. Thus, when the PMOS transistor is turned on, the positive peak part of the clock signal CK as supplied to the switch SW1 is shifted towards the desired voltage $V_{ON}$. The bandwidth BW of the bias loop might for example be designed to be approximately 1 GHz so as to reject amplitude errors not caught by other calibration circuitry. In effect, such errors are rejected by making them appear in the troughs (negative peaks) where they are not important.

Even given other calibration circuitry as mentioned above, the present invention may be beneficial since it may reject errors up to e.g. 1 GHz as discussed above. Such other calibration might be carried out only 50 times per second (not rejecting errors above 50 Hz) or only once per second (not rejecting errors above 1 Hz).

It is noted that it is not the actual positive peak itself which is shifted towards $V_{ON}$, but instead the "peak part" since the PMOS transistor 176 is turned on and off gradually in the same way as the NMOS output switch (i.e. not ideally in the sense of a square wave). The point of the signal which is shifted towards $V_{ON}$ is higher than the middle point between: (a) the point on CK when the PMOS transistor turns on based on $\overline{CK}$; and (b) the positive peak of CK itself. It is higher e.g. because the clock spends more time at the peak than transitioning through the PMOS switching threshold (shape of sinewave peak), and the on resistance of the switch is lower at the peak than near the threshold.

As will be appreciated from a comparison of FIGS. 20(a) and 20(c), the present invention effectively transfers positive peak errors to the negative peak or trough, so that in the ideal case there is 0% error at the positive peak and 200% error at the negative peak (i.e. a doubling of error in the trough). In a practical embodiment there might be e.g. 10% error at the positive peak and 190% at the negative peak, with the change for the positive peak (which matters) representing a 10× (20 dB) error reduction.

It is reiterated that the clock-level control circuitry 170 comprising a capacitor 172 and PMOS transistor 176 as employed in FIG. 21(c) could also be employed for each of the switches SW2 to SW8, in each case providing the relevant clock phase (CK) to the NMOS output switch and the out-of-phase clock phase ($\overline{CK}$) to the PMOS transistor.

FIG. 22 is a schematic diagram based on FIG. 21(c), but adapted to indicate schematically that the clock signals CK and $\overline{CK}$ originate from a clock generator such as the clock generator 62 of FIG. 10, and to indicate that the amplitude of the two clock signals (as applied to SW1 and switch 176) could be detected, compared to a desired amplitude, and the result of the comparison used to control the clock generator, thereby performing Amplitude Level Control (ALC). The control could be common to all clocks or could be individual per clock.

FIG. 23 presents an expanded version of the FIG. 21(c) circuitry, to indicate schematically how such ALC might be carried out in practice and to indicate that two techniques may be employed together, namely:
(a) use a PMOS (auxiliary) transistor (176 in FIG. 23) to fix or align the clock positive-peak regions, and move the errors to the negative peaks or troughs as already explained; and
(b) use an NMOS (auxiliary) transistor (178 in FIG. 23) to measure the errors in the negative peaks to control the amplitude (ALC) of the generated clock signals.

Thus, in FIG. 23, the same PMOS transistor 176 is shown connected in the same manner to a reference voltage $V_{ON}$ and controlled by clock signal $\overline{CK}$ (albeit it is shown positioned in the upper rather than lower half of the drawing). The reference voltage $V_{ON}$ is shown as generated by an amplifier 180 from another reference voltage $V_{REF1}$. An NMOS transistor 178 is also provided connected in a similar manner to the gate terminal of output switch SW1 but via a capacitor 182 (very small, e.g. <0.1 pF) to ground (another reference voltage). The NMOS transistor 178 is also controlled by clock signal $\overline{CK}$.

The effect is that the PMOS transistor 176 turns on when CK is around its positive peak ($\overline{CK}$ is around its negative peak) and acts to fix the peak regions around $V_{ON}$ as already described. $V_{ON}$ is also taken as a measure ("+ve PEAK") representative of the positive peak voltage of CK as indicated. Additionally, the NMOS transistor 178 turns on when CK is around its negative peak ($\overline{CK}$ is around its positive peak) and provides (i.e. measures) a voltage equivalent to $V_{ON}$ but as a measure ("−ve PEAK") representative of the negative peak voltage of CK as indicated.

These two measures (+ve PEAK and −ve PEAK) may then be compared (e.g. by way of a subtractor 184) to give a measure of the peak-to-peak voltage Vpp of the clock signal CK, the result compared with a desired Vpp (e.g. by way of another subtractor 186), and the final result used to control the clock generator (which may be clock generator 62 of FIG. 10), e.g. via an amplifier 188.

This technique may be carried out individually per clock phase φ1 to φ4, or in parallel for all clock phases as indicated in FIG. 23 (since the control loops have a track and hold property). Four transistors are shown in FIG. 23 above the clock generator, controlled by the output of amplifier 188, to represent control of the four phases in parallel. Separate amplitude control would mean that the circuit could also compensate for clock amplitude differences between the four phases, for example by adjusting the clock driver bias currents. This would equate to separate control of the four transistors above the clock generator in FIG. 23. For example, for each phase only the switches for that phase (e.g. SW1 and SW5 for phase φ1) would contribute to +ve PEAK and −ve PEAK and only the relevant one of the four transistors above the clock generator would being controlled by the output of amplifier 188.

FIG. 24 presents a refinement 190 of the basic circuitry 170 shown in FIG. 21(c). A problem with the basic circuitry 170 is that the threshold voltage $V_{TH}$ of the PMOS transistor 176 varies with process, e.g. varying by up to ±100 mV. The $V_{TH}$ variation for this particular transistor (from chip to chip) is important because it will affect the "set" (target) amplitude of the clock signal CK, which it is desired to keep constant (e.g. across the four phases φ1 to φ4).

The solution provided in FIG. 24 is to DC decouple $\overline{CK}$ from the gate of the PMOS transistor 176 by way of a capacitor 192 (AC coupling means), and to provide a gate bias for PMOS transistor 176 using another PMOS transistor 194, a resistor 196 and a current source 198 connected as shown. The current source 198 is chosen to give the bias PMOS transistor 194 about the same Ron as the average value of Ron of the PMOS switch 176. The result is that if $V_{TH}$ is smaller, the gate bias is made higher to compensate, and vice versa. That is, since both PMOS transistors 176 and 194 are created in the same process (e.g. on the same chip), their threshold voltages $V_{TH}$ match (to a high degree) and the second 194 compensates for the first 176 by providing a $V_{TH}$ shift in the gate bias.

Furthermore, the reference voltage $V_{REF2}$ in FIG. 24 may be set according to Vpp of the clock signal CK so that the amplitude of the clock signal CK has no effect on the $R_{ON}$ of the switch 176, i.e. $V_{GS}$ (SW)=Vpp (CK). If the $V_{TH}$ or $V_{GS}$ of the switch varies then so does the point at which it turns on (i.e. how close to the CK waveform peak). The circuit can be designed so that the point where the switch turns on (how close to the peak of CK) is independent of $V_{TH}$ of switches 176 and 194 (they are both PMOS switches so their $V_{TH}$ varies together with process variation) and/or $V_{peak}$ (the peak voltage of CK).

It will be appreciated that the refinement 190 presented in FIG. 24 could be applied in an analogous manner to the NMOS switch 178 of FIG. 23, so as to also compensate for $V_{TH}$ variation for the NMOS switch 178. In that case, however, an NMOS transistor would need to be provided in place of PMOS transistor 194.

The contribution relevant to FIGS. 20 to 24 may be summarised as follows.

Clocked switches (auxiliary switches) such as switches 176 and 178, driven by the opposite phase clock $\overline{CK}$ to the clock CK supplied to the (main) output switch (e.g. SW1 as in the Figures) may be used to: (1) sense the positive peak (PMOS switch 176) and control the peak region of CK; and (2) sense the negative peak (NMOS switch 178) of CK. The added (auxiliary) switches may be very small, e.g. relative to the size of the (main) output switches SW, giving small added capacitance, and be relatively insensitive to switch errors. For example, the $V_{TH}$ error of the switches 176 and 178 does not directly cause errors because when they start to turn on (at $V_{GS}=V_{TH}$) their resistance is high. Most of their effect is at the peak of the sinewave and here it is just equivalent to an on-resistance variation, which only causes a much smaller error in the measurement.

Further, the refinement of FIG. 24 may be employed for improved accuracy. This involves providing further switches equivalent to switch 194 to: (1) adjust the gate voltage of the NMOS/PMOS gate voltage concerned to cancel $V_{TH}$ process variation; and (2) adjust the NMOS/PMOS gate voltage to cancel $R_{ON}$ change from clock amplitude variation ($V_{GS}$ (SW)=Vpp (CLK)). Both of these require AC coupling to the NMOS/PMOS gate equivalent to capacitor 192.

These contributions may be applied to set $V_{ON}$ for driving the NMOS output switch in analogue, to reject clock amplitude variation, and to detect peaks for ALC of the clocks.

It is incidentally noted that the techniques described above in connection with FIGS. 20 to 24 relate to the control of the clock signals CLK φ1 to φ4 as applied to the output switches SW1 to SW8 of the DAC circuitry of e.g. FIGS. 8 and 14. The techniques may therefore be applied to other circuits which employ clock signals CLK φ1 to φ4 and for which the uppermost part of those clock signals is more important than the lower part.

One such other circuit is shown in FIG. 25, which corresponds to sampling circuitry 200 for use in an analogue-to-digital converter (ADC) as devised by the present inventors. FIG. 25 corresponds to FIG. 10 of EP-A1-2211468, to which reference may now be made. In FIG. 25, the point to note is that sampling switches SW1 to SW8 correspond to output switches SW1 to SW8 of FIGS. 8 and 14, and that clock signals CLK φ1 to φ4 also correspond to clock signals CLK φ1 to φ4 of FIGS. 8 and 14. Moreover, the relative importance of the uppermost parts of the clock signals CLK φ1 to φ4 explained in connection with FIG. 11 also applies to the sampling circuitry 200 of FIG. 25, as explained in connection with FIG. 12 of EP-A1-2211468. A detailed understanding of the sampling circuitry 200 can be found in EP-A1-2211468.

Thus, the present invention also extends to sampling circuitry and ADC circuitry which employs the techniques of FIGS. 20 to 24.

For a fuller understanding of the ADC circuitry disclosed in EP-A1-2211468, FIG. 26 is a schematic diagram of analogue-to-digital circuitry 210 which corresponds to the circuitry of FIG. 9 of EP-A1-2211468. Circuitry 210 comprises a sampler 200 (which corresponds to the sampling circuitry shown in FIG. 25), a voltage-controlled oscillator VCO 62 (which corresponds to the clock generator 62 of FIG. 10), demultiplexers 212, ADC banks 214, a digital unit 216 and a calibration unit 218.

The sampler 200 is configured to perform four-way or four-phase time-interleaving so as to split the input current $I_{IN}$ into four time-interleaved sample streams A to D. It is incidentally noted that FIG. 25 represents differential sampling circuitry, in which a differential input signal is employed (i.e. employing four sampling switches SW1 to SW4, and a complementary set SW5 to SW8), for example to take advantage of common-mode interference rejection. For simplicity, FIG. 26 is presented with a single-ended input signal, current $I_{IN}$, which is divided into the four sample streams A to D by way of switches SW1 to SW4. Of course, FIG. 26 could be interpreted to apply to differential sampling circuitry, in which case the input signal, current $I_{IN}$, would be a differential input, with SW1 to SW8 being employed in sampler 200 as in FIG. 25, and with each of the streams A to D being differential streams. The disclosure will be interpreted accordingly.

VCO 62 is a quadrature VCO operable to output four clock signals 90° out of phase with one another, for example as four raised cosine signals CLK ϕ1 to ϕ4. VCO 62 may for example be a shared 16 GHz quadrature VCO to enable circuitry 200 to have an overall sample rate of 64 GS/s.

Each of streams A to D comprises a demultiplexer 212 and an ADC bank 214 connected together in series as shown in FIG. 26. The demultiplexers 212 and ADC banks 214 are identified individually per stream (with subscript suffixes) and collectively (with a dashed box) in FIG. 26. The sampler 200 operates in the current mode and, accordingly, streams A to D are effectively four time-interleaved streams of current pulses originating from (and together making up) input current $I_{IN}$, each stream having a sample rate one quarter of the overall sample rate. Continuing the example overall sample rate of 64 GS/s, each of the streams A to D may have a 16 GS/s sample rate.

Focusing on stream A by way of example, the stream of current pulses is first demultiplexed by an n-way demultiplexer $212_A$. Demultiplexer $212_A$ is a current-steering demultiplexer and performs a similar function to sampler 200, splitting stream A into n time-interleaved streams each having a sample rate equal to ¼n of the overall sample rate. Continuing the example overall sample rate of 64 GS/s, the n output streams from demultiplexer 212 may each have a 16/n GS/s sample rate. Demultiplexer $212_A$ may perform the 1:n demultiplexing in a single stage, or in a series of stages. For example, in the case of n=16, demultiplexer $212_A$ may perform the 1:n demultiplexing by means of a first 1:4 stage followed by a second 1:4 stage.

The n streams output from demultiplexer 46 pass into ADC bank $214_A$, which contains n ADC sub-units each operable to convert its incoming pulse stream into digital signals, for example into 8-bit digital values. Accordingly, n digital streams pass from ADC bank $214_A$ to digital unit 216. In the case of n=16, the conversion rate for the ADC sub-units may be 64 times slower than the overall sample rate.

Streams B, C, and D operate analogously to stream A, and accordingly duplicate description is omitted. In the above case of n=16, circuitry 210 may be considered to comprise 64 ADC sub-units split between the four ADC banks 214.

The four sets of n digital streams are thus input to the digital unit 216 which multiplexes/retimes those streams to produce a single digital output signal representative of the analogue input signal, current $I_{IN}$. This notion of producing a single digital output may be true schematically, however in a practical implementation it may be preferable to output the digital output signals from the ADC banks in parallel.

Calibration unit 218 is connected to receive a signal or signals from the digital unit 216 and, based on that signal, to determine control signals to be applied to one or more of the sampler 200, VCO 62, demultiplexers 212 and ADC banks 214. Further details regarding the operation, and related benefits, of circuitry 210 may be found in EP-A1-2211468.

Against this backdrop, i.e. with the circuitry of FIGS. 8, 14 and 25 in mind, in particular considering FIGS. 10 and 26 together, clock generation and distribution circuitry for use with both the ADC and DAC circuitry will be considered further.

In particular, it is noted that the same four-phase sinusoidal clock signal (clock signals CLK ϕ1 to ϕ4) is employed by the switches of both the DAC and ADC circuitry, i.e. by output switches SW1 to SW8 in FIGS. 8 and 14 and by sampler switches SW1 to SW8 in FIG. 25. Thus, substantially the same clock-signal generation and distribution circuitry may be employed for both.

Indeed, as indicated in FIG. 27, the similarities (in terms of clock requirements between the ADC circuitry shown on the left-hand side) and the DAC circuitry (shown on the right-hand side) extend beyond the sampler and output switches (SW1 to SW8), e.g. to the demultiplexers 212 (and sub-ADC units 214) for the ADC circuitry and the multiplexers/retimers 72/74/76 for the DAC circuitry.

In more detail, FIG. 27 shows parts of combined DAC and ADC circuitry 250, and has similarities with the DAC circuitry of FIG. 10. In particular, circuitry 250 comprises ADC circuitry 252 shown on the left-hand side, DAC circuitry 254 shown on the right-hand side, and clock generation and distribution circuitry 256 shown in the middle.

In a similar manner to FIG. 10, the DAC circuitry 254 comprises the differential switching circuit 50 or 120, which may comprise the clock-controlled circuitry 52 and the data-controlled circuitry 54 or 154.

It is incidentally noted (as before) that although FIGS. 8, 14 and 25 represent differential circuitry, for simplicity FIG. 27 is presented as if single-ended signals are used (or with only one half of corresponding differential signals shown). Of course, FIG. 27 could be interpreted to apply to differential circuitry, in which case the signals would be differential signals. The disclosure will be interpreted accordingly.

The same running example is employed here as in FIG. 10, i.e. a desired DAC sample rate of 64 Gs/s, with data signals DATA 1 to DATA 4 input to the differential switching circuit 50/120 being 16 GHz (i.e. time-interleaved) data signals.

Three stages of multiplexing/retiming 72, 74 and 76 are also shown as in FIG. 10, and as such duplicate description is omitted.

Also shown in clock generation and distribution circuitry 256 is a clock generator 62 (having phase-locked loop PPL and polyphase filter PPF circuitry) configured to generate the clock signals CLK ϕ1 to CLK ϕ4 and supply them to the differential switching circuit 50 or 120. Further, shown are three stages of clock generation 80, 82, 84, in order to take the input clock signals CLK ϕ1 to CLK ϕ4 and generate in turn the clock signals required by the three stages of multiplexing/retiming 72, 74 and 76, as indicated in FIG. 10. Again, duplicate description is omitted.

It is to be remembered that the differential switching circuit 50/120 is representative of a single segment or "slice" in the overall DAC, as in FIG. 10. The overall DAC circuitry 254 would have further slices or segments, each with their own stages of multiplexing/retiming 72, 74 and 76. The analogue outputs of the various slices or segments may be combined to create a single analogue output of the overall DAC, as explained before. Of course, the clock generation and distribution circuitry 256 may be shared between the segments (or separately provided, at least in part).

In a similar manner to FIG. 26, the ADC circuitry 252 comprises the (differential) sampler 200. Again, either single-ended or differential signals could be used.

The same running example is employed here as in FIG. 25, i.e. a desired ADC sample rate of 64 Gs/s, and with 2-stages of demultiplexing shown as 212A and 212B, each performing 1:4 demultiplexing, and with sub-ADC units 214. The overall 64 Gs/s sample rate accordingly outputs 4 streams from sampler 200 (single-ended or differential) each at 16 Gs/s (which may be expressed herein as 16 GHz), with the first demultiplexing stage 212A outputting 16 4 Gs/s signals, and with the second demultiplexing stage 212B outputting 64 1 Gs/s signals.

An important point to note is that the same clock generation and distribution circuitry 256 provides its clock signals to the ADC circuitry 252, as well as to the DAC circuitry 254. The inventors have recognised advantageously that the same clock generation and distribution circuitry 256 may be used to support both the DAC and ADC circuitry, if the DAC and ADC are designed to require similar clock signals as they are in FIG. 27. In particular, looking at FIG. 27 and working downwards from the sampler 200 and switching circuit 50/120, in both the DAC and ADC circuitry the signals in successive stages are 4 16 GHz signals, then 16 4 GHz signals, and then 64 1 GHz signals.

Incidentally, the clock-signal generation and distribution circuitry may contain circuitry such as phase interpolators or phase rotators to accurately retime or phase-shift clock signals (by tiny amounts) as applied to the DAC circuitry compared to those applied to the ADC circuitry, however effectively the two sets of circuitry may employ the same clock signals (i.e. having the same characteristics—shape/frequency/amplitude).

This allows the same clock generation and distribution circuitry to be used in each of the four example scenarios indicated in FIG. 28. In FIG. 28(a), the same clock generation and distribution circuitry 256 is used to support both the ADC circuitry 252 on the left and DAC circuitry 254 on the right (as in FIG. 27). In FIG. 28(b), the same clock generation and distribution circuitry 256 is used to support both the DAC circuitry 254 on the left and ADC circuitry 252 on the right. In FIG. 28(c), the same clock generation and distribution circuitry 256 is used to support both the ADC circuitry 252 on the left and further ADC circuitry 252 on the right. In FIG. 28(d), the same clock generation and distribution circuitry 256 is used to support both the DAC circuitry 254 on the left and further DAC circuitry 254 on the right. Of course, the same clock generation and distribution circuitry 256 could be used to support more than two sets of DAC/ADC circuitry, and thus further combinations of ADC circuitry 252 and DAC circuitry 254 are envisaged beyond those in FIG. 28.

The clock generation and distribution circuitry 256 could comprises means (e.g. phase rotators or phase interpolators) to arrange for some or all of the clock signals output to either the ADC circuitry or the DAC circuitry (depending on which are present) to be retimed, or phase shifted or phase rotated, for example to synchronise/align internal operations of the ADC/DAC circuitry or to synchronise/align channels (e.g. each being ADC or DAC circuitry) with one another or with a common synchronisation dock. In the context of FIG. 28, such means (e.g. phase rotators or phase interpolators) could be provided on both sides of the clock generation and distribution circuitry 256 so that both sides may be individually retimed, if necessary.

This shared and flexible use of the clock generation and distribution circuitry 256 is advantageous. Generating the multiple high-frequency clock signals with careful control over relative timing and skew and distributing them to the switching circuits is a major design problem for such high-speed converters, and can constitute a large part of the overall development time and effort.

Incidentally, two sets of driver circuitry—DRV1 258 (for the ADC) and DRV2 260 (for the DAC)—are indicated as being present in FIG. 27.

FIG. 29 presents four example driver configurations, labelled A to D. In each case, it is assumed that the clock generation circuitry is on the left, and the output/sampler switches SW on the right.

Driver A is termed "Direct Drive", and is equivalent to there being no driver circuitry. That is, the clock signals are applied directly to the gates of the output/sampler switches. Driver B is termed "Buffered", and assumes that the clock signals pass via buffers (which may each be considered to be two buffers in series). Driver C is termed "AC Coupled", and assumes that the clock signals pass via AC-coupling (or DC-decoupling) capacitors as shown. Driver D is termed "Buffered and AC-coupled", and assumes that the clock signals pass via buffers and AC-coupling capacitors as shown.

FIG. 30 presents a table, detailing possible combinations for Drivers A to D which could be used as DRV1 and DRV2. Combination 1 is equivalent to there being no driver circuitry, i.e. with the clock signals applied directly to the gates of the output and sampler switches. Combinations 2 to 4 assume that only DRV2 is provided, with DRV1 effectively not being present. Combinations 5 to 7 assume that only DRV1 is provided, with DRV2 effectively not being present. Combinations 8 to 10 assume that both DRV1 and DRV2 are provided, and that they are the same as one another. Combinations 11 to 16 assume that both DRV1 and DRV2 are provided, and that they are different from one another.

It will be appreciated that other driver designs beyond those in FIG. 28 could be employed. Moreover, FIG. 30 presents all combinations of Drivers A to D, and demonstrates that even where more than four possible driver designs are available, or there are more than two sets of DAC/ADC circuitry, all possible combinations of available drivers are envisaged. The above disclosure will be interpreted accordingly.

The commonality of the clock requirements between the ADC and DAC circuitry has several advantages. Reduced time and effort is required in respect of design burden and layout complexity. There is also flexibility in system design, for example in view of the ADC/DAC mixtures shown in FIG. 28. There is also a benefit in terms of power/area, given that single clock generation and distribution circuitry may supply plural ADC/DAC circuits. There is also a benefit in terms of risk to a system designer, since tried and tested clock generation and distribution circuitry may be largely reused, limiting the expected number of redesigns. There is also the possibility of reduced complexity in version control—for example different commercial markets may require different sample rates/frequencies, and reuse of tested clock generation and distribution circuitry per such market may thus be beneficial. These advantages stem from the case here where both the ADC and DAC circuitry have closely similar clock requirements/specifications, with similar multiplexing/demultiplexing stages, whereas typically high-speed ADCs and DACs have different clock requirements (especially at the highest-speed parts of the circuits) and different multiplexing/demultiplexing schemes.

Circuitry of the present invention may from part of an analogue-to-digital converter or a digital-to-analogue converter. Circuitry of the present invention may be implemented as integrated circuitry, for example on an IC chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many other different forms, within the spirit and scope of the appended claims.

The invention claimed is:

1. A method of calibrating switching circuitry, the switching circuitry comprising a measurement node and a plurality of output switches connected to the measurement node, and the circuitry being configured, in each clock cycle of a series of clock cycles, to control whether or not one or more of said output switches carry a given current based upon input data, the method comprising:
inputting a plurality of different data sequences to the circuitry, each sequence causing a given pattern of voltages to occur at the measurement node as a result of currents passing through the output switches;
measuring the voltages occurring at the measurement node for each said sequence; and
calibrating the switching circuitry in dependence upon a result of said measuring,
wherein each said output switch is associated with a corresponding clock cycle in a repeating set of clock cycles, and wherein the circuitry is configured in each clock cycle to control whether or not the associated switch carries a given current based upon input data.

2. Calibration circuitry for calibrating switching circuitry, the switching circuitry comprising a measurement node and a plurality of output switches connected to the measurement node, and the switching circuitry being configured to control whether or not each of those switches carries a given current in each clock cycle of a series of clock cycles based upon input data, the calibration circuitry comprising:
data-sequence circuitry operable to input a plurality of different data sequences to the switching circuitry, each sequence causing a given pattern of voltages to occur at the measurement node as a result of currents passing through the output switches;
measurement circuitry operable to measure the voltages occurring at the measurement node for each said sequence; and
calibration circuitry operable to calibrate the switching circuitry in dependence on a result of said measuring,
wherein each said output switch is associated with a corresponding clock cycle in a repeating set of clock cycles, and wherein the switching circuitry is configured in each clock cycle to control whether or not the associated switch carries a given current based upon input data.

3. An integrated circuit or an IC chip comprising calibration circuitry as claimed in claim 2.

4. An integrated circuit or an IC chip as claimed in claim 3, further comprising said switching circuitry,
optionally wherein:
at least one of said output switches is a main switch having a control terminal;
the switching circuitry comprises a clock-path portion connected to the control terminal of the main switch to apply a driving clock signal thereto so as to drive the main switch; and
the switching circuitry is configured to controllably apply a biasing voltage to the clock-path portion so as to bias a voltage level of the driving clock signal as applied to the control terminal of the main switch.

5. An integrated circuit or an IC chip as claimed in claim 4, comprising a digital-to-analogue converter, wherein said switching circuitry is part of said digital-to-analogue converter.

6. A digital-to-analogue converter comprising calibration circuitry as claimed in claim 2.

7. Calibration circuitry for calibrating switching circuitry, the switching circuitry comprising a measurement node and a plurality of output switches connected to the measurement node, and the switching circuitry being configured to control whether or not each of those switches carries a given current in each clock cycle of a series of clock cycles based upon input data, the calibration circuitry comprising:
data-sequence circuitry operable to input a plurality of different data sequences to the switching circuitry, each sequence causing a given pattern of voltages to occur at the measurement node as a result of currents passing through the output switches;
measurement circuitry operable to measure the voltages occurring at the measurement node for each said sequence; and
calibration circuitry operable to calibrate the switching circuitry in dependence on a result of said measuring,
wherein the switching circuitry is configured such that, in any given clock cycle, at most one of the output switches of the plurality of output switches carries a given current.

8. Calibration circuitry for calibrating switching circuitry, the switching circuitry comprising a measurement node and a plurality of output switches connected to the measurement node, and the switching circuitry being configured to control whether or not each of those switches carries a given current in each clock cycle of a series of clock cycles based upon input data, the calibration circuitry comprising:
data-sequence circuitry operable to input a plurality of different data sequences to the switching circuitry, each sequence causing a given pattern of voltages to occur at the measurement node as a result of currents passing through the output switches;
measurement circuitry operable to measure the voltages occurring at the measurement node for each said sequence; and
calibration circuitry operable to calibrate the switching circuitry in dependence on a result of said measuring,
wherein said output switches are field-effect transistors, and wherein the calibrating comprises adjusting respective bulk voltages applied to said output switches.

9. Calibration circuitry for calibrating switching circuitry, the switching circuitry comprising a measurement node and a plurality of output switches connected to the measurement node, and the switching circuitry being configured to control whether or not each of those switches carries a given current in each clock cycle of a series of clock cycles based upon input data, the calibration circuitry comprising:
data-sequence circuitry operable to input a plurality of different data sequences to the switching circuitry, each sequence causing a given pattern of voltages to occur at the measurement node as a result of currents passing through the output switches;
measurement circuitry operable to measure the voltages occurring at the measurement node for each said sequence; and
calibration circuitry operable to calibrate the switching circuitry in dependence on a result of said measuring,
wherein said data sequences are configured such that the measuring indicates or isolates the gains of the individual output switches, and wherein the calibrating comprises adjusting operation of the output switches to tend to cause the measuring to indicate that the output switches have the same gains.

10. Calibration circuitry as claimed in claim 2, wherein:
said measurement node is a first measurement node and said output switches are first output switches;
the switching circuitry comprises a second measurement node and a plurality of second such output switches connected to the second measurement node, the switching circuitry being configured to control which of the output switches carries a given current in each clock cycle of a series of clock cycles based upon input data; and
the calibration circuitry is configured to:
input said plurality of different data sequences to the switching circuitry, each sequence causing a given pattern of voltages to occur at the first and second measurement nodes as a result of currents passing through the output switches;
measure the voltages occurring at one or both of the first and second measurement nodes for each said sequence; and
calibrate the switching circuitry in dependence on a result of the measuring.

11. Calibration circuitry as claimed in claim 10, wherein each said first output switch and an associated second output switch are together associated with a corresponding clock cycle in a repeating set of clock cycles, and wherein the switching circuitry is configured in each clock cycle to control whether or not the associated output switches carry a given current based upon input data.

12. Calibration circuitry as claimed in claim 11, wherein the switching circuitry is configured in each clock cycle to control which of the associated output switches carries a given current based upon input data.

13. Calibration circuitry as claimed in claim 11, wherein the switching circuitry is configured in each clock cycle to control which of the associated output switches carries a first current and which carries a second current based upon input data, the first and second currents being different from one another.

14. Calibration circuitry as claimed in claim 2, wherein each data sequence comprises a repeating pattern of data values.

15. Calibration circuitry as claimed in claim 2, wherein the measuring comprises obtaining an average of the voltages occurring at the or each measurement node for each said sequence.

16. Calibration circuitry as claimed in claim 2, wherein the calibrating comprises combining or comparing results from said measuring for the different sequences.

17. Calibration circuitry as claimed in claim 2, wherein the or each measurement node is an output node or a tail node of the switching circuitry.

18. Calibration circuitry as claimed in claim 2, being for calibrating a plurality of sets of said switching circuitry, the plurality of sets forming part of a switching-circuitry system, wherein:
for each said set of switching circuitry, the or each measurement node is an output node of that set of switching circuitry;
the or each output node of one of said sets of switching circuitry is connected to the corresponding output node of each other set of switching circuitry to form an output node of the switching-circuitry system; and
the calibration circuitry is configured to:
input a set-targeting data signal to the system, the data signal being configured such that it causes one of the sets of switching circuitry to receive its plurality of different data sequences, and the or each other set of switching circuitry to receive in parallel a dummy plurality of data sequences, where the data sequences in any said dummy plurality of data sequences are the same as one another;
measure the voltages occurring at the or at least one of the system output nodes for each said sequence of that plurality of different data sequences; and
calibrate the set of switching circuitry receiving that plurality of different data sequences in dependence upon a result of the measuring.

19. Calibration circuitry as claimed in claim 18, wherein the calibration circuitry is configured to:
input a plurality of different set-targeting data signals to the system one-by-one, each set-targeting data signal causing a corresponding target one of the sets of switching circuitry to receive its plurality of different data sequences, and the or each other set of switching circuitry to receive in parallel a said dummy plurality of data sequences; and
for each said set-targeting data signal, measure the voltages occurring at the or at least one of the system output nodes for each said sequence of the plurality of different data sequences concerned, and calibrate the set of switching circuitry receiving that plurality of different data sequences in dependence upon a result of the measuring.

* * * * *